(12) United States Patent
Kim et al.

(10) Patent No.: US 9,391,138 B2
(45) Date of Patent: Jul. 12, 2016

(54) SEMICONDUCTOR DEVICES INCLUDING EMPTY SPACES AND METHODS OF FORMING THE SAME

(71) Applicant: Samsung Electronics Co., Ltd., Suwon-si (KR)

(72) Inventors: Hong-Rae Kim, Seoul (KR); Byoung-Deog Choi, Suwon-si (KR); Hee-Young Park, Hwaseong-si (KR); Sang-Ho Roh, Seoul (KR); Jin-Hyung Park, Suwon-si (KR); Kyung-Mun Byun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 74 days.

(21) Appl. No.: 14/274,002

(22) Filed: May 9, 2014

(65) Prior Publication Data

US 2014/0367825 A1 Dec. 18, 2014

(30) Foreign Application Priority Data

Jun. 17, 2013 (KR) .................. 10-2013-0069032

(51) Int. Cl.
*H01L 29/06* (2006.01)
*H01L 21/764* (2006.01)
*H01L 27/108* (2006.01)

(52) U.S. Cl.
CPC .......... *H01L 29/0649* (2013.01); *H01L 21/764* (2013.01); *H01L 27/10855* (2013.01); *H01L 27/10885* (2013.01)

(58) Field of Classification Search
CPC .................. H01L 21/764; H01L 29/0649
See application file for complete search history.

(56) References Cited

U.S. PATENT DOCUMENTS

| | | | |
|---|---|---|---|
| 5,940,714 A | 8/1999 | Lee et al. | |
| 6,399,476 B2 | 6/2002 | Kim et al. | |
| 6,472,266 B1 | 10/2002 | Yu et al. | |
| 6,492,245 B1 | 12/2002 | Liu et al. | |
| 6,780,753 B2 | 8/2004 | Latchford et al. | |
| 7,625,795 B2 | 12/2009 | Durcan et al. | |
| 7,713,873 B2 | 5/2010 | Kim et al. | |
| 7,777,265 B2 | 8/2010 | Hong et al. | |
| 2009/0174067 A1 | 7/2009 | Lin | |
| 2009/0263951 A1* | 10/2009 | Shibata et al. | 438/422 |
| 2009/0267166 A1 | 10/2009 | Verheijden et al. | |
| 2010/0319971 A1 | 12/2010 | Lin | |
| 2014/0252536 A1* | 9/2014 | Choi et al. | 257/508 |

FOREIGN PATENT DOCUMENTS

| | | |
|---|---|---|
| KR | 1020050024735 | 4/2002 |
| KR | 1020050013830 | 2/2005 |
| KR | 1020090035145 | 4/2009 |

* cited by examiner

*Primary Examiner* — Peniel M Gumedzoe
*Assistant Examiner* — Christopher Johnson
(74) *Attorney, Agent, or Firm* — Myers Bigel & Sbiley, P.A.

(57) ABSTRACT

Semiconductor devices including empty spaces and methods of forming the semiconductor devices are provided. The semiconductor devices may include first and second line structures extending in a direction on a substrate, an insulating isolation pattern between the first and second line structures and a conductive structure between the first and second line structures and next to the insulating isolation pattern along the direction. The semiconductor devices may also include an empty space including a first portion between the first line structure and the conductive structure and a second portion between the first line structure and the insulating isolation pattern. The first portion of the empty space may have a height different from a height of the second portion of the empty space.

19 Claims, 42 Drawing Sheets

SEMICONDUCTOR DEVICES INCLUDING EMPTY SPACES AND METHODS OF FORMING THE SAME

CROSS-REFERENCE TO RELATED APPLICATION

This U.S. non-provisional application claims priority under 35 U.S.C. §119 to Korean Patent Application No. 10-2013-0069032, filed on Jun. 17, 2013, the disclosure of which is hereby incorporated by reference in its entirety.

FIELD

The present disclosure generally relates to the field of electronics and, more particularly, to semiconductor devices.

BACKGROUND

With the increase in integration density of semiconductor devices, distances between conductive patterns in the semiconductor devices have been decreased. Accordingly, crosstalk between the conductive patterns may occur and parasitic capacitance between adjacent conductive patterns electrically isolated from each other by insulating material may increase. For example, when the conductive patterns are bit lines of a memory device, parasitic capacitance between the bit lines may impede transmission of electrical signals and reduce a bit line sensing margin.

SUMMARY

A semiconductor device may include first and second line structures extending in a direction on a substrate, an insulating isolation pattern between the first and second line structures, and a conductive structure between the first and second line structures and adjacent the insulating isolation pattern along the direction. The semiconductor device may also include an empty space including a first portion between the first line structure and the conductive structure and a second portion between the first line structure and the insulating isolation pattern. The first portion of the empty space may have a height different from a height of the second portion of the empty space.

According to various embodiments, the semiconductor device may further include an insulating capping pattern between the first line structure and the conductive structure. The insulating capping pattern may define an upper part of the first portion of the empty space and may include a first insulating capping pattern and a second insulating capping pattern. The first insulating capping pattern may have a non-uniform thickness and may extend along a lower part and a side surface of the second insulating capping pattern.

According to various embodiments, the first line structure may include a first conductive line and a first insulating mask pattern on the first conductive line.

In various embodiments, the semiconductor device may further include an insulating capping pattern between the first insulating mask pattern and the conductive structure, and the insulating capping pattern may define an upper part of the empty space.

In various embodiments, the insulating capping pattern may be at a higher level than the first conductive line relative to an upper surface of the substrate.

In various embodiments, the insulating capping pattern may include a first insulating capping pattern and a second insulating capping pattern. The first insulating capping pattern may have a non-uniform thickness and may extend along a side surface and a lower part of the second insulating capping pattern.

According to various embodiments, the semiconductor device may further include an insulating capping pattern defining an upper part of the empty space. The insulating capping pattern may be between a side surface of the first insulating mask pattern and the conductive structure.

According to various embodiments, the empty space may include a first empty space. The semiconductor device may further include a second empty space between the second line structure and the conductive structure and between the second line structure and the insulating isolation pattern. Moreover, the semiconductor device may include a first insulating spacer between the first empty space and the first line structure and a second insulating spacer between the second empty space and the second line structure.

In various embodiments, the empty space may include a first empty space. The semiconductor device may further include a second empty space between the second line structure and the conductive structure and between the second line structure and the insulating isolation pattern. Additionally, the semiconductor device may include a first insulating protection pattern between the first empty space and the conductive structure and a second insulating protection pattern between the second empty space and the conductive structure.

In various embodiments, the conductive structure may include a lower conductive pattern and an upper conductive pattern on the lower conductive pattern. The upper conductive pattern may include an upper part at a higher level than the first and second line structures relative to an upper surface of the substrate, and the upper part of the upper conductive pattern may have a portion overlapping an uppermost surface of the second line structure.

A semiconductor device may include a substrate including a transistor including first and second source/drain regions and a gate structure, a first line structure including a first conductive line and a first insulating mask pattern sequentially stacked on the substrate, and a second line structure including a second conductive line and a second insulating mask pattern sequentially stacked on the substrate. The first and second line structures may extend in a direction. The semiconductor device may also include an insulating isolation pattern between the first and second line structures and a conductive structure between the first and second line structures and adjacent the insulating isolation pattern along the direction. The semiconductor device may further include a first empty space including a first portion between the first line structure and the conductive structure and a second portion between the first line structure and the insulating isolation pattern, and a second empty space including a first portion between the second line structure and the conductive structure and a second portion between the second line structure and the insulating isolation pattern. The conductive structure may include an upper part at higher level than the first and second line structures relative to an upper surface of the substrate, and the upper part of the conductive structure may be spaced apart from the first line structure and may have a portion extending on an uppermost surface of the second line structure.

According to various embodiments, the second line structure may extend on and may be electrically connected to the first source/drain region, and the conductive structure may extend on and may be electrically connected to the second source/drain region.

According to various embodiments, the first portion of the first empty space may have a height different from a height of the second portion of the second empty space.

According to various embodiments, the semiconductor device may further include an insulating capping pattern defining an upper portion of the first empty space.

In various embodiments, the insulating capping pattern may include a first insulating capping pattern and a second insulating capping pattern. The first insulating capping pattern may have a non-uniform thickness and may extend along a side surface and a lower portion of the second insulating capping pattern.

An integrated circuit device may include first and second line patterns spaced apart from each other on a substrate. The first and second line patterns may include first and second conductive line patterns, respectively. The integrated circuit device may also include a conductive pattern between the first and second line patterns. The conductive pattern may include a lower conductive pattern and an upper conductive pattern including a sidewall that is recessed relative to a sidewall of the lower conductive pattern such that the upper conductive pattern exposes an upper surface of the lower conductive pattern. The integrated circuit device may further include a capping pattern between the first line pattern and the upper conductive pattern. The capping pattern may contact the upper surface of the lower conductive pattern to define an upper surface of an empty space between the lower conductive pattern and the first line pattern.

According to various embodiments, the upper surface of the lower conductive pattern may be lower than an uppermost surface of the first line pattern relative to an upper surface of the substrate.

In various embodiments, the empty space may include a first portion of the empty space, and the first and second line patterns may extend in a direction. The integrated circuit device may also include an insulating pattern between the first and second line patterns and adjacent the conductive pattern along the direction. The capping pattern may extend on the insulating pattern and a second portion of the empty space that is between the first line pattern and the insulating pattern. A height of the second portion of the empty space may be greater than a height of the first portion of the empty space.

According to various embodiments, the capping pattern may include a first capping pattern contacting the upper surface of the lower conductive pattern and a second capping pattern on the first capping pattern. The first capping pattern may extend on a bottom surface and a sidewall of the second capping pattern, and the first capping pattern may have a lower conformality than the second capping pattern.

According to various embodiments, an uppermost surface of the conductive pattern may be higher than uppermost surfaces of the first and second line patterns relative to an upper surface of the substrate, and a portion of the conductive pattern may at least partially extend on the uppermost surface of the second line pattern.

DETAILED DESCRIPTION

Figure 1A:
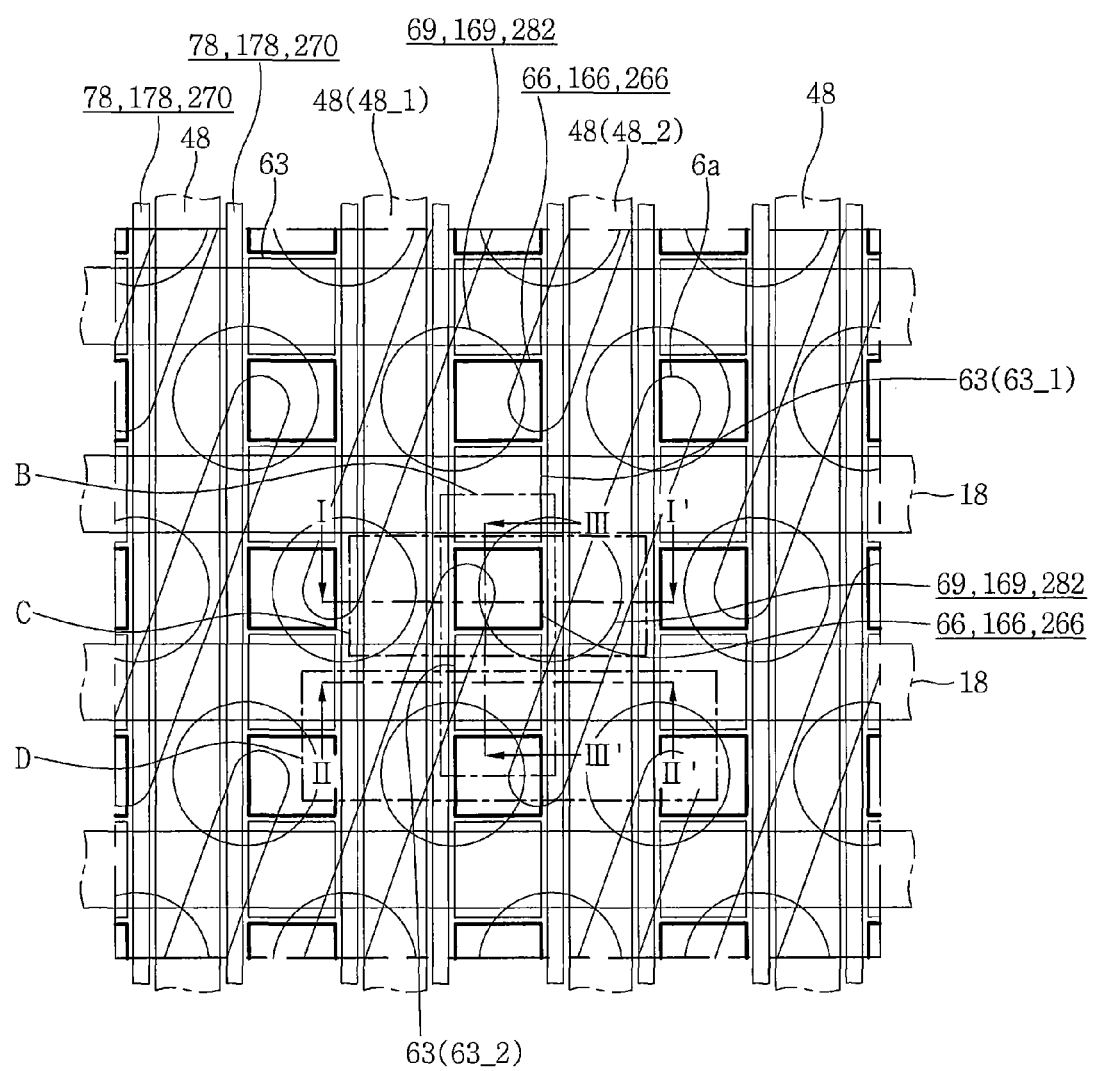
FIG. 1A is a plan view of a semiconductor device according to some embodiments of the present inventive concept.

Various embodiments will now be described with reference to the accompanying drawings in which some embodiments are shown. This inventive concept may, however, be embodied in different forms and should not be construed as limited to the embodiments set forth herein. Rather, these embodiments are provided so that this disclosure is thorough and complete and fully conveys the scope of the present inventive concept to those skilled in the art. The terminology used herein is for the purpose of describing particular embodiments only and is not intended to be limiting of the present inventive concept.

Embodiments of the present inventive concept are described herein with reference to cross-sectional view, plan view, and/or block illustrations that are schematic illustrations of some embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present inventive concept.

In the drawings, the thicknesses of layers and regions may be exaggerated for clarity. It will be understood that when an element is referred to as being "on" or "adjacent" another element, it can be directly on or adjacent the other element, or intervening elements may also be present. In contrast, when an element is referred to as being "directly on" or "directly adjacent" another element, there are no intervening elements present. Like numbers refer to like elements throughout.

Spatially relative terms, such as, for example, "top end", "bottom end", "top surface", "bottom surface", "upper", "lower" and the like, may be used herein for ease of description to describe one element or feature's relationship to another element(s) or feature(s) as illustrated in the figures. For example, if an upper portion of the drawing is referred to as "upper" and a bottom part of the drawing is referred to as "lower", "upper" can be termed "lower" and "lower" can be termed "upper", without departing from the scope of the present inventive concept.

It will be understood that, although the terms "upper", "middle", "lower", etc. may be used herein to describe the relationship between elements, these elements should not be limited by these terms. For example, the terms "upper", "middle", "lower", etc. could be termed "first", "second", "third", etc. to describe elements of the specification, without departing from the scope of the present inventive concept.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

Unless otherwise defined, all terms, including technical and scientific terms, used herein have the same meaning as commonly understood by one of ordinary skill in the art to which this inventive concept belongs. It will be further understood that terms should be interpreted as having a meaning that is consistent with their meaning in context of the relevant art and this specification and will not be interpreted in an idealized or overly formal sense unless expressly so defined herein.

It should also be noted that in some alternate implementations, the functions/operations noted in flowchart blocks herein may occur out of the order noted in the flowcharts. For example, two blocks shown in succession may in fact be executed substantially concurrently or the blocks may sometimes be executed in the reverse order, depending upon the functions/operations involved. Moreover, the functions/operations of a given block of the flowcharts and/or block diagrams may be separated into multiple blocks and/or the functions/operations of two or more blocks of the flowcharts and/or block diagrams may be at least partially integrated. Finally, other blocks may be added/inserted between the blocks that are illustrated, and/or functions/operations may be omitted without departing from the scope of the present inventive concepts.

In the specification, the term "empty space" may be defined as space not filled with a solid material. Accordingly, the term "empty space" may include space not completely empty and may include, for example, space filled with gas or air.

Figure 2A:
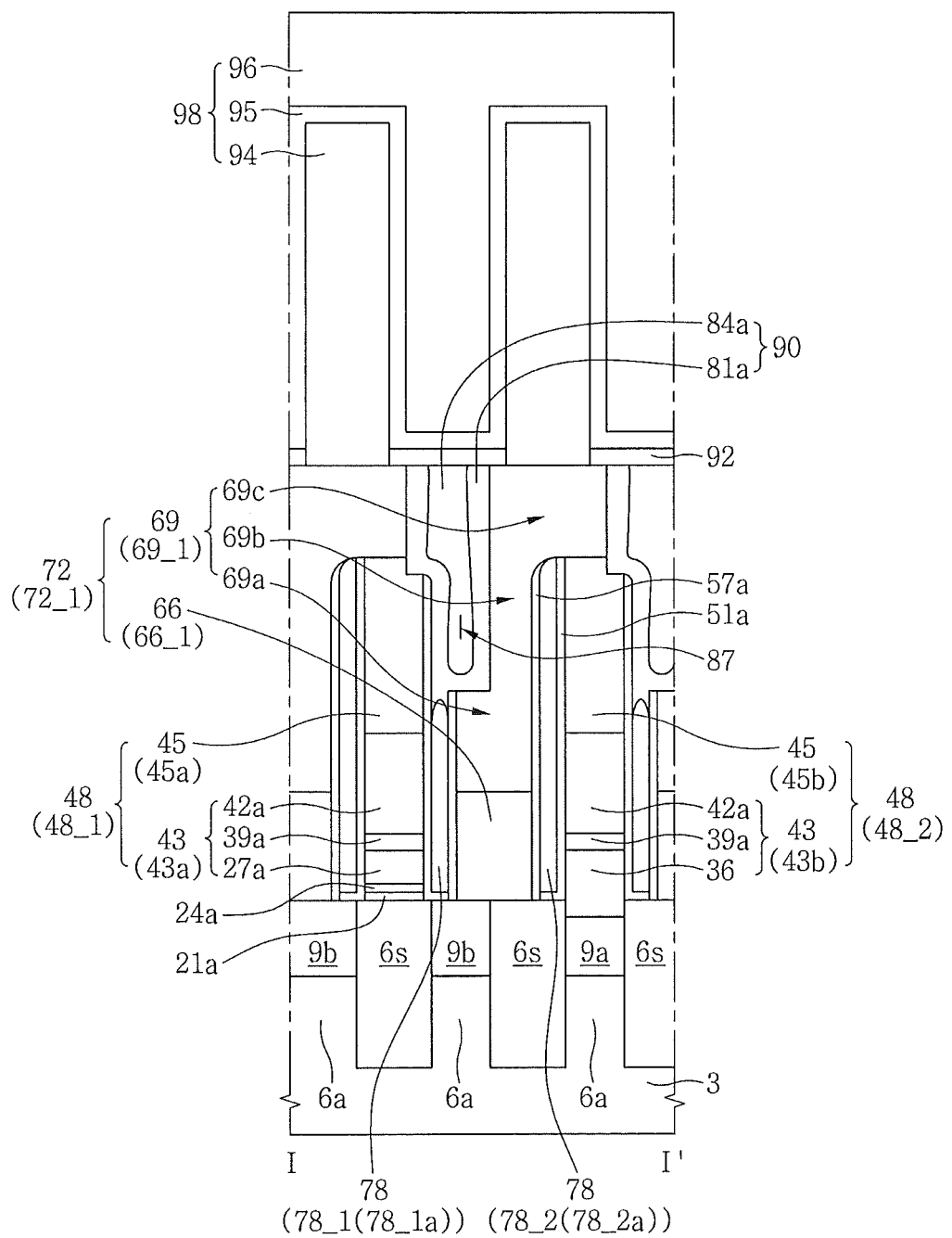
FIGS. 2A, 2B and 2C are cross-sectional views of the semiconductor device in FIG. 1 taken along the respective lines I-I', II-II' and III-III'.
Figure 2B:
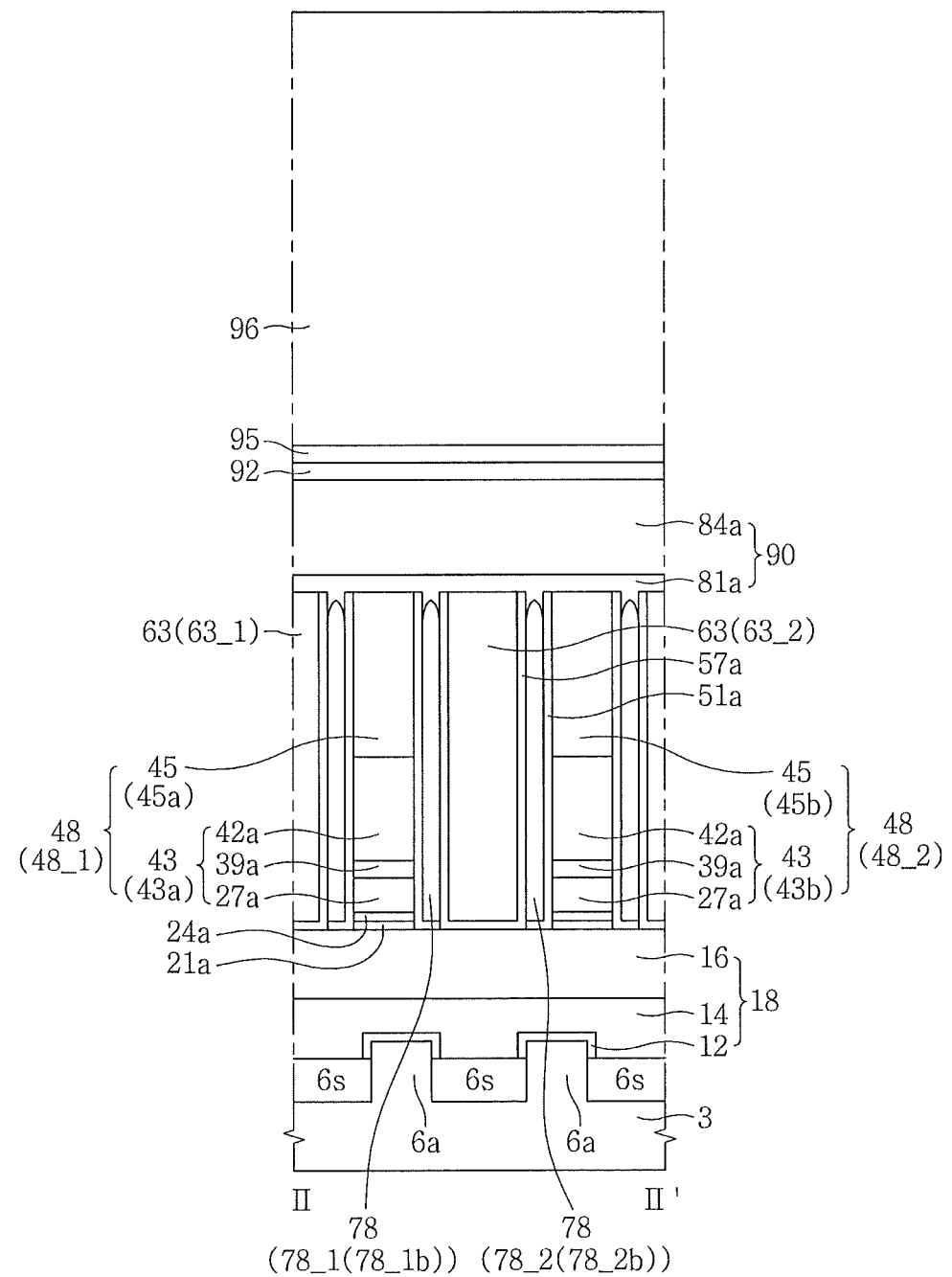
Figure 2C:
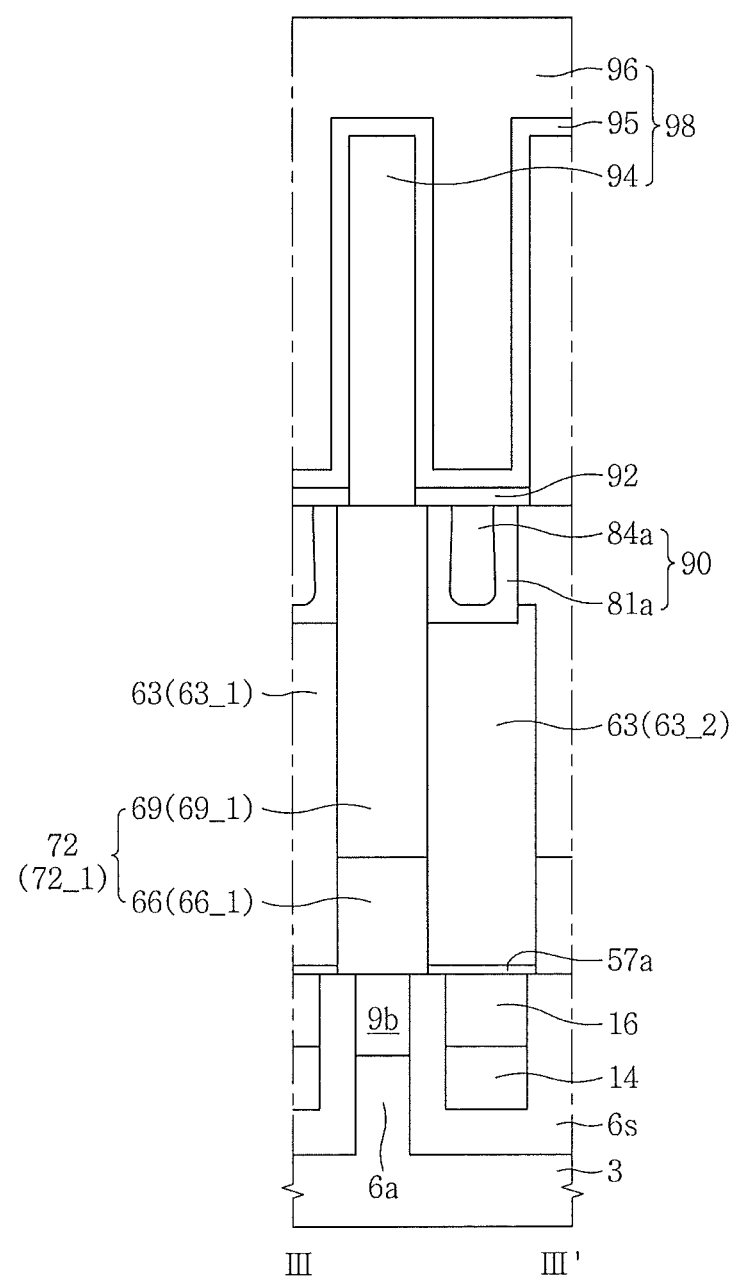
Figure 3A:
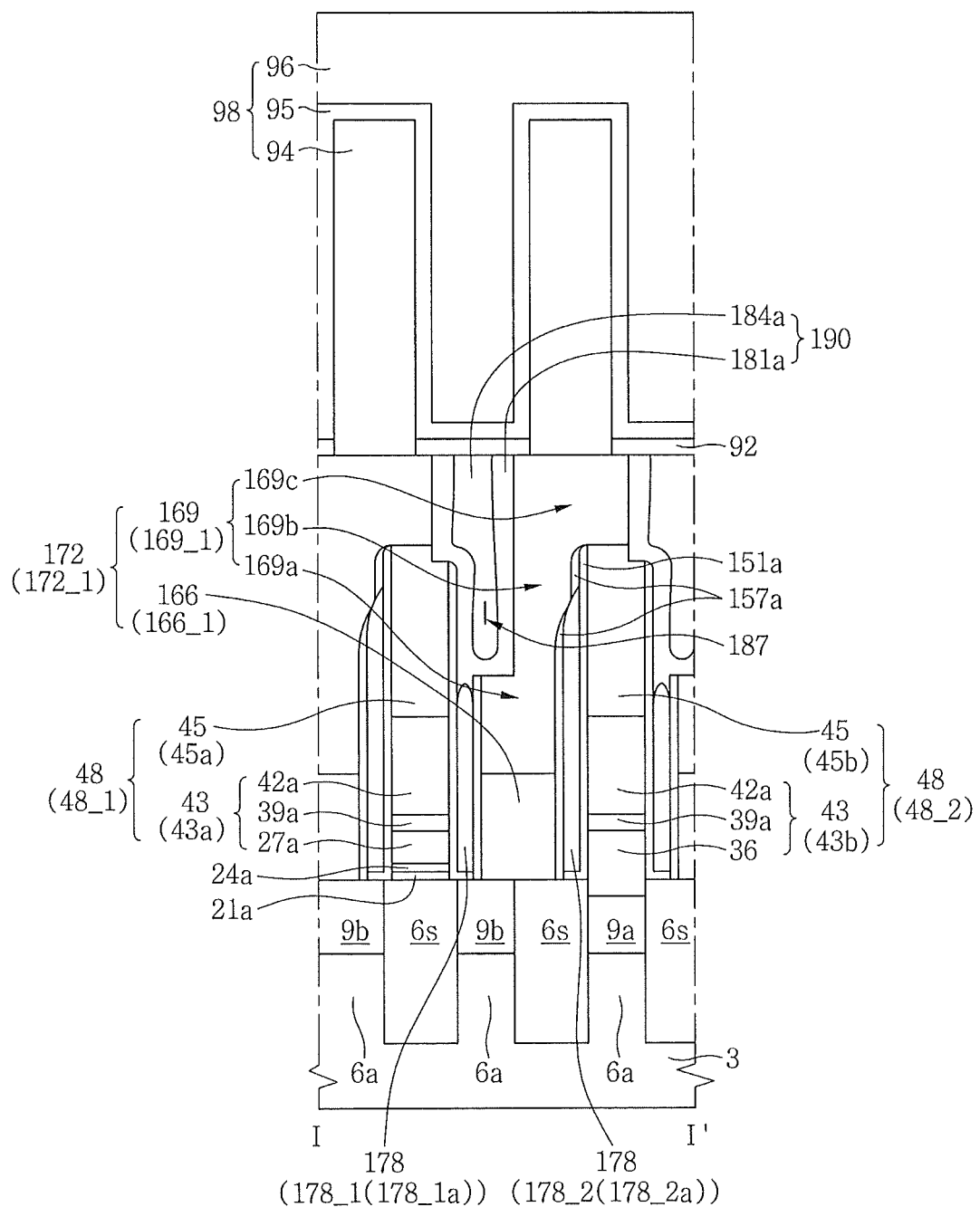
FIGS. 3A, 3B and 3C are cross-sectional views of the semiconductor device in FIG. 1 taken along the respective lines I-I', II-II' and III-III'.
Figure 3B:
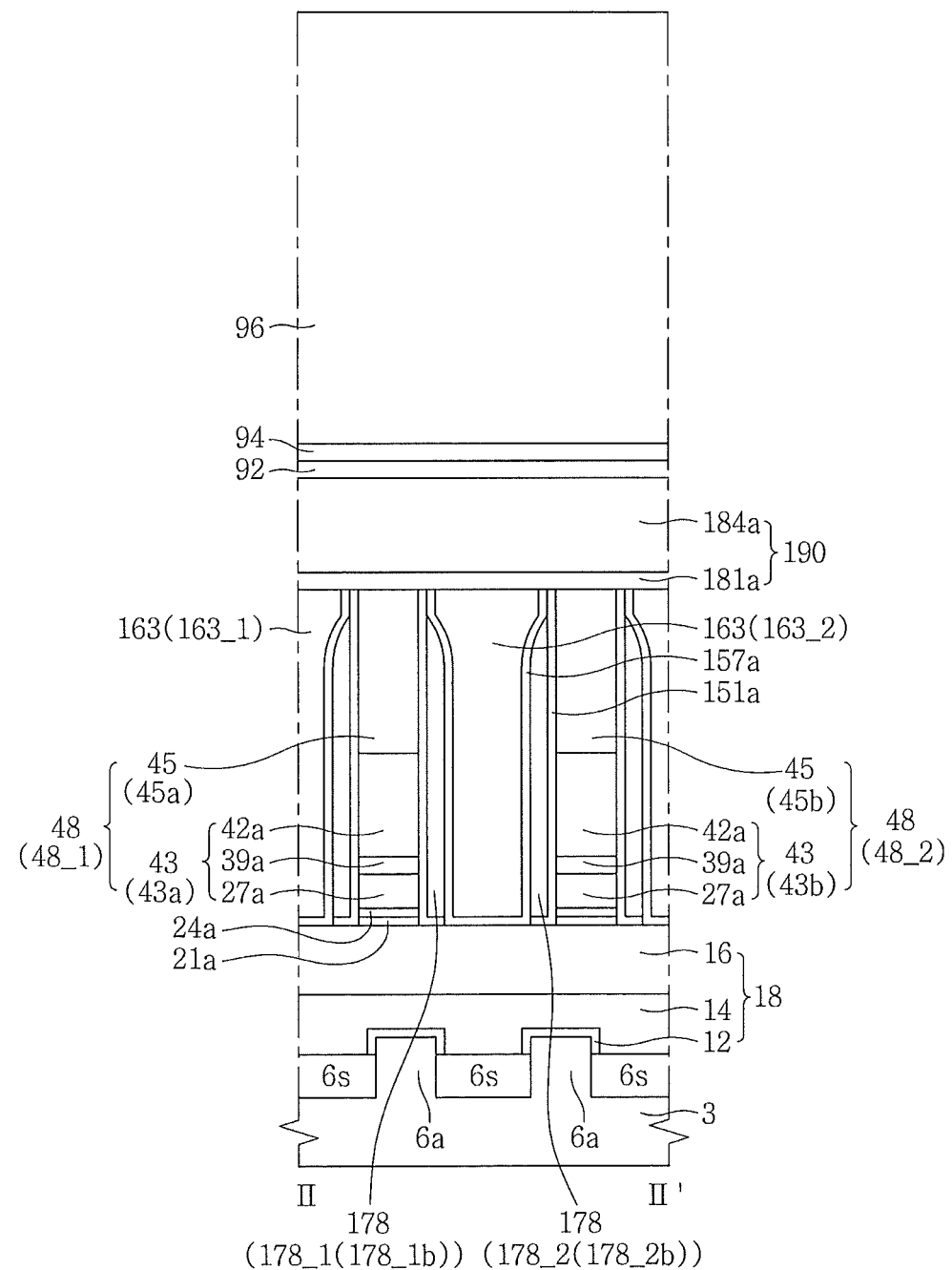
Figure 3C:
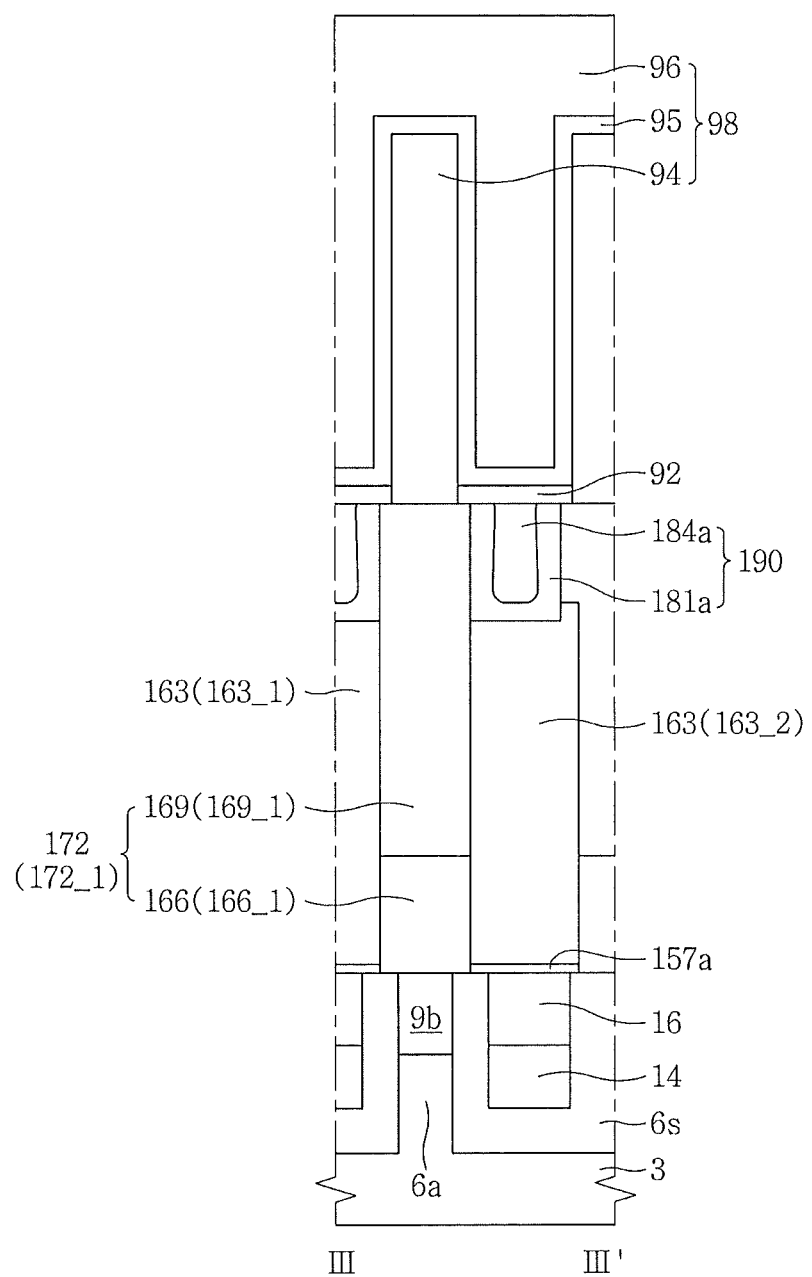
Figure 4A:
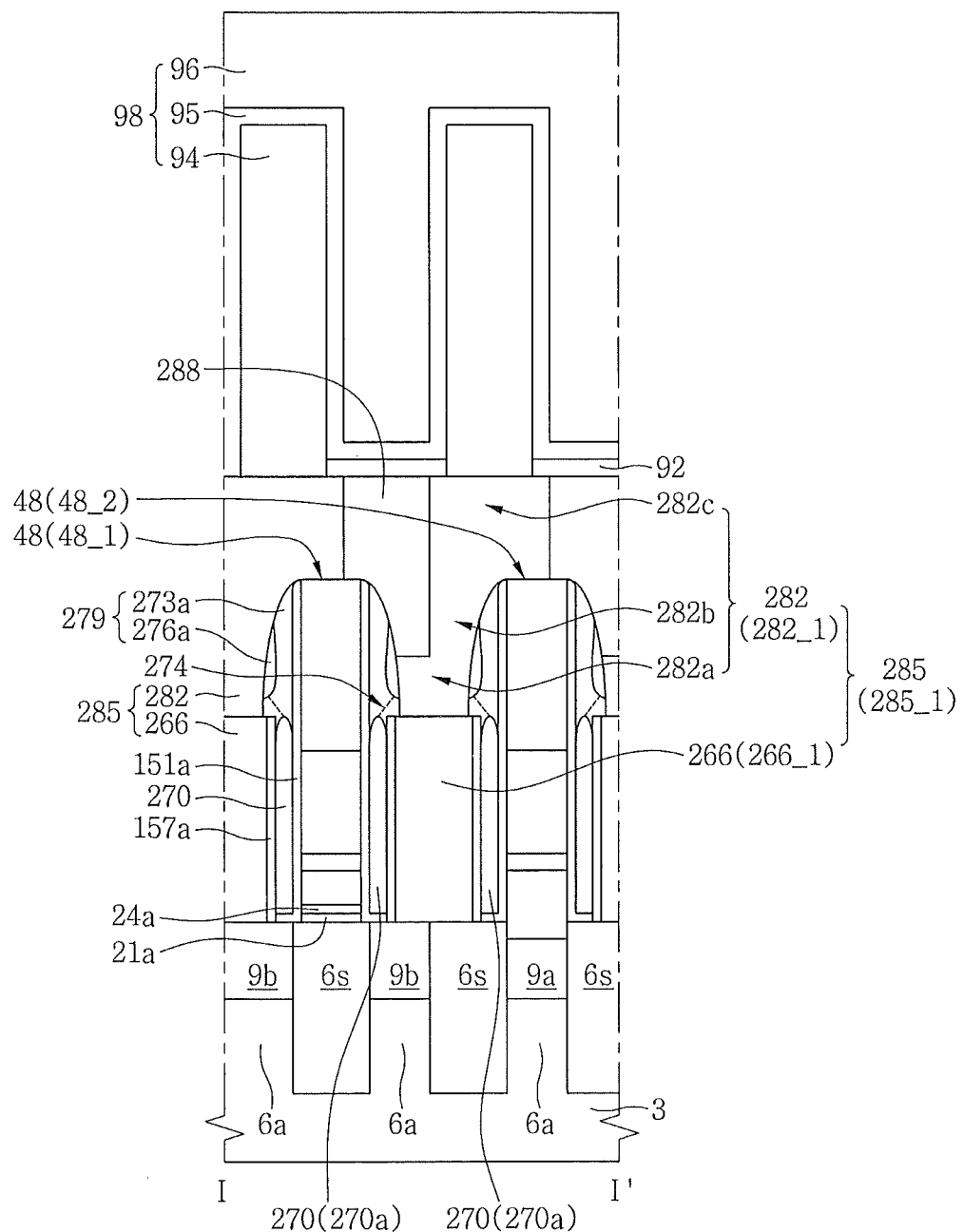
FIGS. 4A, 4B and 4C are cross-sectional views of the semiconductor device in FIG. 1 taken along the respective lines I-I', II-II' and III-III'.
Figure 4B:
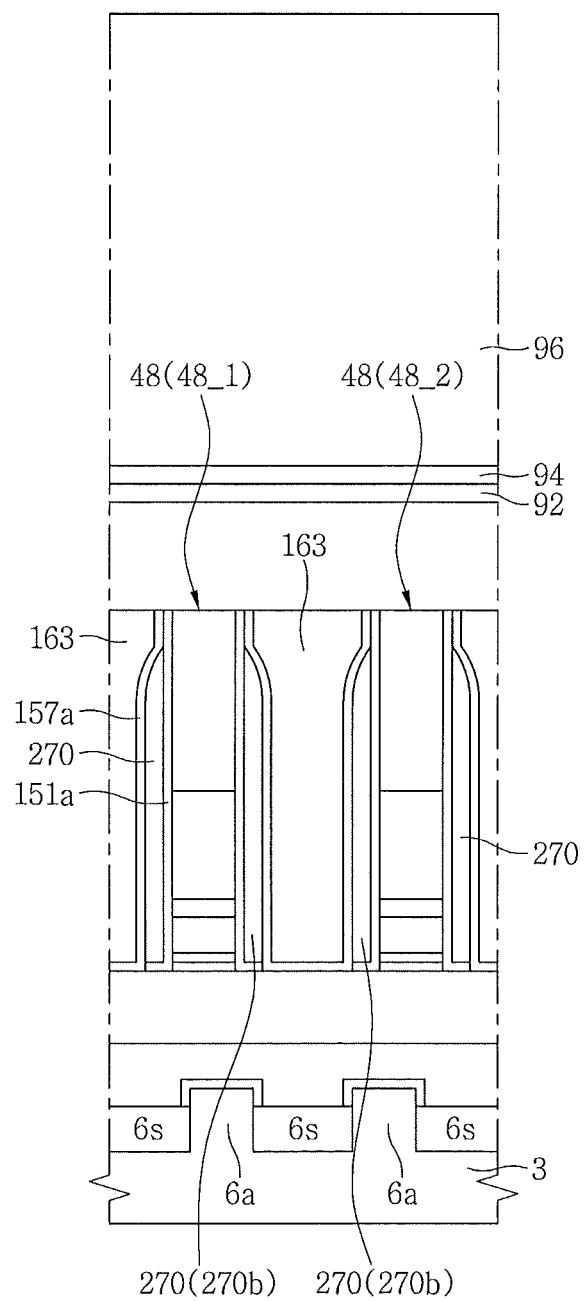
Figure 4C:
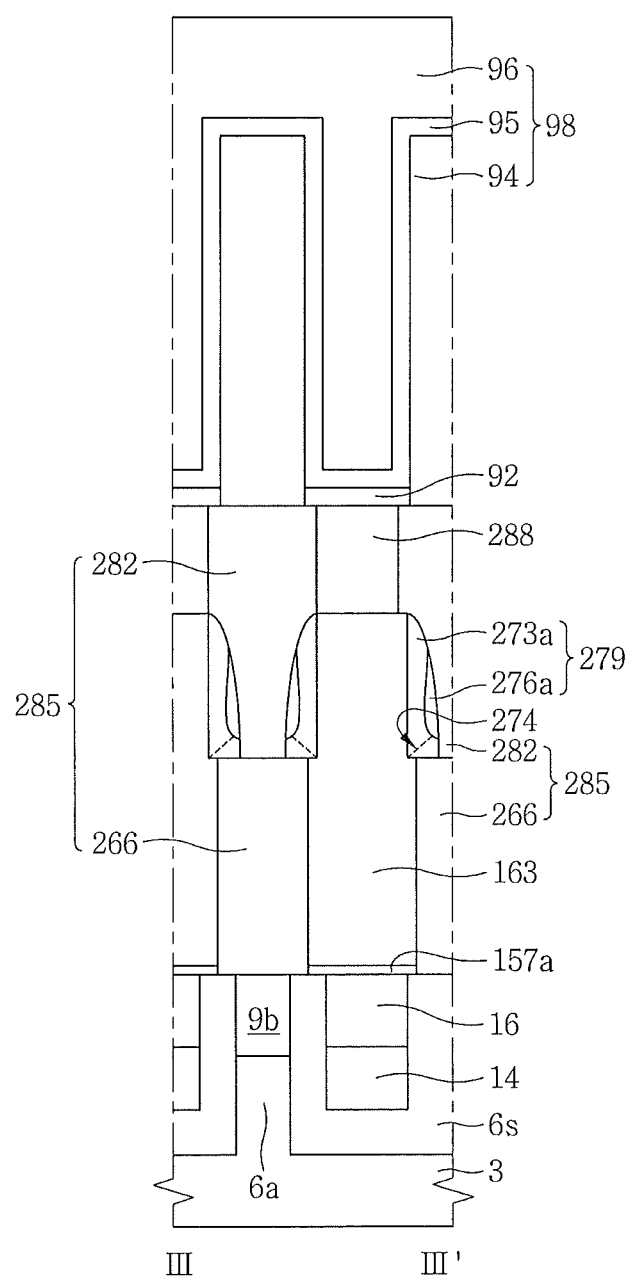

FIG. 1 is a plan view of a semiconductor device according to some embodiments of the present inventive concept. FIGS. 2A, 2B and 2C are cross-sectional views of the semiconductor device in FIG. 1 taken along the respective lines I-I', II-II' and III-III'. FIGS. 3A, 3B and 3C are cross-sectional views of the semiconductor device in FIG. 1 taken along the respective lines I-I', II-II' and III-III'. FIGS. 4A, 4B and 4C are cross-sectional views of the semiconductor device in FIG. 1 taken along the respective lines I-I', II-II' and III-III'.

A semiconductor device according to some embodiments of the present inventive concept will be discussed with reference to FIGS. 1, 2A, 2B, and 2C.

Referring to FIGS. 1A, 2A, 2B, and 2C, a substrate 3 may be provided. The substrate 3 may be a semiconductor substrate. An isolation region 6s may be disposed in the substrate 3 to define an active region 6a. The isolation region 6s may be a shallow trench isolation (STI) layer. FIGS. 1B-1C are enlarged plan views of the portions B-D shown in FIG. 1A, respectively according to some embodiments of the present inventive concept.

Transistors may be disposed in the substrate 3. Each of the transistors may include a gate structure 18 filling a gate trench, which may run across the active region 6a and extend into the isolation region 6s, and first and second source and drain regions 9a and 9b formed in the active region 6a on both sides of the gate structure 18. The gate structures 18 may be parallel to each other.

The gate structure 18 may include a gate electrode 14, a gate dielectric material 12, and a gate capping pattern 16. The gate electrode 14 may be formed within the gate trench, which may run across the active region 6a and extend into the isolation region 6s. The gate dielectric material 12 may be interposed between the gate electrode 14 and the active region 6a. The gate capping pattern 16 may be disposed on the gate electrode 14 and formed of an insulating material. The gate electrode 14 may be a word line of a memory device, such as, for example, a dynamic random access memory (DRAM). The gate electrode 14 may be formed at a lower level than a top surface of the active region 6a.

Line structures 48 may be disposed on the substrate 3 including the transistors. In a memory device, such as, for example, a DRAM, the line structures 48 may be bit line structures. Each of the line structures 48 may include a conductive line 43 and an insulating mask pattern 45 disposed on the conductive line 43. In the memory device, such as, for example, the DRAM, the conductive line 43 may be a bit line. The conductive lines 43 may be formed of conductive materials, while the insulating mask patterns 45 may be formed of an insulating material, such as, for example, silicon nitride.

Each of the conductive lines 43 may include a portion overlapping the active region 6a and a portion that does not overlap the active region 6a. The portion of each of the conductive lines 43, which may overlap the active regions 6a, may overlap the first source and drain regions 9a formed in the active region 6a, and be electrically connected to the first source and drain regions 9a. The portion of each of the conductive lines 43, which may not overlap the active region 6a, may include a lower line pattern 27a, a middle line pattern 39a, and an upper line pattern 42a, which may be stacked sequentially on the substrate 3. The portion of each of the conductive lines 43, which may overlap the active region 6a, may include a line contact pattern 36, a middle line pattern 39a, and an upper line pattern 42a, which may be stacked sequentially on the substrate 3. The line contact pattern 36 may be in contact with and electrically connected to the first source and drain regions 9a.

First and second buffer insulating patterns 21a and 24a may be interposed between the conductive lines 43 and the isolation region 6s and between the conductive lines 43 and the gate structures 18. The second buffer insulating pattern 24a may be disposed on the first buffer insulating pattern 21a.

Insulating isolation patterns 63 may be disposed between the line structures 48. The insulating isolation patterns 63 may be formed of an insulating material, such as, for example, silicon nitride.

Among the line structures 48A, adjacent line structures may be referred to as a first line structure 48_1 and a second line structure 48_2. The first line structure 48_1 may include a first conductive line 43a and a first insulating mask pattern 45a disposed on the first conductive line 43a. The second line structure 48_2 may include a second conductive line 43b and a second insulating mask pattern 45b disposed on the second conductive line 43b.

Among insulating isolation patterns 63, insulating isolation patterns, which may be disposed between the first and second line structures 48_1 and 48_2 and face each other, may be referred to as first and second insulating isolation patterns 63_1 and 63_2.

Conductive structures 72 may be disposed between the line structures 48 and between the insulating isolation patterns 63. Each of the conductive structures 72 may include a lower conductive pattern 66 and an upper conductive pattern 69 disposed on the lower conductive pattern 66.

Each of the upper conductive patterns 69 may include a lower portion 69a, a middle portion 69b disposed on the lower portion 69a, and an upper portion 69c disposed on the middle portion 69b. The lower and middle portions 69a and 69b of each of the upper conductive patterns 69 may be interposed between the line structures 48 and the upper portion 69c of each of the upper conductive patterns 69 may be disposed at a higher level than the line structures 48 relative to an upper surface of the substrate 3. The middle portion 69b of each of the upper conductive patterns 69 may have a smaller width than the lower portion 69a of each of the upper conductive patterns 69. The upper portion 69c of each of the upper conductive patterns 69 may have a greater width than the middle portion 69b of each of the upper conductive patterns 69, so that a sidewall 69d of the upper portion 69c is recessed relative to a sidewall of the lower portion 69a to expose an upper surface 69e of the lower portion 69a.

A conductive structure 72 interposed between the first and second line structures 48_1 and 48_2 and between the first and second insulating isolation patterns 63_1 and 63_2 may be referred to as a first conductive structure 72_1. A lower conductive pattern 66 interposed between the first and second line structures 48_1 and 48_2 and between the first and second insulating isolation patterns 63_1 and 63_2 may be referred to as a first lower conductive pattern 66_1. An upper conductive pattern 69 interposed between the first and second line structures 48_1 and 48_2 and between the first and second insulating isolation patterns 63_1 and 63_2 may be referred to as a first upper conductive pattern 69_1.

The first conductive structure 72_1 may include the first lower conductive pattern 66_1 and the first upper conductive pattern 69_1 disposed on the first lower conductive pattern 66_1.

The first upper conductive pattern 69_1 may include a lower portion 69a, a middle portion 69b disposed on the middle portion 69a, and an upper portion 69c disposed on the middle portion 69b.

The lower portion 69a of the first upper conductive pattern 69_1 may be in contact with the first lower conductive pattern 66_1. The lower portion 69a of the first upper conductive pattern 69_1 may have the same width as the first lower conductive pattern 66_1. The lower portion 69a of the first upper conductive pattern 69_1 may be spaced the same distance apart from the first and second line structures 48_1 and 48_2.

The middle portion 69b of the first upper conductive pattern 69_1 may have a smaller width than the first lower conductive pattern 66_1. The middle portion 69b of the first upper conductive pattern 69_1 may have a smaller width than the lower portion 69a of the first upper conductive pattern 69_1. The middle portion 69b of the first upper conductive pattern 69_1 may be closer to the second line structure 48_2 than to the first line structure 48_1.

The upper portion 69c of the first upper conductive pattern 69_1 may be disposed at a higher level than the first and second line structures 48_1 and 48_2 relative to an upper surface of the substrate 3. The upper portion 69c of the first upper conductive pattern 69_1 may have a greater width than the middle portion 69b thereof. The upper portion 69c of the first upper conductive pattern 69_1 may be spaced apart from the first line structure 48_1 and cover a portion of a top surface of the second line structure 48_2. The upper portion 69c of the first upper conductive pattern 69_1 may not overlap the first line structure 48_1 in a vertical direction (for example, in plan view), and may overlap the portion of the top surface of the second line structure 48_2 in the vertical direction (in plan view).

Empty spaces 78 may be disposed between the line structures 48 and the conductive structures 72. Empty spaces 78 interposed between the first and second line structures 48_1 and 48_2 may be referred to as a first empty space 78_1 and a second empty space 78_2.

In the specification, the term "empty space" may be defined as space not filled with a solid material. Accordingly, the term "empty space" may include space not completely empty and may include, for example, space filled with gas or air.

The empty spaces 78 may reduce a parasitic capacitance between the line structures 48 and a parasitic capacitances between the line structures 48 and the conductive structures 72. The empty spaces 78 may reduce a bit line loading capacitance in a memory device, such as, for example, a DRAM. Also, by reducing the bit line loading capacitance, a gradual reduction of a bit line sensing margin due to an increase in the integration density of a DRAM may be reduced or minimized.

The first empty space 78_1 may include a first portion 78_1a disposed between the first line structure 48_1 and the first conductive structure 72_1 and a second portion 78_1b interposed between the first line structure 48_1 and the insulating isolation patterns 63. The first portion 78_1a of the first empty space 78_1 and the second portion 78_1b of the first empty space 78_1 may have different heights. The first portion 78_1a of the first empty space 78_1 may have a height smaller than a height of the second portion 78_1b of the first empty space 78_1.

The second empty space 78_2 may include a first portion 78_2a disposed between the second line structure 48_2 and the first conductive structure 72_1 and a second portion 78_2b interposed between the second line structure 48_2 and the insulating isolation patterns 63. The first and second portions 78_2a and 78_2b of the second empty space 78_2 may have heights greater than the height of the first portion 78_1a of the first empty space 78_1.

The empty spaces 78 may include portions overlapping upper portions 69c of the conductive structures 72 and portions not overlapping the upper portions 69c of the conductive structures 72.

Upper portions of the empty spaces 78, which may overlap the upper portions 69c of the conductive structures 72 in plan view, may be covered with the conductive structures 72. For example, an upper portion of the first portion 78_2a of the second empty space 78_2 interposed between the second line structure 48_2 and the conductive structure 72 may be covered with the conductive structure 72.

Upper portions of the portions of the empty spaces 78 that do not overlap the upper portions 69c of the conductive structures 72 in plan view may be enclosed by an insulating capping pattern 90.

The insulating capping pattern 90 may be disposed to enclose the upper portions of the empty spaces 78 that may not overlap the conductive structures 72. For example, the insulating capping pattern 90 may enclose an upper portion of the first portion 78_1a of the first empty space 78_1 disposed between the first line structure 48_1 and the conductive structure 72. Also, the insulating capping pattern 90 may enclose an upper portion of the second portion 78_1b of the first empty space 78_1 interposed between the first line structure 48_1 and the insulating isolation pattern 63. Furthermore, the insulating capping pattern 90 may enclose an upper portion of the second portion 78_2b of the second empty space 78_2 interposed between the second line structure 48_2 and the insulating isolation patterns 63.

The insulating capping pattern 90 may be disposed at a higher level than the conductive lines 43. The insulating capping pattern 90 may include a portion interposed between the line structures 48 and a portion interposed between the upper portions 69c of the upper conductive patterns 69 of the conductive structures 72.

The insulating capping pattern 90 may include a first insulating capping pattern 81a and a second insulating capping pattern 84a. The first insulating capping pattern 81a may be disposed to surround side surfaces and a lower portion of the second insulating capping pattern 84a and may have a non-uniform thickness. A void or core 87 may be formed in the second insulating capping pattern 84a of the insulating capping pattern 90. The void or core 87 may be formed in the second insulating capping pattern 84a of the insulating capping pattern 90 interposed between the line structures 48.

The first insulating capping pattern 81a may reduce or minimize a reduction in the volume of each of the empty spaces 78 and enclose upper portions of the empty spaces 78. The second insulating capping pattern 84a may reduce failures originated from the first insulating capping pattern 81a. The second insulating capping pattern 84a may be formed of a layer having better gap-fill characteristics than the first insulating capping pattern 81a, a layer having a more uniform thickness than the first insulating capping pattern 81a, a layer having a higher density than the first insulating capping pattern 81a, or a layer having a different etch rate from the first insulating capping pattern 81a.

The insulating capping pattern 90 may cover portions of the line structures 48, which may not overlap the upper portions 69c of the conductive structures 72, and portions of the insulating isolation patterns 63.

Portions of the insulating capping pattern 90 interposed between the line structures 48 and the middle portions 69b of the conductive structures 72 may have a greater width than the empty spaces 78. For example, the insulating capping pattern 90 may include a portion interposed between the first line structure 48_1 and the second portion 69b of the first upper conductive pattern 69 of the first conductive structure 72_1, and the portion of the insulating capping pattern 90 may have a greater width than the first empty space 78_1.

Insulating spacers 51a may be disposed between the empty spaces 78 and the line structures 48. Insulating protection patterns 57a may be disposed between the empty spaces 78 and the conductive structures 72. The empty spaces 78 may be enclosed and defined by the insulating spacers 51a, the insulating protection patterns 57a, the insulating capping pattern 90, and the conductive structures 72.

Sidewalls and bottoms of the empty spaces 78 may be surrounded and enclosed by the insulating spacers 51a and the insulating protection patterns 57a, and the upper portions of the empty spaces 78 may be surrounded and enclosed by the insulating capping pattern 90 and the conductive structures 72.

Information storage elements 98 may be electrically connected to the conductive structures 72. The information storage elements 98 may be cell capacitors of a memory device, such as, for example, a DRAM. For example, the cell capacitors 98 may include first electrodes 94, a capacitor dielectric material 95 disposed on the first electrodes 94, and a second electrode 96 disposed on the capacitor dielectric material 95. The first electrodes 64 may be disposed on the conductive structures 72 and electrically connected to the conductive structures 72. An etch stop layer 92 having insulating characteristics may be disposed between the insulating capping pattern 90 and the capacitor dielectric material 95.

Next, a semiconductor device according to some embodiments of the present inventive concept will be discussed with reference to FIGS. 1, 3A, 3B, and 3C.

Referring to FIGS. 1, 3A, 3B, and 3C, as discussed with reference to FIGS. 2A, 2B, and 2C, a substrate 3 including a transistor may be provided. For example, the transistor may include the gate structure 18 and the first and second source and drain regions 9a and 9b as discussed with reference to FIGS. 2A, 2B, and 2C.

The line structures 48 may be disposed on the substrate 3 including the transistor as discussed with reference to FIGS. 2A, 2B, and 2C. As discussed with reference to FIGS. 2A, 2B, and 2C, the line structures 48 may include the first line structure 48_1 and the second line structure 48_2 disposed parallel and adjacent to each other.

Insulating isolation patterns 163 may be disposed between the line structures 48. The insulating isolation patterns 163 may be disposed at substantially the same position as the insulating isolation patterns 63 discussed with reference to FIGS. 2A, 2B, and 2C. The insulating isolation patterns 163 may be formed of an insulating material, such as, for example, silicon nitride.

Insulating isolation patterns 163, which may be disposed between the first and second line structures 48_1 and 48_2 and face each other, may be referred to as first and second insulating isolation patterns 163_1 and 163_2.

Conductive structures 172 may be disposed between the line structures 48 and between the insulating isolation patterns 163. Each of the conductive structures 172 may include a lower conductive pattern 166 and an upper conductive pattern 169 disposed on the lower conductive pattern 166.

Each of the upper conductive patterns 169 may include a lower portion 169a, a middle portion 169b disposed on the lower portion 169a, and an upper portion 169c disposed on the middle portion 169b. The lower and middle portions 169a and 169b of the upper conductive patterns 169 may be interposed between the line structures 48, and the upper portion 169*c* of each of the upper conductive patterns 169 may be disposed at a higher level than the line structures 48 relative to an upper surface of the substrate 3. The middle portion 169*b* of each of the upper conductive patterns 169 may have a smaller width than the lower portion 169*a* thereof. The upper portion 169*c* of each of the upper conductive patterns 169 may have a greater width than the middle portion 169*b* thereof.

Among conductive structures 172A, a conductive structure, which is interposed between the first and second line structures 48_1 and 48_2 and between the first and second insulating isolation patterns 163_1 and 163_2, may be referred to as a first conductive structure 172_1. Among lower conductive patterns 166, a lower conductive pattern, which is interposed between the first and second line structures 48_1 and 48_2 and between the first and second insulating isolation patterns 163_1 and 163_2, may be referred to as a first lower conductive pattern 166_1. Among upper conductive patterns 169, an upper conductive pattern, which is interposed between the first and second line structures 48_1 and 48_2 and between the first and second insulating isolation patterns 163_1 and 163_2, may be referred to as a first upper conductive pattern 169_1.

The first conductive structure 172_1 may include the first lower conductive pattern 166_1 and the first upper conductive pattern 169_1 disposed on the first lower conductive pattern 166_1. The first upper conductive pattern 169_1 may include a lower portion 169*a*, a middle portion 169*b* disposed on the lower portion 169*a*, and an upper portion 169*c* disposed on the middle portion 169*b*. The lower portion 169*a* of the first upper conductive pattern 169_1 may be in contact with the first lower conductive pattern 166_1. The lower portion 169*a* of the first upper conductive pattern 169_1 may have the same width as the first lower conductive pattern 166_1. The lower portion 169*a* of the first upper conductive pattern 169_1 may be spaced the same distance apart from the first and second line structures 48_1 and 48_2. The middle portion 169*b* of the first upper conductive pattern 169_1 may have a smaller width than the first lower conductive pattern 166_1. The middle portion 169*b* of the first upper conductive pattern 169_1 may have a smaller width than the lower portion 169*a* of the first upper conductive pattern 169_1. The middle portion 169*b* of the first upper conductive pattern 169_1 may be closer to the second line structure 48_2 than to the first line structure 48_1. The upper portion 169*c* of the first upper conductive pattern 169_1 may be a portion disposed at a higher level than the first and second line structures 48_1 and 48_2. The upper portion 169*c* of the first upper conductive pattern 169_1 may be defined by upper portions of the conductive structures 172. The upper portion 169*c* of the first upper conductive pattern 169_1 may have a greater width than the middle portion 169*b* of the first upper conductive pattern 169_1.

The upper portion 169*c* of the first upper conductive pattern 169_1 may be spaced apart from the first line structure 48_1 and cover a portion of the top surface of the second line structure 48_2. The upper portion 169*c* of the first upper conductive pattern 169_1 may not overlap the first line structure 48_1 in a vertical direction, and overlap the portion of the top surface of the second line structure 48_2 in the vertical direction.

Empty spaces 178 may be disposed between the line structures 48 and the conductive structures 172. The empty spaces 178 may serve to reduce a bit line loading capacitance in a memory device, such as, for example, a DRAM and may ensure a bit line sensing margin. The empty spaces 178 may be disposed at a lower level than top surfaces of the line structures 48. Empty spaces 178 interposed between the first and second line structures 48_1 and 48_2 may be referred to as a first empty space 178_1 and a second empty space 178_2.

The first empty space 178_1 may include a first portion 178_1*a* interposed between the first line structure 48_1 and the first conductive structure 1721 and a second portion 178_1*b* interposed between the first line structure 48_1 and the insulating isolation patterns 163.

The first portion 178_1*a* of the first empty space 178_1 and the second portion 178_1*b* of the first empty space 178_1 may have different heights. The first portion 178_1*a* of the first empty space 178_1 may have a smaller height than the second portion 178_1*b* of the first empty space 178_1.

The second empty space 178_2 may include a first portion 178_2*a* interposed between the second line structure 48_2 and the first conductive structure 172_1 and a second portion 178_2*b* interposed between the second line structure 48_2 and the insulating isolation patterns 163. The first portion 178_2*a* of the second empty space 178_2 and the second portion 178_2*b* thereof may have the same height. The first portion 178_1*a* of the first empty space 178_1 may have a lower height than the first portion 178_2*a* of the second empty space 178_1.

An insulating capping pattern 190 may be disposed on the conductive lines 43. The insulating capping pattern 190 may be disposed at a higher level than the conductive lines 43. The insulating capping pattern 190 may include a portion interposed between the line structures 48 and a portion interposed between the third portions 169*c* of the upper conductive patterns 169 of the conductive structures 172. A portion of the insulating capping pattern 190 interposed between the first and second line structures 48_1 and 48_2 may be closer to the first line structure 48_1 than to the second line structure 48_2.

The insulating capping pattern 190 may include a first insulating capping pattern 181*a* and a second insulating capping pattern 184*a*. The first insulating capping pattern 181*a* may be disposed to surround side surfaces and a lower portion of the second insulating capping pattern 184*a* and may have a non-uniform thickness. A void or core 187 may be formed in the second insulating capping pattern 184*a* of the insulating capping pattern 190. The void or core 187 may be formed in the second insulating capping pattern 184*a* of the insulating capping pattern 190 interposed between the line structures 48.

Like the insulating capping pattern 90 discussed with reference to FIGS. 2A, 2B, and 2C, the insulating capping pattern 190 may reduce or minimize a reduction in the volume of each of the empty spaces 178 and stably seal upper portions of the empty spaces 178, so that the performance of the semiconductor device may be improved.

The insulating capping pattern 190 may cover portions of the line structures 48, which may not overlap the upper portions 169*c* of the conductive structures 172, and also cover portions of the insulating isolation patterns 163, which may not overlap the upper portions 169*c* of the conductive structures 172. Portions of the insulating capping pattern 190, which may be interposed between the line structures 48 and the second portions 169*b* of the conductive structures 172, may have a greater width than the empty spaces 178.

Insulating spacers 151*a* may be disposed between the empty spaces 178 and the line structures 48. Insulating protection patterns 157*a* may be disposed between the empty spaces 178 and the conductive structures 172. Portions of upper portions of the empty spaces 178 may be enclosed by the conductive structures 172.

Sidewalls and bottoms of the empty spaces 178 may be surrounded and enclosed by the insulating spacers 151*a* and the insulating protection patterns 157a. The upper portions of the empty spaces 178 may be surrounded and enclosed by the insulating capping pattern 190 and the conductive structures 172.

Information storage elements 98 may be electrically connected to the conductive structures 172. The information storage elements 98 may be cell capacitors of a memory device, such as, for example, a DRAM. For example, the cell capacitors 98 may include first electrodes 94, a capacitor dielectric material 95 disposed on the first electrode 94, and a second electrode 96 disposed on the capacitor dielectric material 95. The first electrodes 94 may be disposed on the conductive structures 172 and electrically connected to the conductive structures 172. An etch stop layer 92 having insulating characteristics may be disposed between the insulating capping pattern 190 and the capacitor dielectric material 95.

Next, a semiconductor device according to some embodiments of the present inventive concept will be discussed with reference to FIGS. 1, 4A, 4B, and 4C.

Referring to FIGS. 1, 4A, 4B, and 4C, a substrate 3 including transistors including the gate structure 18 and first and second source and drain regions 9a and 9b discussed with reference to FIGS. 2A, 2B, and 2C may be provided.

The line structures 48 discussed with reference to FIGS. 2A, 2B, and 2C may be disposed on the substrate 3 including the transistors. The line structure 48 may include the first line structure 48_1 and the second line structure 48_2 disposed parallel and adjacent to each other.

Insulating isolation patterns 163 may be disposed between the line structures 48. The insulating isolation patterns 163 may be formed of an insulating material, such as, for example, silicon nitride.

Conductive structures 285 may be disposed between the line structures 48 and the insulating isolation patterns 163. Each of the conductive structures 285 may include a lower conductive pattern 266 and an upper conductive pattern 282 disposed on the lower conductive pattern 266.

A first conductive structure 285_1 of any one of the conductive structures 285 may be disposed between the first and second line structures 48_1 and 48_2 and between the insulating isolation patterns 163.

The first conductive structure 285_1 may include a first lower conductive pattern 266_1 and a first upper conductive pattern 282_1 disposed on the first lower conductive pattern 266_1.

The first upper conductive pattern 282_1 may include a lower portion 282a, a middle portion 282b disposed on the lower portion 282a, and an upper portion 282c disposed on the middle portion 282b. The lower portion 282a of the first upper conductive pattern 282_1 may be in contact with the first lower conductive pattern 266_1. The lower portion 282a of the first upper conductive pattern 282_1 may have a smaller width than the first lower conductive pattern 266_1. The lower portion 282a of the first upper conductive pattern 282_1 may be spaced the same distance apart from the first and second line structures 48_1 and 48_2. The middle portion 282b of the first upper conductive pattern 282_1 may have a smaller width than the lower portion 282a of the first upper conductive pattern 282_1. The middle portion 282b of the first upper conductive pattern 282_1 may be closer to the second line structure 48_2 than to the first line structure 48_1. The upper portion 282c of the first upper conductive pattern 282_1 may be a portion disposed at a higher level than the first and second line structures 48_1 and 48_2. The upper portion 282c of the first upper conductive pattern 282_1 may be defined by upper portions of the conductive structures 285. The upper portion 282c of the first upper conductive pattern 282_1 may have a greater width than the middle portion 282b of the first upper conductive pattern 282_1.

The upper portion 282c of the first upper conductive pattern 282_1 may be spaced apart from the first line structure 48_1 and cover a portion of a top surface of the second line structure 48_2. The upper portion 282c of the first upper conductive pattern 282_1 may not overlap the first line structure 48_1 in a vertical direction and may overlap the portion of the top surface of the second line structure 48_2.

Empty spaces 270 may be disposed between the line structures 48 and the conductive structures 285. Like the empty spaces 78 discussed with reference to FIGS. 2A, 2B, and 2C, the empty spaces 270 may reduce a bit line loading capacitance in a memory device, such as, for example, a DRAM, and may ensure a bit line sensing margin.

The empty spaces 270 may be disposed at a lower level than top surfaces of the line structures 48. Upper end portions of the empty spaces 270 may be disposed at a higher level than the conductive lines 43 of the line structures 48.

The empty spaces 270 may have first portions 270a interposed between the line structures 48 and the conductive structures 285 and second portions 270b interposed between the line structures 48 and the insulating isolation patterns 163, respectively.

The first portions 270a of the empty spaces 270, which may be interposed between the line structures 48 and the conductive structures 285, may have a height lower than that of the second portions 270b of the empty spaces 270, which may be interposed between the line structures 48 and the insulating isolation patterns 163.

Insulating capping patterns 279 may be disposed on upper side surfaces of the line structures 48. The insulating capping patterns 279 may be disposed at a higher level than the conductive lines 43 and disposed on side surfaces of the insulating mask patterns 45. Each of the insulating capping patterns 279 may include a first insulating capping pattern 273a and a second insulating capping pattern 276a. The first insulating capping pattern 273a may be closer to the line structures 48 and the insulating isolation patterns 163 than to the second insulating capping pattern 276a. The first insulating capping pattern 273a may be disposed to surround side surfaces and a lower portion of the second insulating capping pattern 276a and may have a non-uniform thickness. The insulating capping patterns 279 may enclose and cover upper portions of the first portions 270a of the empty spaces 270 interposed between the line structures 48 and the conductive structures 285. The insulating capping patterns 279 may have a greater width than the empty spaces 270.

The first insulating capping pattern 273a may be formed of a material layer capable of reducing or minimizing a reduction in the volume of each of the empty spaces 270 and enclosing upper portions of the empty spaces 270. The first insulating capping pattern 273a may have a non-uniform thickness. Interfaces 274 may be formed in the first insulating capping layer 273 at corners between side surfaces of the line structures 78 and top surfaces of the lower conductive patterns 266.

The second insulating capping pattern 276a may cover the interfaces 274 formed in the first insulating capping pattern 273a. The second insulating capping pattern 276a may reduce failures originated from the interfaces 274 formed in the first insulating capping layer 273. The second insulating capping pattern 276a may be formed of a layer including no interface or fewer interfaces than the first insulating capping pattern 273a, a layer having a thickness more uniform than a thickness of the first insulating capping pattern 273a, a layer having a density higher than a density of the first insulating capping pattern 273a, or a layer having an etch rate different from an etch rate of the first insulating capping pattern 273a.

Insulating spacers 151a may be disposed between the empty spaces 270 and the line structures 48. Insulating protection patterns 157a may be disposed between the empty spaces 270 and the conductive structures 285. The second portions 270a of the empty spaces 270, which may be interposed between the line structures 48 and the insulating isolation patterns 163, may be defined by the insulating spacers 151a and the insulating protection patterns 175a.

Information storage elements 98 may be electrically connected to the conductive structures 285. The information storage elements 98 may be cell capacitors of a memory device, such as, for example, a DRAM. For example, the cell capacitors 98 may include first electrodes 94, a capacitor dielectric material 95 disposed on the first electrodes 94, and a second electrode 96 disposed on the capacitor dielectric material 95. The first electrodes 94 may be disposed on the conductive structures 285 and electrically connected to the conductive structures 285. An etch stop layer 92 having insulating characteristics may be disposed between the insulating capping pattern 190 and the capacitor dielectric material 95.

Figure 5:
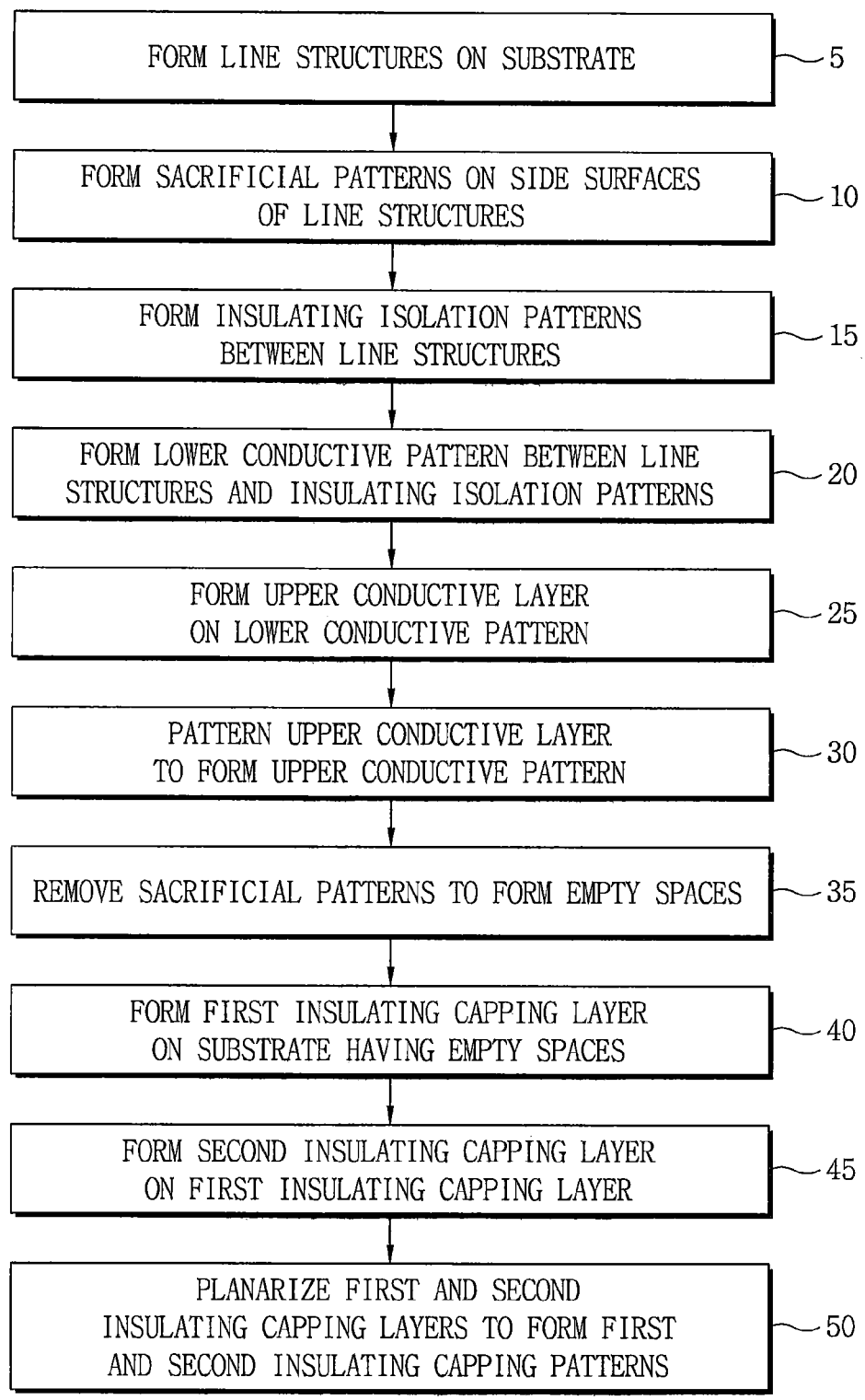
FIG. 5 is a process flowchart illustrating operations of a method of manufacturing a semiconductor device according to some embodiments of the present inventive concept.

FIG. 5 a process flowchart illustrating operations of a method of manufacturing a semiconductor device according to some embodiments of the present inventive concept.

FIGS. 6, 8, 10, 12, 14, 16 and 18 are plan views illustrating intermediate structures provided in operations of a method of manufacturing a semiconductor device according to some embodiments of the present inventive concept. FIGS. 7, 9A through 9E, 11A, 11B, 13A through 13D, 15A through 15C, 17A, 17B, 19A through 19C are cross-sectional views illustrating intermediate structures provided in operations of a method of manufacturing a semiconductor device according to some embodiments of the present inventive concept.

Figure 6:
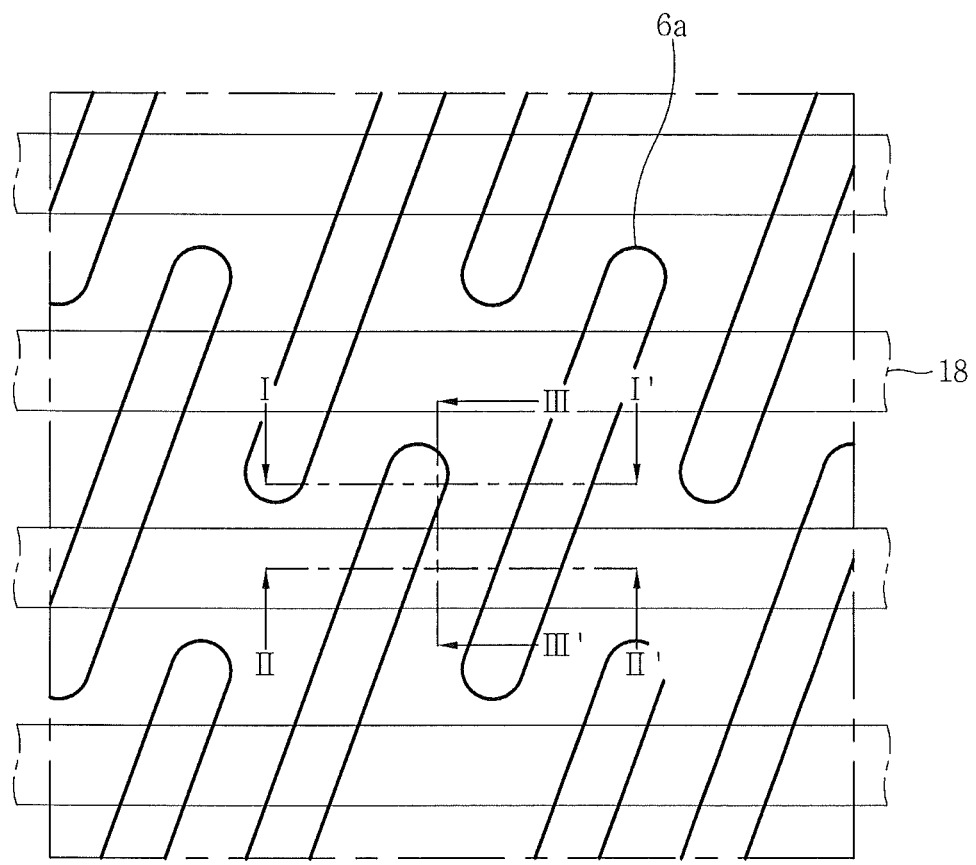
FIGS. 6, 8, 10, 12, 14, 16 and 18 are plan views illustrating intermediate structures provided in operations of a method of manufacturing a semiconductor device according to some embodiments of the present inventive concept.
Figure 7:
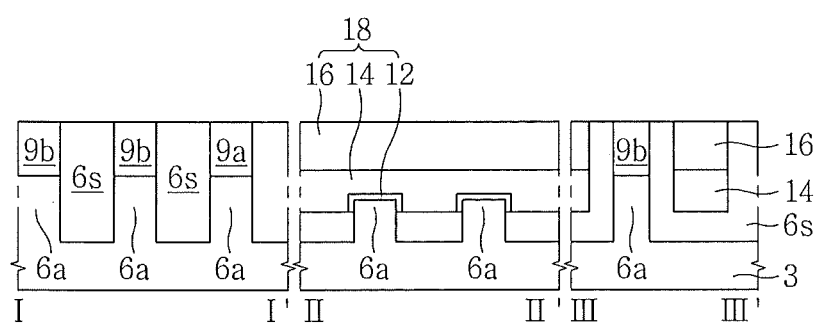
FIGS. 7, 9A through 9E, 11A, 11B, 13A through 13D, 15A through 15C, 17A, 17B, 19A through 19C are cross-sectional views illustrating intermediate structures provided in operations of a method of manufacturing a semiconductor device according to some embodiments of the present inventive concept.

FIG. 7 are cross-sectional views taken along the lines I-I', II-II' and III-III' of FIG. 6. Each of FIGS. 9A through 9E are cross-sectional views taken along the respective lines I-I', II-II' and III-III' of FIG. 8. Each of FIGS. 11A and 11B are cross-sectional views taken along the respective lines I-I', II-II' and III-III' of FIG. 10. Each of FIGS. 13A through 13D are cross-sectional views taken along the respective lines I-I', II-II' and III-III' of FIG. 12. Each of FIGS. 15A through 15C are cross-sectional views taken along the respective lines I-I', II-II' and III-III' of FIG. 14. Each of FIGS. 17A and 17B are cross-sectional views taken along the respective lines I-I', II-II' and III-III' of FIG. 16. Each of FIGS. 19A through 19C are cross-sectional views taken along the respective lines I-I', II-II' and III-III' of FIG. 18.

A method of manufacturing a semiconductor device according to some embodiments of the present inventive concept will be discussed with reference to FIG. 5.

Referring to FIG. 5, line structures may be formed on a substrate (operation 5). Sacrificial patterns may be formed on side surfaces of the line structures (operation 10). Insulating isolation patterns may be formed on the line structures (operation 15). A lower conductive pattern may be formed between the line structures and the insulating isolation patterns (operation 20). An upper conductive layer may be formed on the substrate including the lower conductive pattern (operation 25). The upper conductive layer may be patterned to form an upper conductive pattern (operation 30). The sacrificial patterns may be removed to form empty spaces (operation 35). A first insulating capping layer may be formed on the substrate including the empty spaces (operation 40). A second insulating capping layer may be formed on the first insulating capping layer (operation 45). First and second insulating capping patterns may be formed (operation 50).

Operations of a method of manufacturing a semiconductor device according to some embodiments of the present inventive concept will be discussed.

Referring to FIGS. 6 and 7A, a substrate 3 may be prepared. The substrate 3 may be a semiconductor substrate formed of a semiconductor material, such as, for example, silicon. An isolation region 6s may be formed in the substrate 3 to define an active region 6a. The isolation region 6s may be a shallow trench isolation (STI) layer. The formation of the isolation region 6s may include forming a field trench in the semiconductor substrate 3 to define the active region 6a and forming an insulating material layer to fill the field trench. The insulating material layer may include an insulating material, such as, for example, silicon oxide, silicon oxynitride, or silicon nitride.

Cell transistors may be formed in the substrate 3. Each of the cell transistors may include a gate structure 18 filling a gate trench, which may run across the active region 6a and extend into the isolation region 6s, and first and second source and drain regions 9a and 9b, which may be formed in the active region 6a on both sides of the gate structure 18. The gate structures 18 may be parallel to one another. The formation of the first source and drain regions 9a and the second source and drain regions 9b may include implanting impurity ions into the active region 6a using an ion implantation process.

The formation of the gate structure 18 may include forming the gate trench to run across the active region 6a and extend into the isolation region 6s, forming a gate dielectric material 12 on a portion of the active region 6a, which is exposed by the gate trench, forming a gate electrode 14 on the gate dielectric material 12 to partially fill the gate trench, and forming a gate capping pattern 16 on the gate electrode 14 to fill the remaining portion of the gate trench.

The gate electrode 14 may be a word line of a memory device, such as, for example, a DRAM. The gate electrode 14 may be formed at a lower level than a top surface of the active region 6a.

Figure 8:
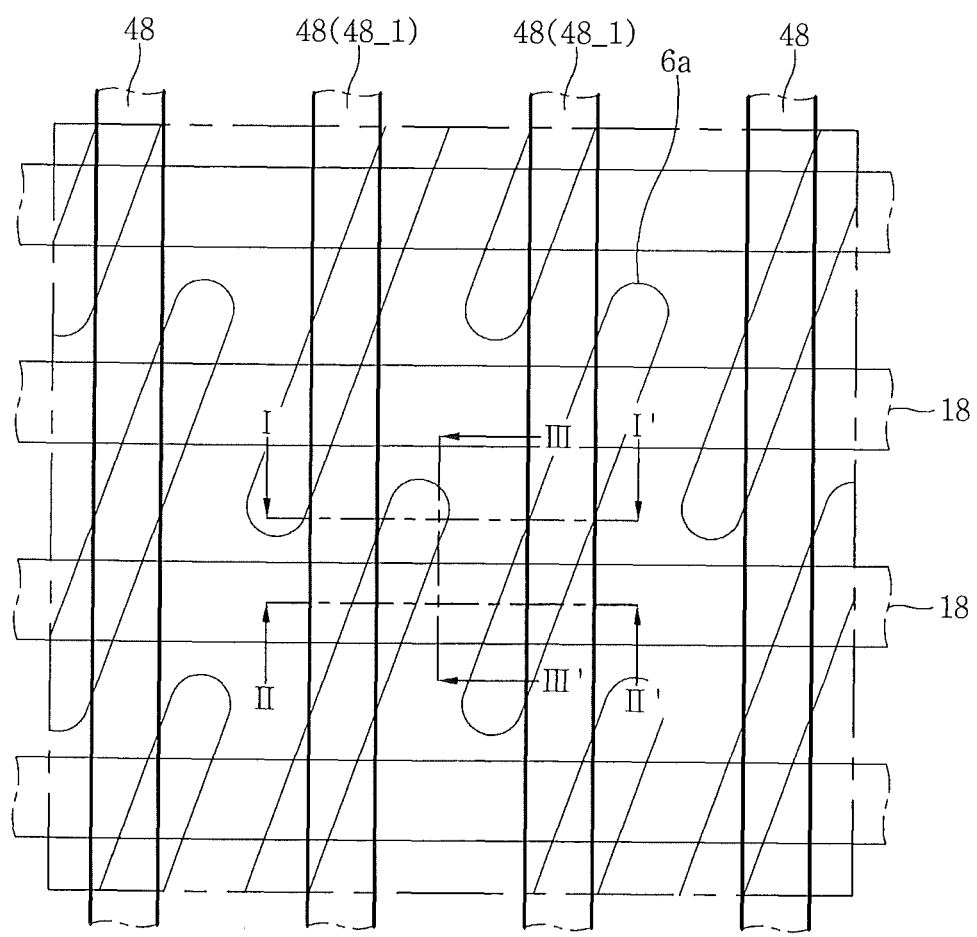

Referring to FIGS. 5 and 8, line structures 48 may be formed on the substrate 3 including the gate structures 18 (operation 5). In a memory device, such as, for example, a DRAM, the line structures 48 may be bit line structures. For example, in the memory device, such as, for example, the DRAM, the gate structures 18 may include word lines 14, while the line structures 48 may include bit lines 43.

An example of a method of forming the line structures 48 will now be discussed with reference to FIGS. 9A through 9E.

Figure 9A:
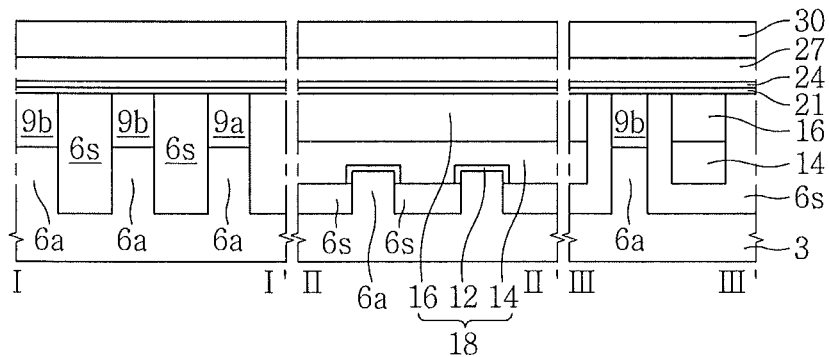

Referring to FIGS. 8 and 9A, a first buffer insulating layer 21 and a second buffer insulating layer 24 may be sequentially formed on a substrate including the gate structures 18. The second buffer insulating layer 24 may be formed of a material having an etch selectivity with respect to the first buffer insulating layer 21. For example, the first buffer insulating layer 21 may be formed of silicon oxide, and the second buffer insulating layer 24 may be formed of silicon nitride.

A lower line conductive layer 27 may be formed on the second buffer insulating layer 24. The lower line conductive layer 27 may be formed of polysilicon (poly-Si). A buffer mask layer 30 may be formed on the lower line conductive layer 27. The buffer mask layer 30 may be formed of silicon oxide.

Figure 9B:
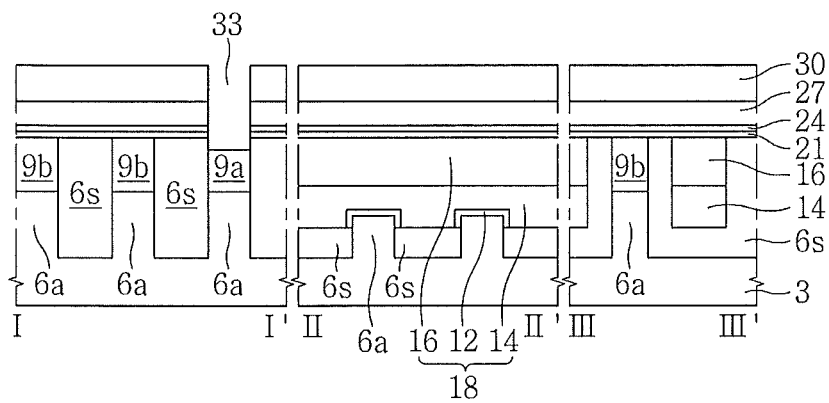

Referring to FIGS. 8 and 9B, a line contact hole 33 may be formed through the buffer mask layer 30, the lower line conductive layer 27, the second buffer insulating layer 24, and the first buffer insulating layer 21 to expose the first source and drain regions 9a.

Figure 9C:
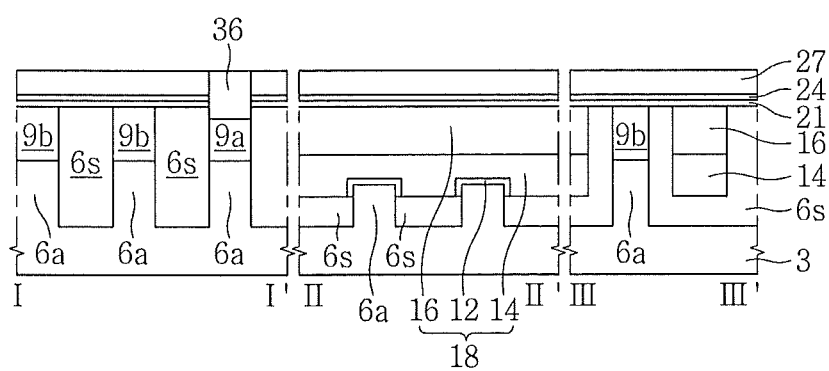

Referring to FIGS. 8 and 9C, a line contact pattern 36 may be formed within the line contact hole 33. The line contact pattern 36 may be electrically connected to the first source and drain regions 9a. The line contact pattern 36 may be formed of poly-Si.

The formation of the line contact pattern 36 may include forming a line contact layer on the substrate including the line contact hole 33 and planarizing the line contact layer until the lower line conductive layer 27 is exposed. During the planarization of the line contact layer, the buffer mask layer 30 may be removed. The planarization of the line contact layer may be performed using an etchback technique or a chemical mechanical polishing (CMP) process.

Figure 9D:
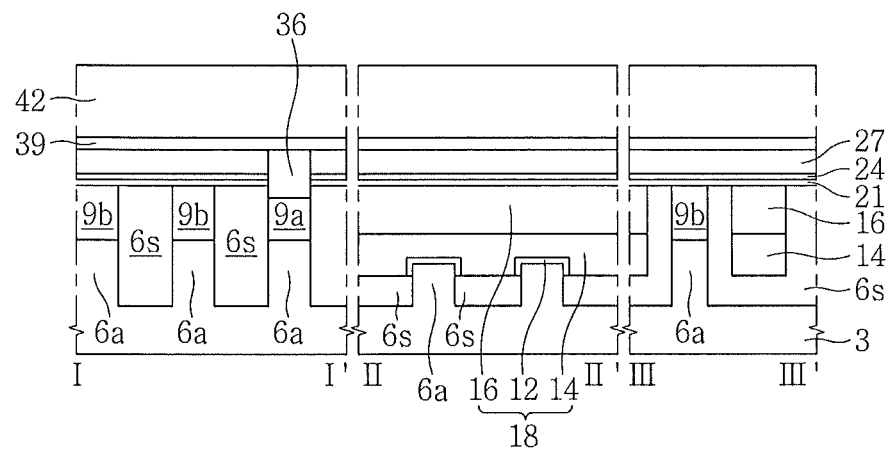

Referring to FIGS. 8 and 9D, a middle line conductive layer 39 and an upper line conductive layer 42 may be sequentially formed on the substrate including the lower line conductive layer 27 and the line contact pattern 36. The middle line conductive layer 39 may be formed to include at least one of a metal-semiconductor compound and a metal nitride. For example, the middle line conductive layer 39 may be formed to include at least one of tungsten silicide and titanium nitride. The upper line conductive layer 42 may include a metal layer. For example, the upper line conductive layer 42 may be formed of tungsten.

Figure 9E:
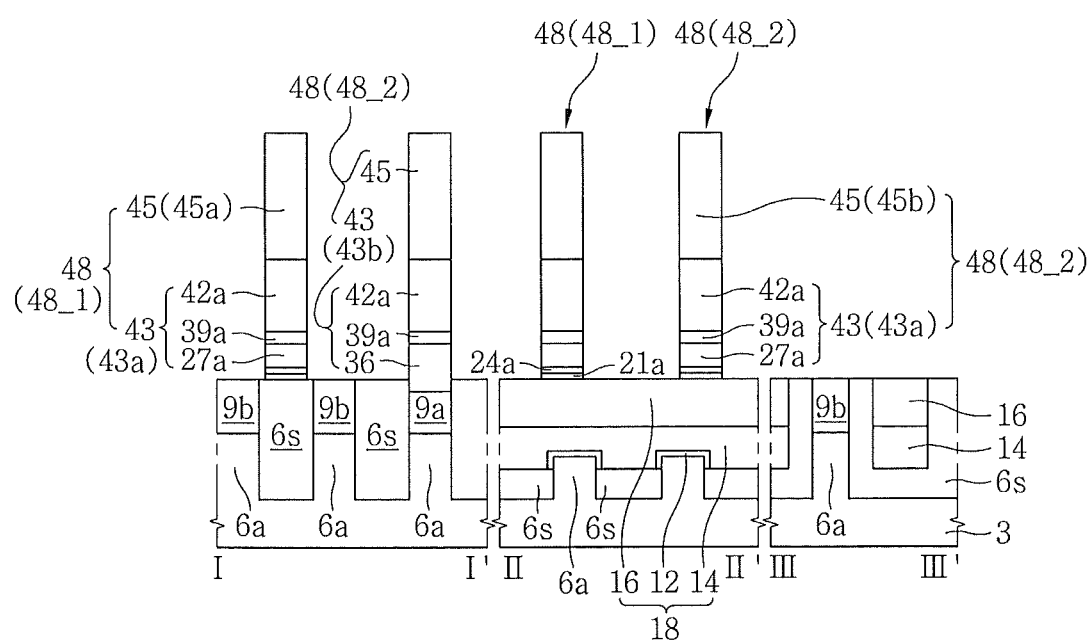

Referring to FIGS. 8 and 9E, the line structures 48 may be formed. The line structures 48 may include a first line structure 48_1 and a second line structure 48_2, which may be parallel to each other. Each of the line structures 48 may include a conductive line 43 and an insulating mask pattern 45 disposed on the conductive line 43. The conductive lines 43 may be formed of conductive materials, and the insulating mask pattern 45 may be formed of an insulating material, such as, for example, silicon nitride.

The line structures 48 may include first and second line structures 48_1 and 48_2. The first line structure 48_1 may include a first conductive line 43a and a first insulating mask pattern 45a disposed on the first conductive line 43a. The second line structure 48_2 may include a second conductive line 43b and a second insulating mask pattern 45b disposed on the second conductive line 43b.

In some embodiments, the line structures 48 may be bit line structures in a memory device, such as, for example, a DRAM. When the line structures 48 are bit line structures of a memory device, such as, for example, a DRAM, the conductive lines 43 may be bit lines.

The formation of the line structures 48 may include forming the insulating mask pattern 45 on the upper line conductive layer 42 and sequentially etching the upper line conductive layer 42, the middle line conductive layer 39, and the lower line conductive layer 27 under the insulating mask pattern 45.

The upper line conductive layer 42 may be etched to form an upper line pattern 42a, and the middle line conductive layer 39 may be etched to form a middle line pattern 39a. The lower line conductive layer 27 may be etched to form a lower line pattern 27a.

After etching the lower line conductive layer 27, the second buffer insulating layer 24 may be etched to form a second buffer insulating pattern 24a, and the first buffer insulating layer 21 may be etched to form a first buffer insulating pattern 21a. The first and second buffer insulating patterns 21a and 24a may be formed under the lower line pattern 27a.

Each of the conductive lines 43 may include a portion disposed on the first and second buffer insulating patterns 21a and 24a and a portion, which may overlap the first source and drain regions 9a and be electrically connected to the first source and drain regions 9a.

A portion of each of the conductive lines 43, which may not overlap the active region 6a, may include the lower line pattern 27a, the middle line pattern 39a, and the upper line pattern 42a, which are stacked sequentially.

A portion of each of the conductive lines 43, which may overlap the first source and drain regions 9a in the active region 6a, may include the line contact pattern 36, the middle line pattern 39a, and the upper line pattern 42a, which are stacked sequentially. The line contact pattern 36 may be in direct contact with and electrically connected to the first source and drain regions 9a.

Figure 10:
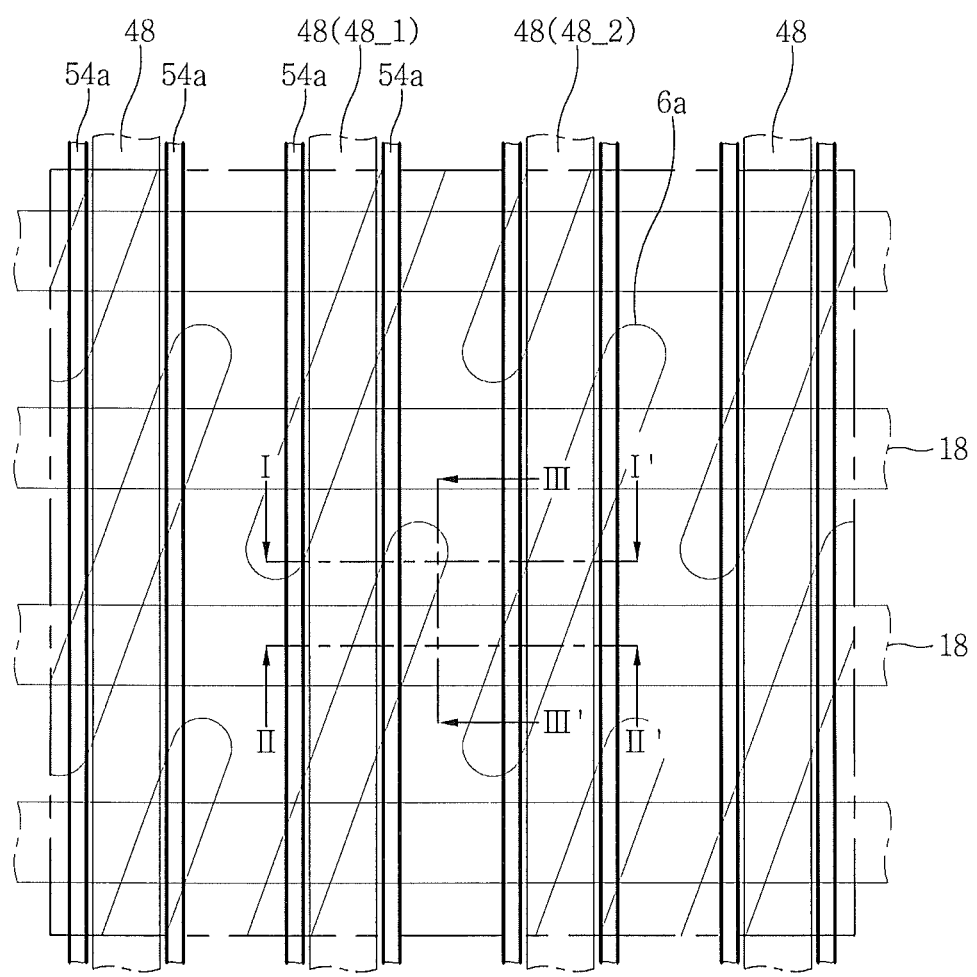
Figure 11A:
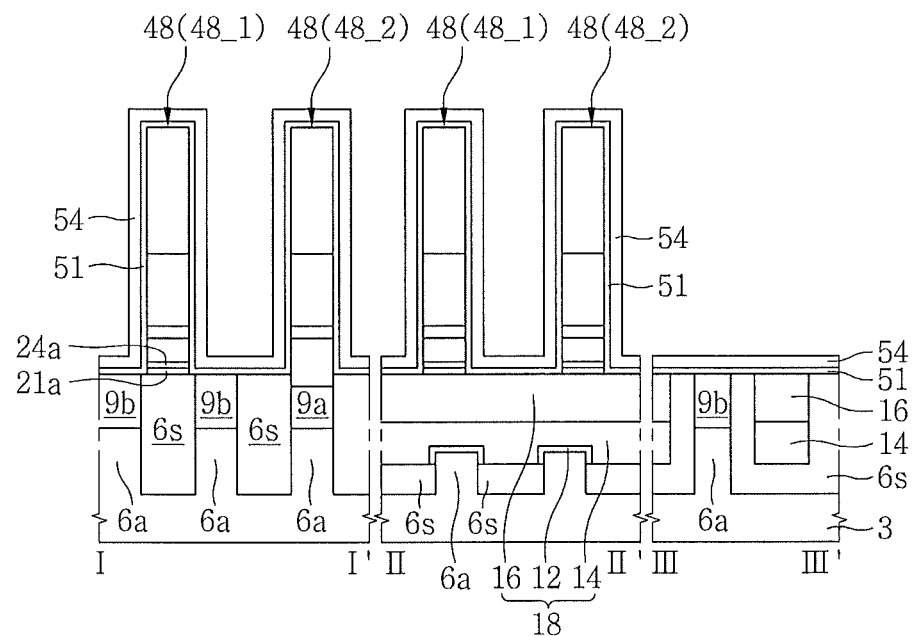
Figure 11B:
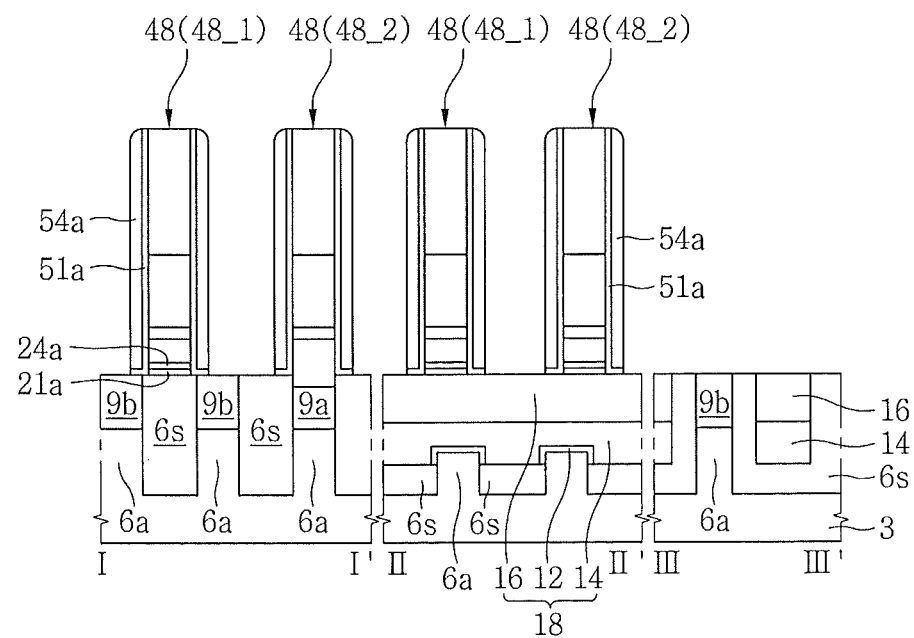

Referring to FIGS. 5 and 10, sacrificial patterns 54a may be formed on side surfaces of the line structures 48 (operation 10).

An example of a method of forming the sacrificial patterns 54a will now be discussed with reference to FIGS. 11A and 11B.

Referring to FIGS. 10 and 11A, a spacer layer 51 may be formed on the substrate 3 including the line structures 48. A sacrificial layer 54 may be formed on the substrate 3 including the spacer layer 51.

The sacrificial layer 54 may be formed of a material having an etch selectivity with respect to the spacer layer 51. For example, the spacer layer 51 may be formed of silicon nitride, and the sacrificial layer 54 may be formed of silicon oxide. The sacrificial layer 54 may be formed of a material having an etch selectivity with respect to the insulating mask patterns 45 and the spacer layer 51. For example, the insulating mask patterns 45 and the spacer layer 51 may be formed of silicon nitride, while the sacrificial layer 54 may be formed of silicon oxide.

Referring to FIGS. 10 and 11B, the sacrificial layer 54 may be anisotropically etched to form sacrificial patterns 54a. The sacrificial patterns 54a may be formed on side surfaces of the line structures 48. Thereafter, the spacer layer 51 may be etched to form spacers 51a. The spacers 51a may include portions interposed between the sacrificial patterns 54a and the line structures 48 and portions formed under bottom surfaces of the sacrificial patterns 54a, respectively.

Figure 12:
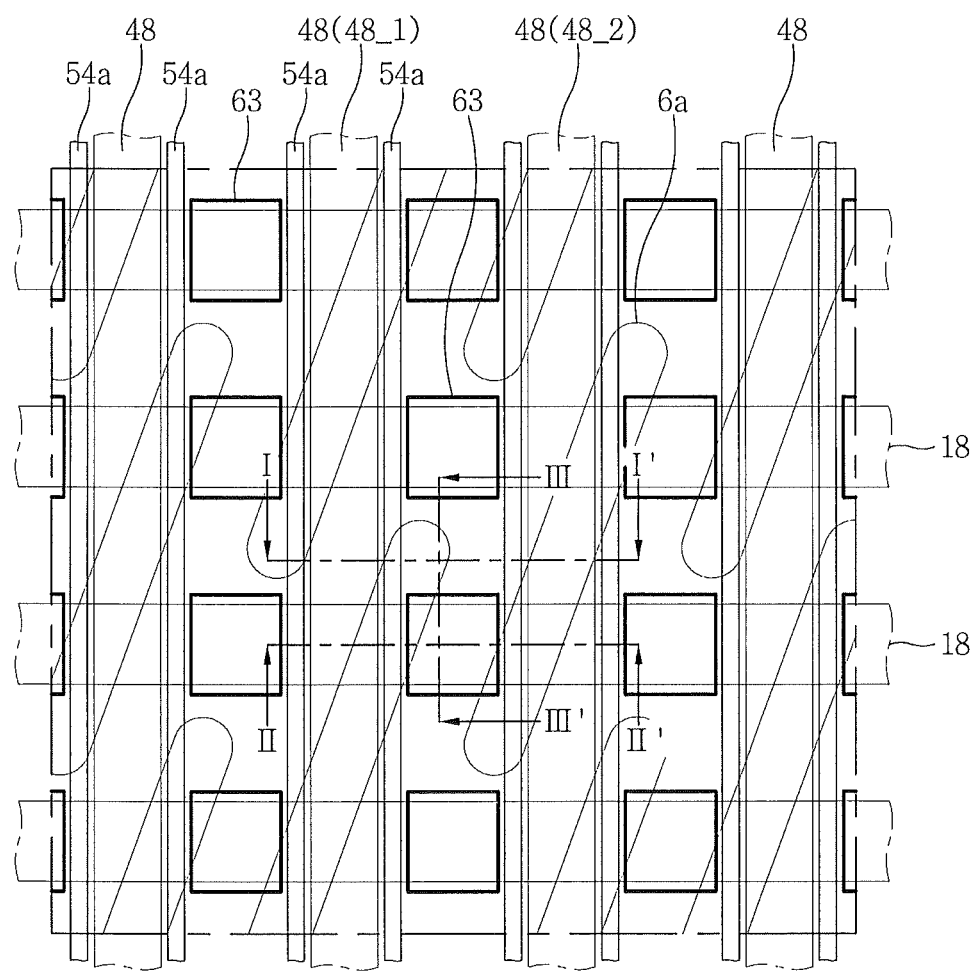

Referring to FIGS. 8 and 12, insulating isolation patterns 63 may be formed between the line structures 48 (operation 15).

An example of a method of forming the insulating isolation patterns 63 will now be discussed with reference to FIGS. 13A through 13D.

Figure 13A:
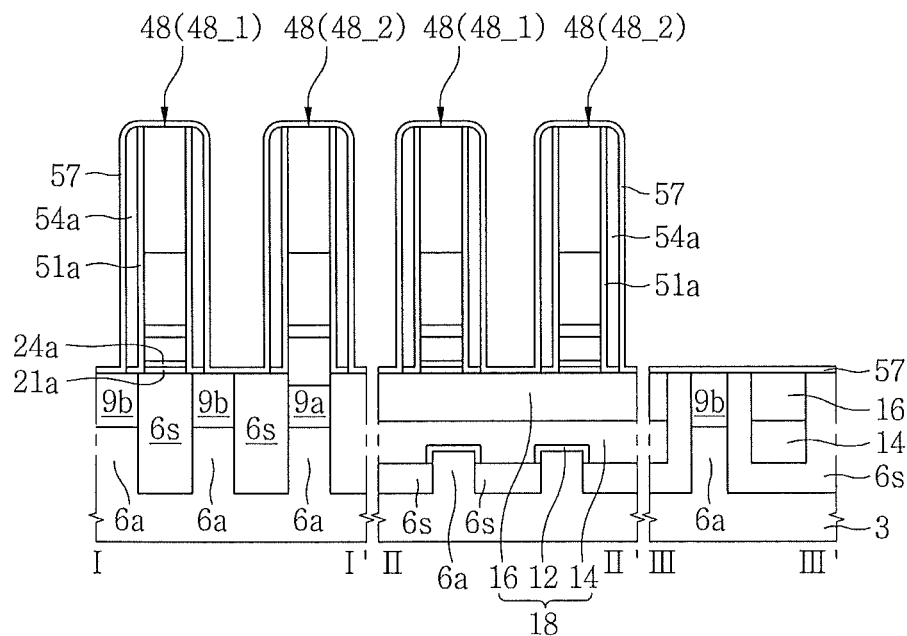

Referring to FIGS. 12 and 13A, a protection layer 57 may be formed on the substrate including the sacrificial patterns 54a. The protection layer 57 may be formed of an insulating material. The protection layer 57 may be formed of silicon nitride.

Figure 13B:
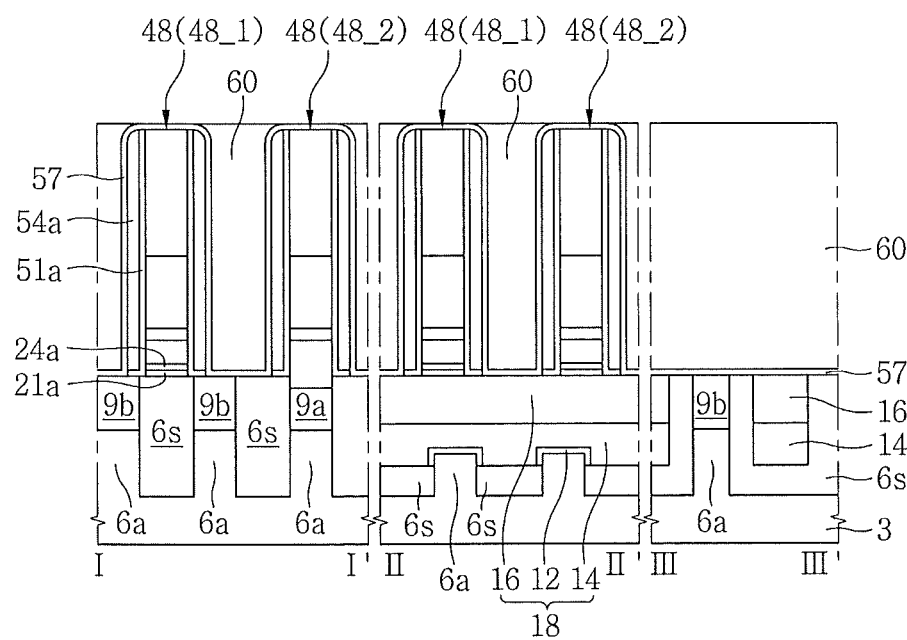

Referring to FIGS. 12 and 13B, a mold layer 60 may be formed. The mold layer 60 may be formed on the protection layer 57 interposed between the line structures 48. The formation of the mold layer 60 may include forming a mold material layer on the substrate including the protection layer 57 and planarizing the mold material layer until the protection layer 57 dispose on top surfaces of the line structures 48 is exposed. The mold layer 60 may be formed between the line structures 48. The mold layer 60 may have a line shape from a plane view. The mold layer 60 may be formed of a material having an etch selectivity with respect to the protection layer 57. For example, the protection layer 57 may be formed of silicon nitride, while the mold layer 60 may be formed of silicon oxide.

Figure 13C:
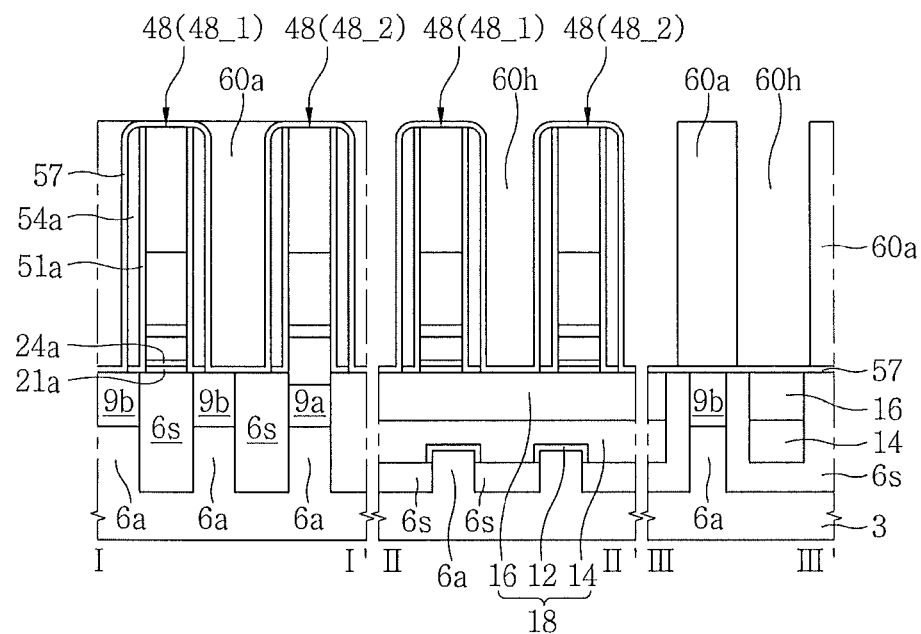

Referring to FIGS. 12 and 13C, the mold layer 60 may be patterned to form mold patterns 60a. The mold patterns 60a may be formed between the line structures 48. During the formation of the mold patterns 60a, isolation holes 60h may be formed between the mold patterns 60a. The isolation holes 60h may be formed between the line structures 48 and between the mold patterns 60a. The isolation holes 60h may expose the protection layer 57 disposed between the line structures 48 and between the mold patterns 60a.

Figure 13D:
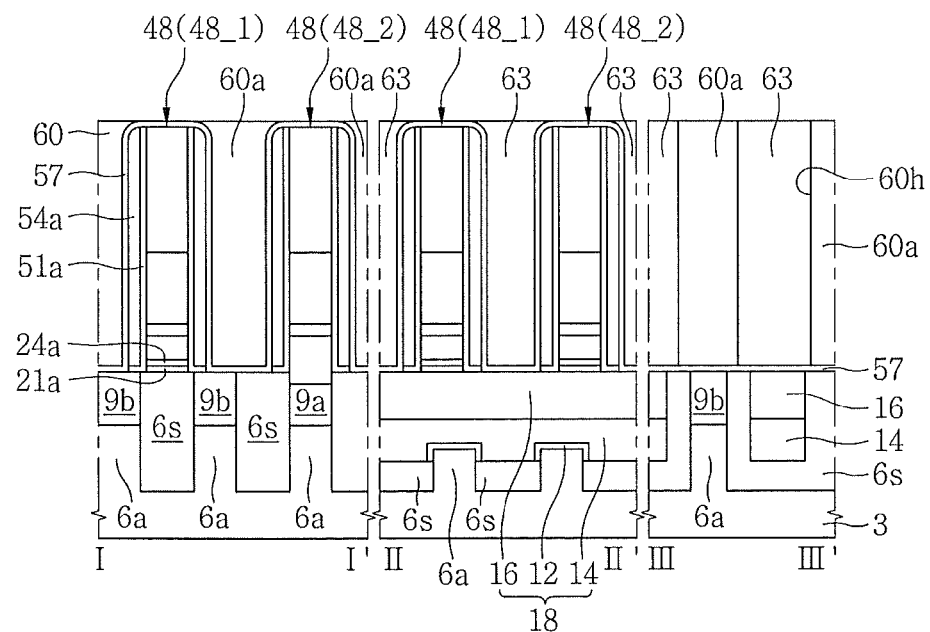

Referring to FIGS. 12 and 13D, insulating isolation patterns 63 may be formed to fill the isolation holes 60h. The insulating isolation patterns 63 may be formed of a material having an etch selectivity with respect to the mold patterns 60a. For example, the mold patterns 60a may be formed of silicon oxide, while the insulating isolation patterns 63 may be formed of silicon nitride. The insulating isolation patterns 63 may be formed of silicon nitride. The insulating isolation patterns 63 may be formed of a material having an etch selectivity with respect to the sacrificial patterns 54a. For example, the sacrificial patterns 54a may be formed of silicon oxide, and the insulating isolation patterns 63 may be formed of silicon nitride.

Figure 14:
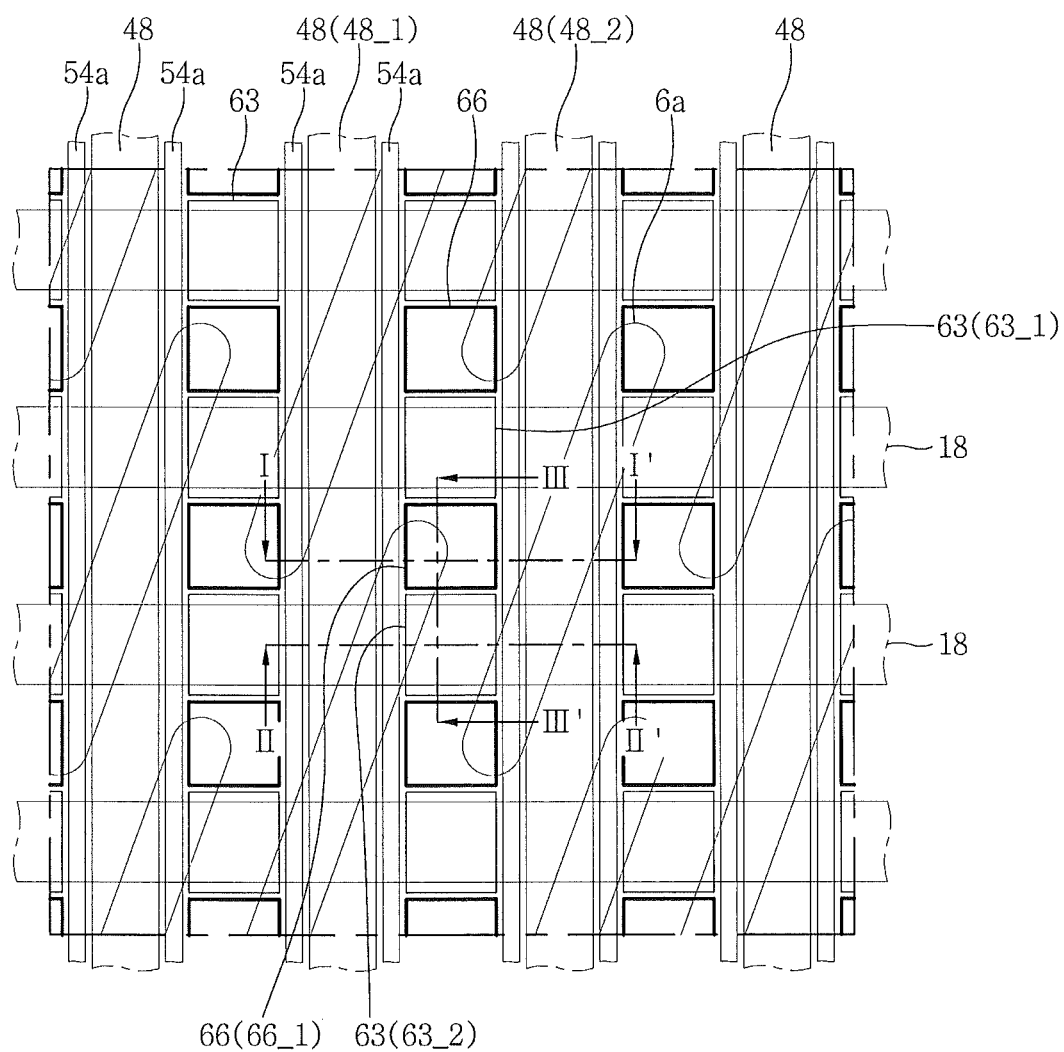
Figure 15A:
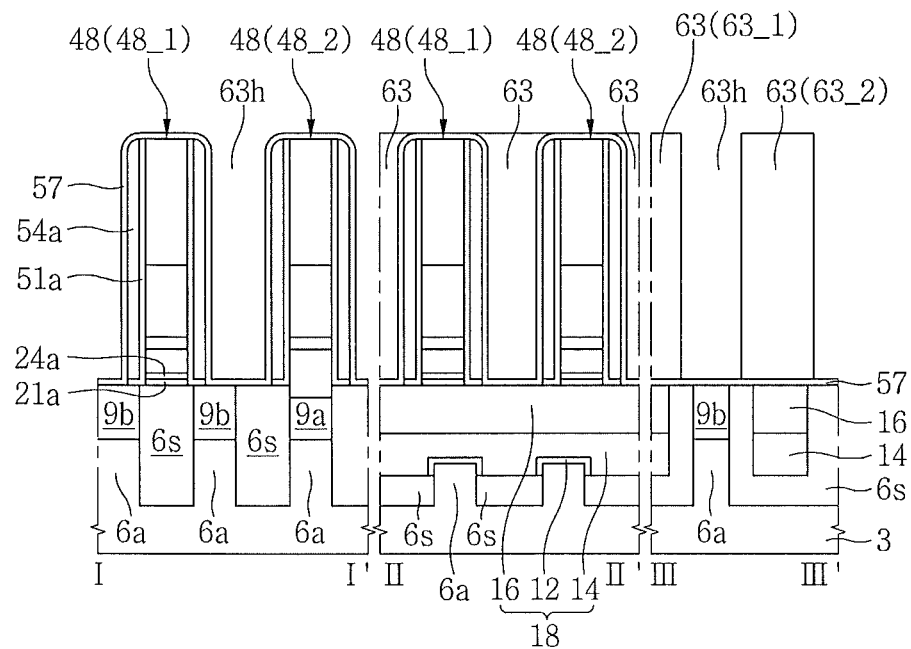
Figure 15B:
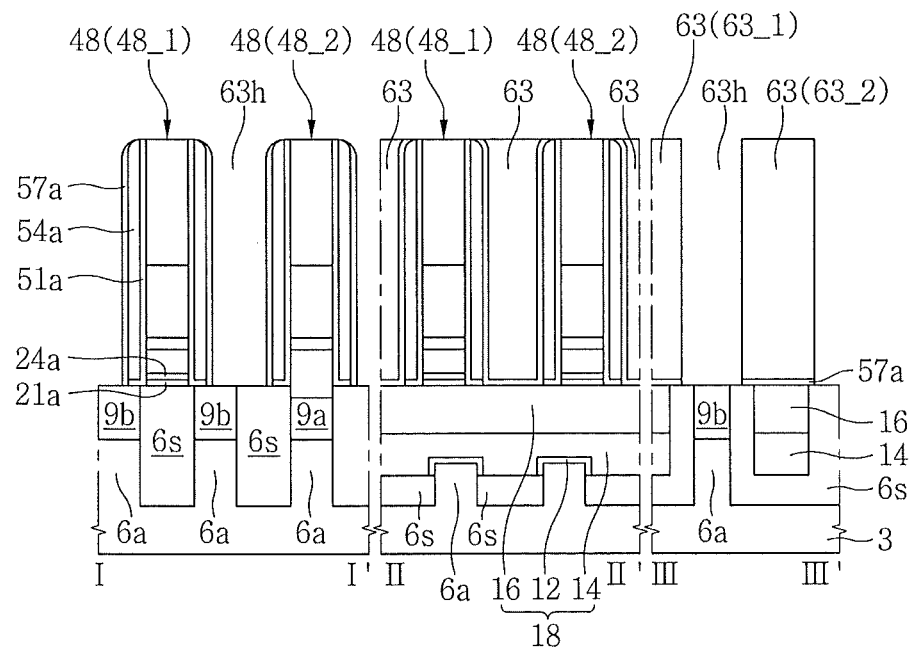
Figure 15C:
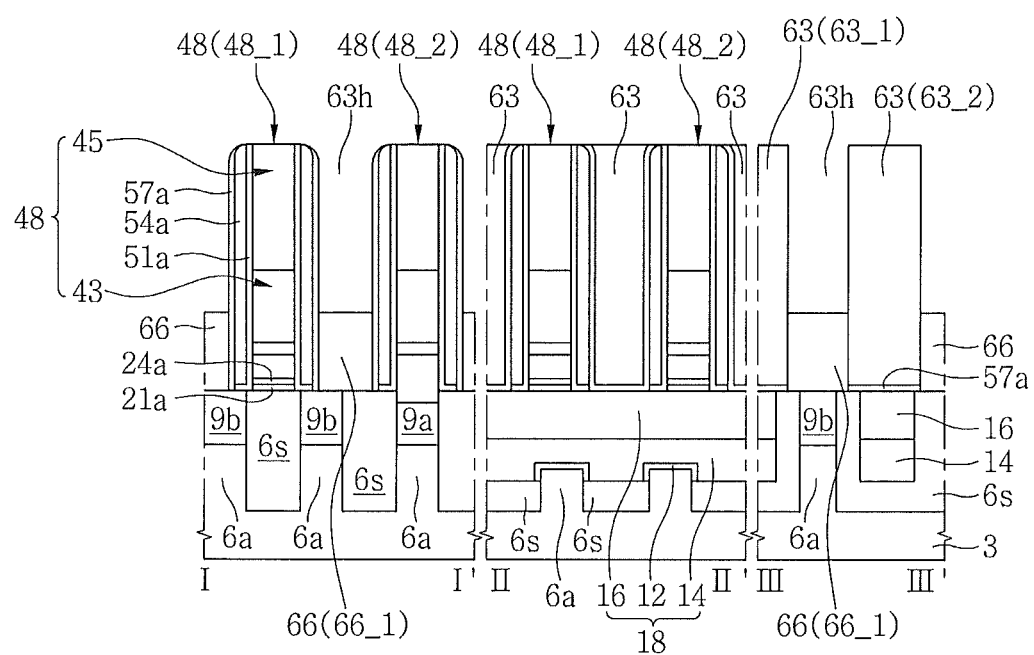

Referring to FIGS. 5 and 14, lower conductive patterns 66 may be formed between the line structures 48 and between the insulating isolation patterns 63 (operation 20). Each of the lower conductive patterns 66 may be disposed between the line structures 48 and between the insulating isolation patterns 63.

The insulating isolation patterns 63 may include first and second insulating isolation patterns 63_1 and 63_2 interposed between the first and second line structures 48_1 and 48_2 and disposed opposite each other. Among lower conductive patterns 66, a lower conductive pattern, which is interposed between the first and second line structures 48_1 and 48_2 and between the first and second insulating isolation patterns 63_1 and 63_2, may be referred to as a first lower conductive pattern 66_1.

An example of a method of forming the lower conductive patterns 66 will now be discussed with reference to FIGS. 15A through 15C.

Referring to FIGS. 14 and 15A, the mold patterns 60a may be selectively removed. The mold patterns 60a may be removed using an etching process. During the removal of the mold patterns 60a, storage contact holes 63h may be formed. The storage contact holes 63h may be formed between the insulating isolation patterns 63 and between the line structures 48.

Referring to FIGS. 14 and 15B, the protection layer 57 may be etched to expose contact regions disposed under the storage contact holes 63h. In some embodiments, the contact regions disposed under the storage contact holes 63h may be the second source and drain regions 9b. The protection layer 57 may be etched to form a protection pattern 57a. The protection layer 57 may be etched and remain on outer side surfaces of the sacrificial patterns 54a. The outer side surfaces of the sacrificial patterns 54a may be side surfaces disposed adjacent to the storage contact holes 63h.

Referring to FIGS. 14 and 15C, lower conductive patterns 66 may be formed to partially fill the storage contact holes 63h. The lower conductive patterns 66 may be formed at a lower level than top surfaces of the line structures 48. The lower conductive patterns 66 may include at least one of poly-Si, a metal silicide, a metal nitride, and a metal. For example, the lower conductive patterns 66 may be formed of poly-Si. The formation of the lower conductive patterns 66 may include forming a lower conductive layer on a substrate including the storage contact holes 63h and etching the lower conductive layer.

In some embodiments, top surfaces of the lower conductive patterns 66 may be disposed at a lower level than top surfaces of the conductive lines 43. The lower conductive patterns 66 may include the first lower conductive patterns 66_1 formed between the first and second line structures 48_1 and 48_2 and between the first and second insulating isolation patterns 63_1 and 63_2.

Figure 16:
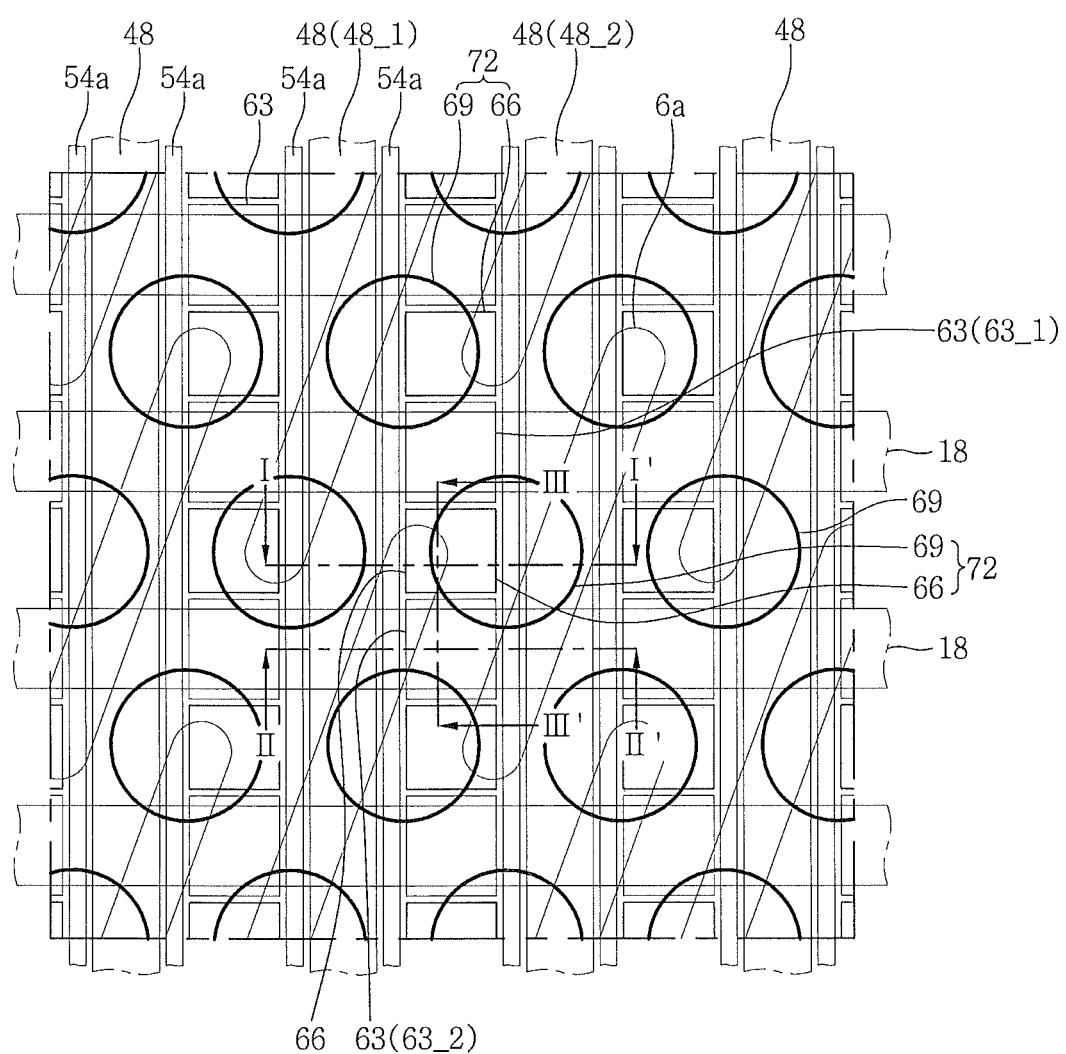
Figure 17A:
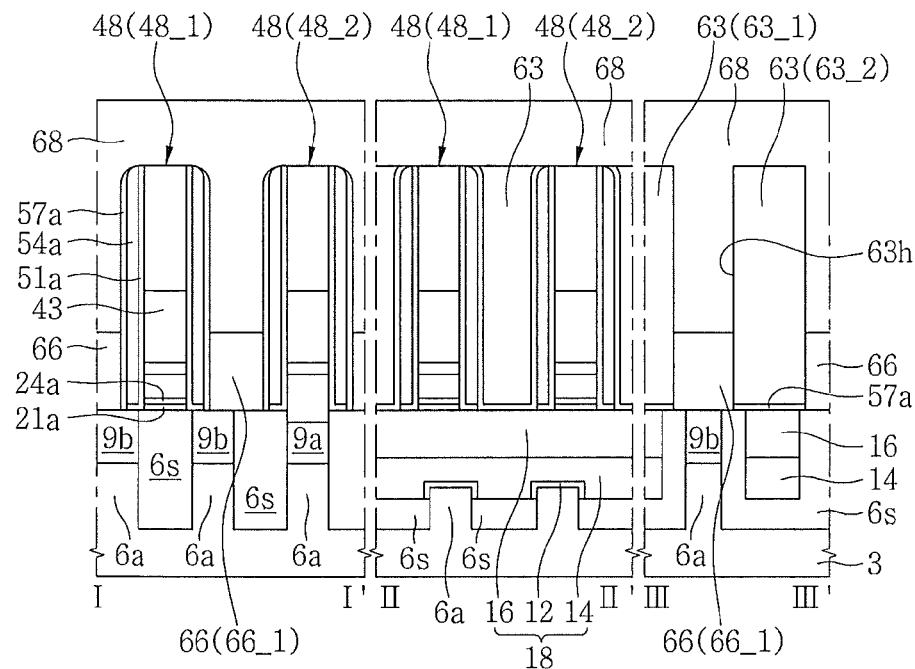
Figure 17B:
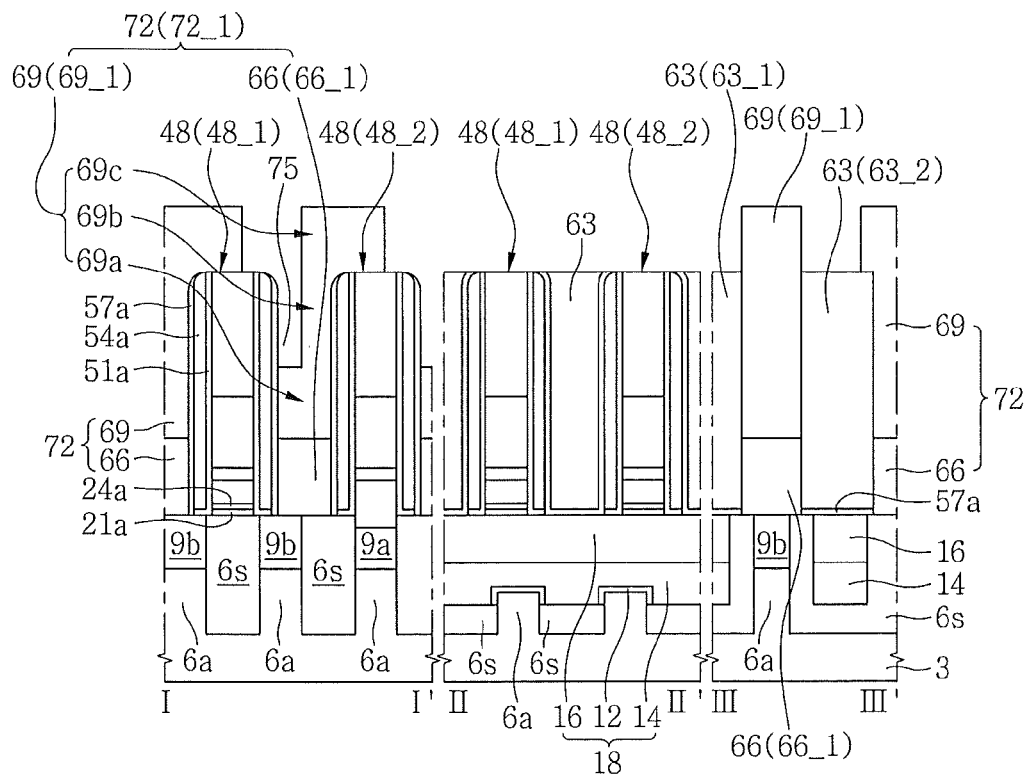

Referring to FIGS. 5 and 16, an upper conductive layer 68 may be formed on the substrate including the lower conductive patterns 66 (operation 25). The upper conductive layer 68 may be patterned to form upper conductive patterns 69 (operation 30).

An example of a method of forming the upper conductive patterns 69 will be discussed with reference to FIGS. 17A and 17B.

Referring to FIGS. 16 and 17A, an upper conductive layer 68 may be formed on the substrate including the lower conductive patterns 66. The upper conductive layer 68 may be formed to have a top surface disposed at a higher level than the top surfaces of the line structures 48.

The lower conductive patterns 66 may be formed to partially fill the storage contact holes 63h, and the upper conductive layer 68 may be formed to fill the remaining portions of the storage contact holes 63h and cover top surfaces of the line structures 48. The upper conductive layer 68 may be formed of a conductive material having a lower resistivity than the lower conductive patterns 66. For example, the lower conductive patterns 66 may be formed of poly-Si, while the upper conductive layer 68 may be formed to include a metal material, such as, for example, tungsten. In some embodiments, the upper conductive layer 68 may be formed to include a metal silicide, a metal nitride, and a metal.

Referring to FIGS. 16 and 17B, the upper conductive layer 68 may be patterned to form upper conductive patterns 69. The upper conductive patterns 69 may be disposed on the lower conductive patterns 66. The upper conductive patterns 69 may be electrically connected to the lower conductive patterns 66. Each of the upper conductive patterns 69 may include a lower portion 69a, a middle portion 69b disposed on the lower portion 69a, and an upper portion 69c disposed on the middle portion 69b. Lower portions 69a of the upper conductive patterns 69 may be in contact with the lower conductive patterns 66 and have the same width as the storage contact holes 63h. The lower portions 69a of the upper conductive patterns 69 may have the same width as the lower conductive patterns 66.

Middle portions 69b of the upper conductive patterns 69 may have a smaller width than the storage contact holes 63h. The middle portions 69b of the upper conductive patterns 69 may have a smaller width than the lower portions 69a thereof. Upper portions 69c of the upper conductive patterns 69 may be portions disposed at a higher level than the line structures 48. The upper portions 69c of the upper conductive patterns 69 may have a greater width than the middle portions 69b thereof. The lower conductive patterns 66 and the upper conductive patterns 69 may constitute conductive structures 72.

One of the conductive structures 72 may be the first conductive structure 72_1 discussed with reference to FIGS. 2A, 2B, and 2C. Also, the first conductive structure 72_1 may include the first lower conductive pattern 66_1 and the first upper conductive pattern 69_1 disposed on the first lower conductive pattern 66_1 as discussed with reference to FIGS. 2A, 2B, and 2C.

The first upper conductive pattern 69_1 may include the lower portion 69a, the middle portion 69b disposed on the lower portion 69a, and the upper portion 69c disposed on the middle portion 69b. The lower portion 69a of the first upper conductive pattern 69_1 may be in contact with the first lower conductive pattern 66_1 and have the same width as the first storage contact hole 63h_1. The lower portion 69a of the first upper conductive pattern 69_1 may have the same width as the first lower conductive pattern 66_1. The middle portion 69b of the first upper conductive pattern 69_1 may have a smaller width than the first storage contact hole 63h_1. The middle portion 69b of the first upper conductive pattern 69_1 may have a smaller width than the lower portion 69a thereof. The middle portion 69b of the first upper conductive pattern 69_1 may be closer to the second line structure 48_2 than to the first line structure 48_1. The upper portion 69c of the first upper conductive pattern 69_1 may be a portion disposed at a higher level than the first and second line structures 48_1 and 48_2. The upper portion 69c of the first upper conductive pattern 69_1 may have a greater width than the middle portion 69b of the first upper conductive pattern 69_1. The upper portion 69c of the first upper conductive pattern 69_1 may be spaced apart from the first line structure 48_1 and cover a portion of a top surface of the second line structure 48_2.

A recess portion 75 may be formed between the middle portion 69b of the first upper conductive pattern 69_1 and the line structure 48_1. The recess portion 75 may expose a portion of a top surface of the lower portion 69a of the first upper conductive pattern 69_1. A bottom surface of the recess portion 75 may be disposed at a higher level than a bottom surface of the insulating mask pattern 45 and disposed at a lower level than a top surface of the insulating mask pattern 45.

Figure 18:
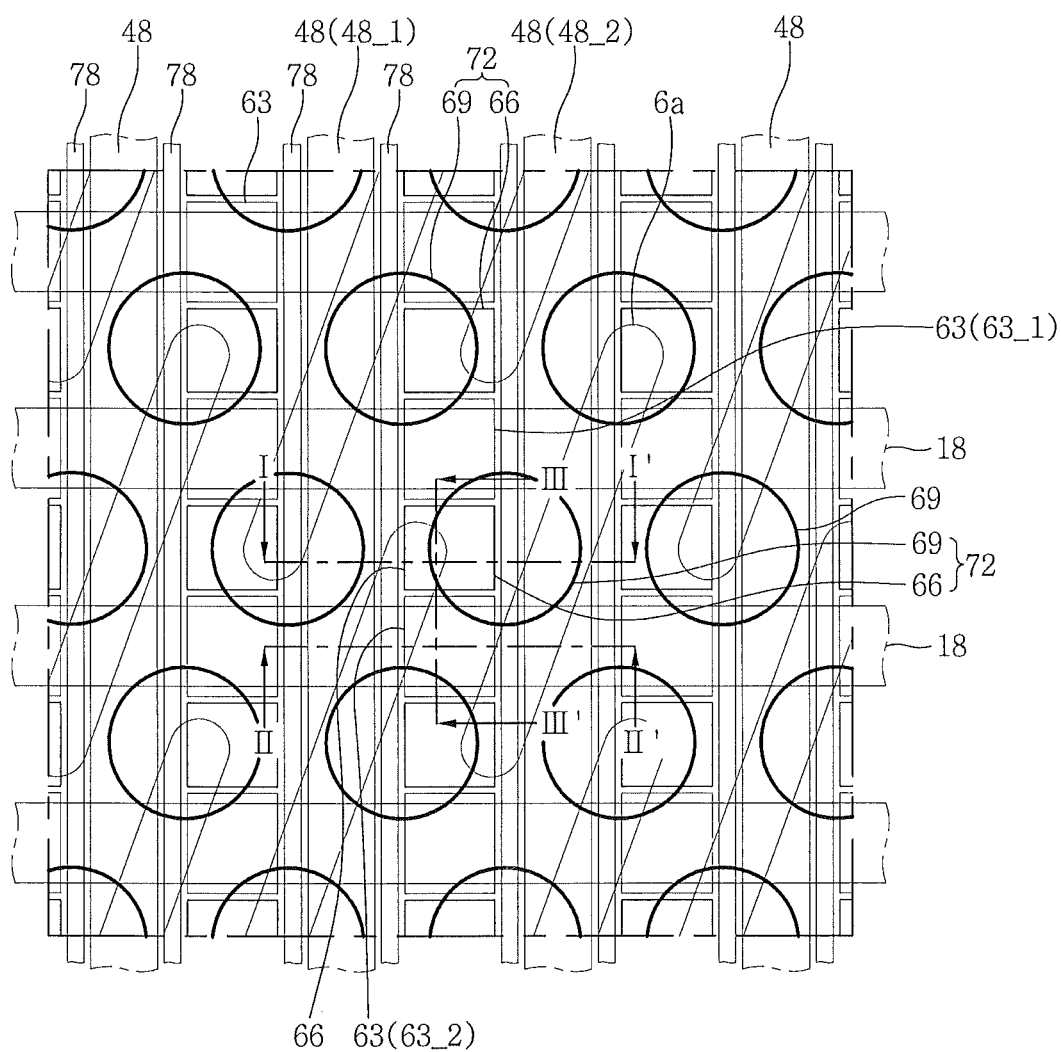
Figure 19A:
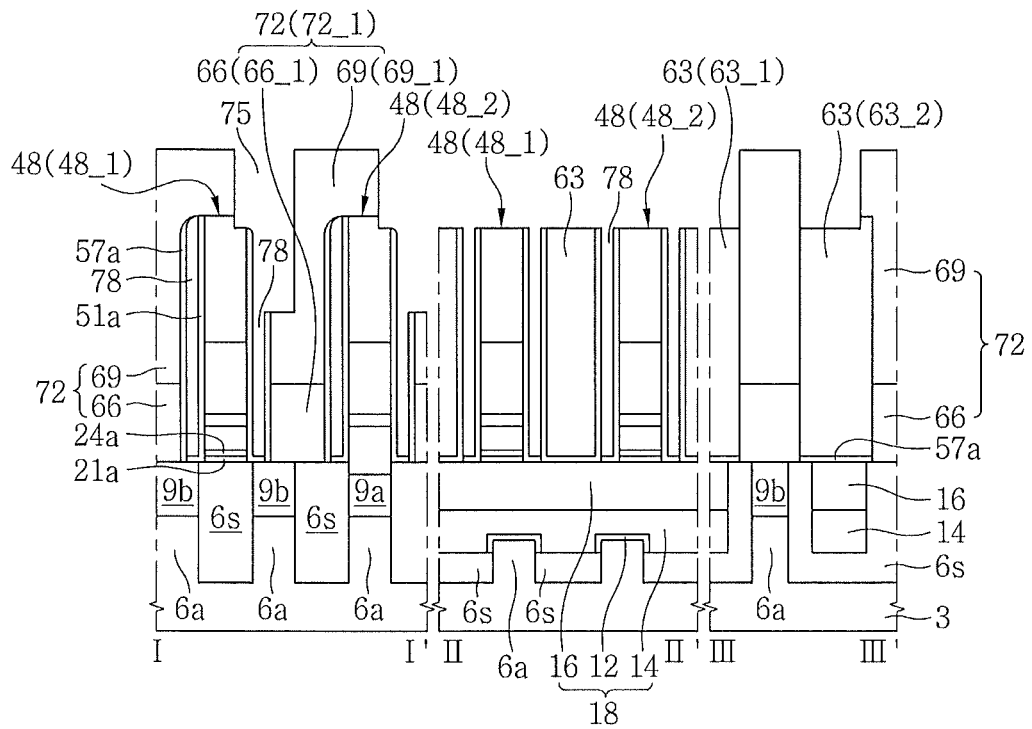
Figure 19B:
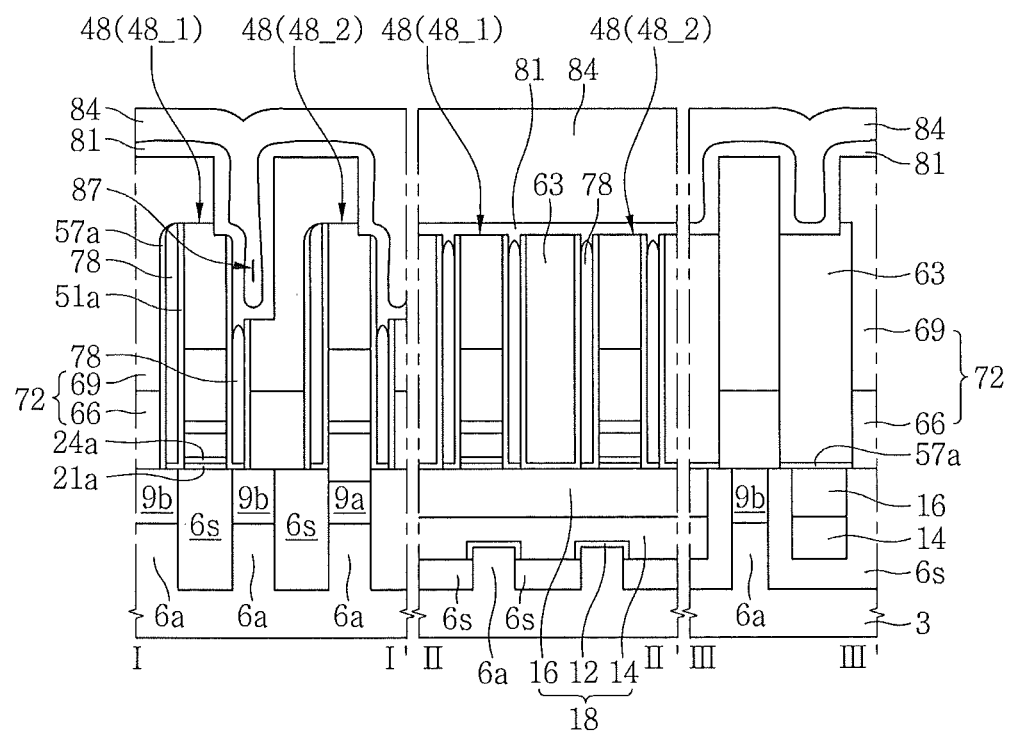
Figure 19C:
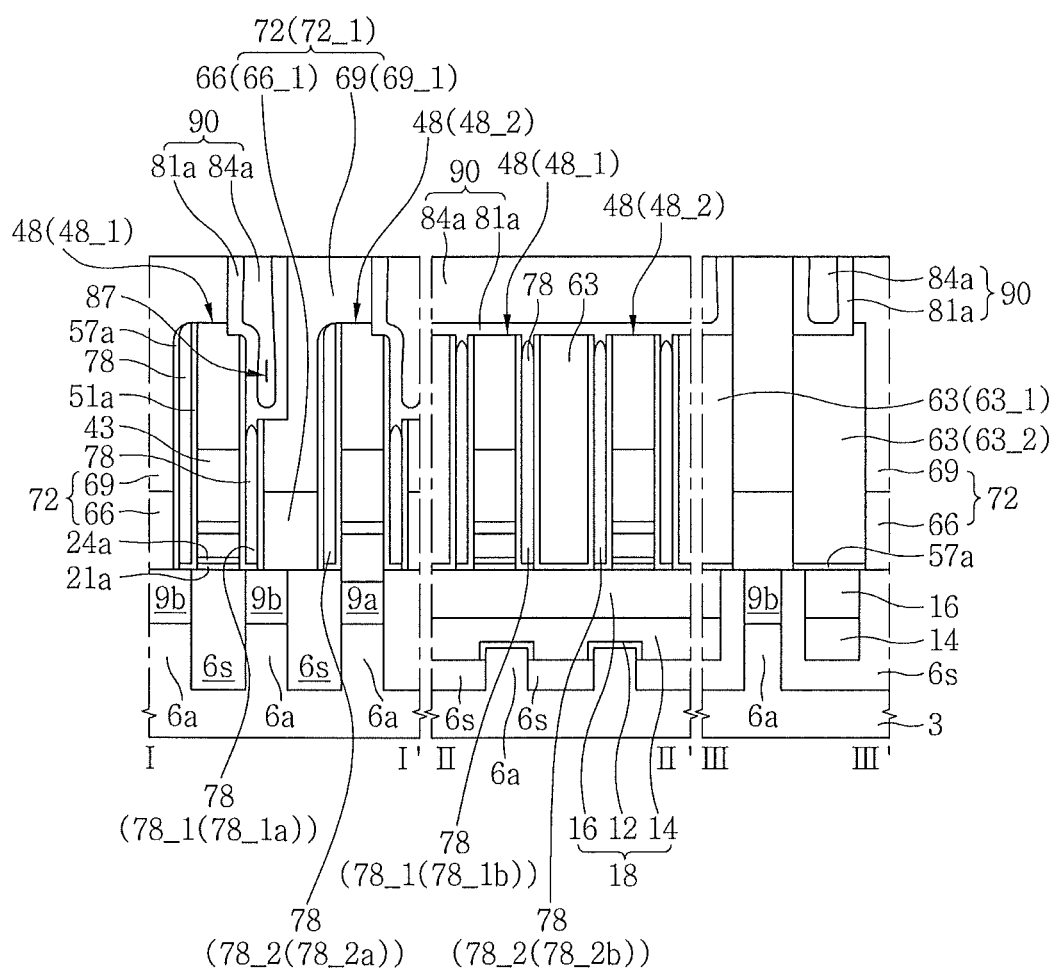

Referring to FIGS. 5 and 18, the sacrificial patterns 54a may be removed to form empty spaces 78 (operation 35). The empty spaces 78 may be spaces that are not filled with a solid material. For example, the empty spaces 78 may be spaces filled with gas, such as, for example, the air. A first insulating capping layer 81 may be formed on the substrate including the empty spaces 78 (operation 40). A second insulating capping layer 84 may be formed on the first insulating capping layer 81 (operation 45). The first and second insulating capping patterns 81a and 81b may be formed (operation 50).

An example of a method of forming the empty spaces 78, the first and second insulating capping layers 81 and 84, and the first and second insulating capping patterns 81a and 84a will now be discussed with reference to FIGS. 19A through 19C.

Referring to FIGS. 18 and 19A, the sacrificial patterns 54a may be removed to form empty spaces 78. The sacrificial patterns 54a may be removed using a wet etching process. The formation of the empty spaces 78 may include etching the protection patterns 57a exposed by the recess portions 75 to increase exposed areas of the sacrificial patterns 54a, and removing the sacrificial patterns 54a using an etching process. The sacrificial patterns 54a may be removed using an isotropic etching process.

The sacrificial patterns 54a may be formed of a material having an etch selectivity with respect to the protection patterns 57a, the spacers 51a, and the insulating mask patterns 45. For example, the sacrificial patterns 54a may be formed of silicon oxide, and the protection patterns 57a, the spacers 51a, and the insulating mask patterns 45 may be formed of silicon nitride. Accordingly, since the sacrificial patterns 54a may be formed of a different material from the protection patterns 57a, the spacers 51a, and the insulating mask patterns 45, the sacrificial patterns 54a may be selectively removed.

Referring to FIGS. 18 and 19B, a first insulating capping layer 81 may be formed on the substrate including the empty spaces 78. a second insulating capping layer 84 may be formed on the first insulating capping layer 81.

As compared with the second insulating capping layer 84, the first insulating capping layer 81 may be formed using a deposition layer capable of reducing a reduction in the volume of each of the empty spaces 78. For example, the first insulating capping layer 81 may be formed using a layer having such deposition characteristics as to cover upper portions of the empty spaces 78 without substantially reducing the volume of each of the empty spaces 78. In this case, the first insulating capping layer 81 may be deposited to have a non-uniform thickness.

To reduce failures originated from the first insulating capping layer 81 that is deposited to have the non-uniform thickness, the second insulating capping layer 84 may be formed using a layer having better gap-fill characteristics than the first insulating capping layer 81, a layer having a more uniform thickness than the first insulating capping layer 81, a layer having a higher density than the first insulating capping layer 81, or a layer having a different etch rate from the first insulating capping layer 81. For example, the second insulating capping layer 84 may fill the recessed portions (refer to 75 in FIG. 19A) between the line structures 48 and the conductive structures 72 and reduce permeation of subsequent process gases or subsequent process materials used in subsequent semiconductor processes into the empty spaces 78 and failures or degrading reliability.

The first insulating capping layer 81 may be formed using a deposition layer having a conformality lower than that of the second insulating capping layer 84. The first insulating capping layer 81 may be formed of a first material having a conformality lower than that of the second insulating capping layer 84, and the second insulating capping layer 84 may be formed of a second material having a conformality higher than that of the first insulating capping layer 81. For example, the first insulating capping layer 81 may be formed of silicon nitride using a plasma enhanced chemical vapor deposition (PECVD) process, while the second insulating capping layer 84 may be formed of silicon nitride using a low-pressure CVD (LPCVD) process or an atomic layer deposition (ALD) process.

Meanwhile, on side surfaces of the conductive structures 72 and side surfaces of the line structures 48, an upper portion of the first insulating capping layer 81 may be formed to a relatively great thickness, while a lower portion thereof may be formed to a relatively small thickness. Accordingly, an opening including an upper portion narrower than a lower portion may be formed due to the first insulating capping layer 81 in the recess portions (refer to 75 in FIG. 19A) between the conductive structures 72 and the line structures 48. A void or core 87 may be formed in the second insulating capping layer 84 filling the opening. The void or core 87 may be interposed between the line structures 48. The void or core 87 may be formed at a lower level than top surfaces of the line structures 48.

Meanwhile, the first and second insulating capping layers 81 and 84 may be formed using the same CVD apparatus. The first insulating capping layer 81 may be formed of silicon nitride (SiN), and the second insulating capping layer 84 may be formed of SiCN having a higher conformality than silicon nitride. For example, the second insulating capping layer 84 may be formed of a SiCN material, which is obtained by adding carbon (C) into silicon nitride, using trimethyl silane (TSA) as a carbon source. The SiCN material may be formed using a thin-film process with conditions under which a Si source and a N source are provided in a ratio of about 1:5 or less and C is contained at a content of about 50% or less. The second insulating capping layer 84 may have a higher conformality than the first insulating capping layer 81 and have an etch selectivity with respect to the first insulating capping layer 81.

Meanwhile, the first insulating capping layer 81 may be formed of a material having a lower density than the second insulating capping layer 84. For example, the first insulating capping layer 81 may be formed of silicon nitride using a PECVD process, and the second insulating capping layer 84 may be formed of silicon nitride using a high-density plasma (HDP) CVD process. The second insulating capping layer 84 formed of a material obtained using an HDP CVD process may have better gap-fill characteristics than the first insulating capping layer 81 formed of a material obtained using a PECVD process.

Referring to FIGS. 18 and 19C, the first and second insulating capping layers 81 and 84 may be planarized to form the first and second insulating capping patterns 81a and 84a. The first insulating capping pattern 81a may be formed to surround side surfaces and a bottom surface of the second insulating capping pattern 84a and may have a non-uniform thickness. During the formation of the first and second insulating capping patterns 81a and 84a, top surfaces of the conductive structures 72 may be exposed.

Referring again to FIGS. 2A, 2B, and 2C, an etch stop layer 92 may be formed on the substrate including the first and second insulating capping patterns 81a and 84a. The etch stop layer 92 may be formed an insulating material, such as, for example, silicon nitride. Information storage elements 98 may be formed on the substrate including the etch stop layer 92. The information storage elements 98 may be cell capacitors of a memory device, such as, for example, a DRAM. The information storage elements 98 may include first electrodes 94, a capacitor dielectric 95 disposed on the first electrodes 94, and a second electrode 96 disposed on the capacitor dielectric material 95. The first electrodes 94 may be formed through the etch stop layer 92 and electrically connected to the conductive structures 72.

Operations of a method of manufacturing a semiconductor device according to some embodiments of the present inventive concept will be discussed with reference to FIGS. 20A through 20J. Each of FIGS. 20A through 20J are cross-sectional views taken along the respective lines I-I', II-II' and III-III' of FIG. 1A.

Figure 20A:
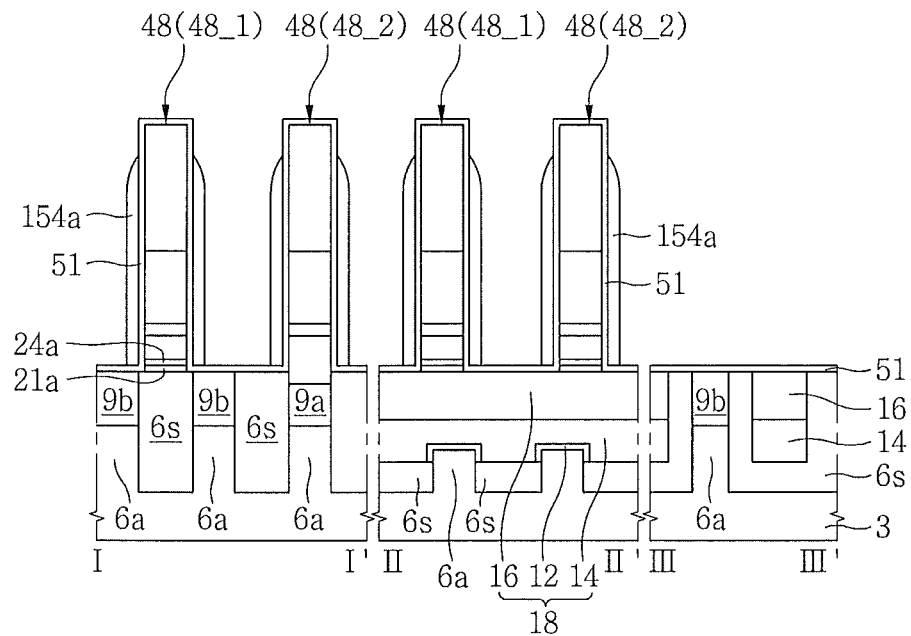
FIGS. 20A through 20J are cross-sectional views illustrating intermediate structures provided in operations of a method of manufacturing a semiconductor device according to some embodiments of the present inventive concept.

Referring to FIGS. 1, 5, and 20A, the line structures 48 may be formed on a substrate as discussed with reference to FIGS. 6 through 9E (operation 5). As discussed with reference to FIG. 11A, the spacer layer (refer to 51 in FIG. 11A) may be formed on the substrate including the line structures 48, and the sacrificial layer (refer to 54 in FIG. 11A) may be formed on the spacer layer (refer to 51 in FIG. 11A).

Thereafter, the sacrificial layer (refer to 54 in FIG. 11A) may be anisotropically etched to form sacrificial patterns 154a (operation 10). Upper end portions of the sacrificial patterns 154a may be formed at a lower level than top surfaces of the line structures 48. During the etching of the sacrificial layer (refer to FIG. 54 in FIG. 11A), the spacer layer 51 may serve to protect the substrate.

Figure 20B:
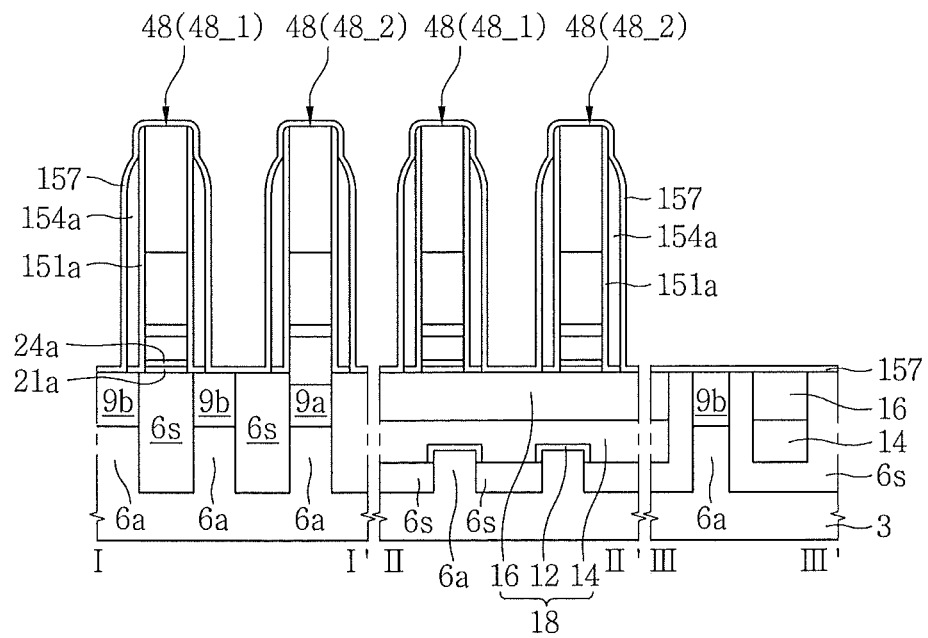

Referring to FIGS. 1 and 20B, after forming the sacrificial patterns 154a, the spacer layer 51 may be etched to form spacers 151a. The spacers 151a may be formed on side surfaces of the line structures 48 and under the sacrificial patterns 154a. A protection layer 157 may be formed on the substrate including the spacers 151a and the sacrificial patterns 154a. The protection layer 157 and the spacers 151a may be formed of an insulating material having an etch selectivity with respect to the sacrificial patterns 154a. For example, the sacrificial patterns 154a may be formed of silicon oxide, and the protection layer 157 and the spacers 151a may be formed of silicon nitride.

Figure 20C:
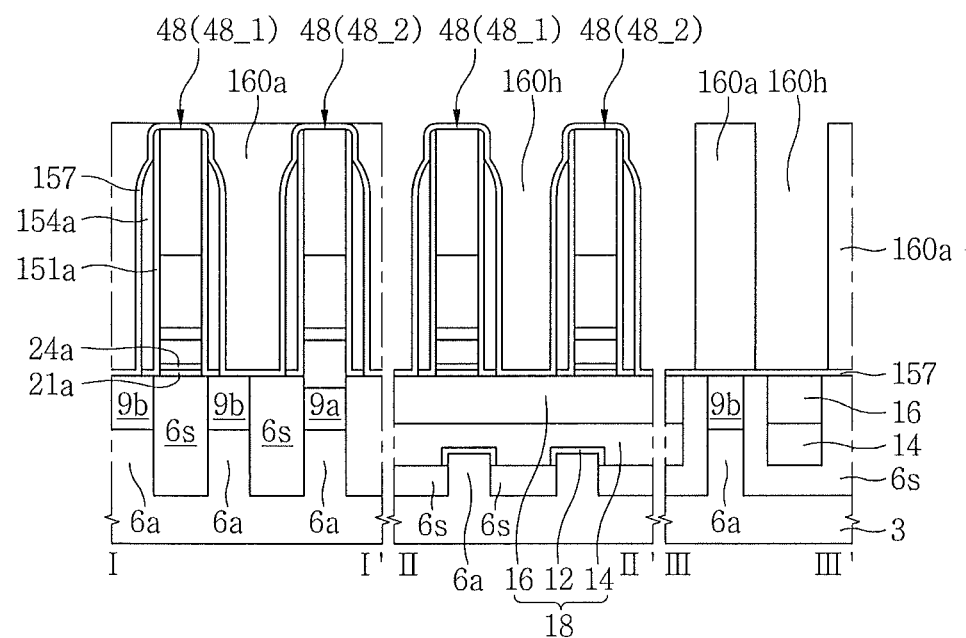

Referring to FIGS. 1 and 20C, mold patterns 160a may be formed on the substrate including the protection layer 157. The mold patterns 160a may be formed using substantially the same or similar method as the method of forming the mold patterns 60a discussed with reference to FIGS. 13B and 13C. For example, a mold layer (refer to 60 in FIG. 13B) may be formed between the line structures 48 on the substrate including the protection layer 157 as discussed with reference to FIG. 13B, and the mold layer (refer to 60 in FIG. 13B) may be patterned to form the mold patterns 160a. During the formation of the mold patterns 160a, isolation holes 160h may be formed between the mold patterns 160a.

Figure 20D:
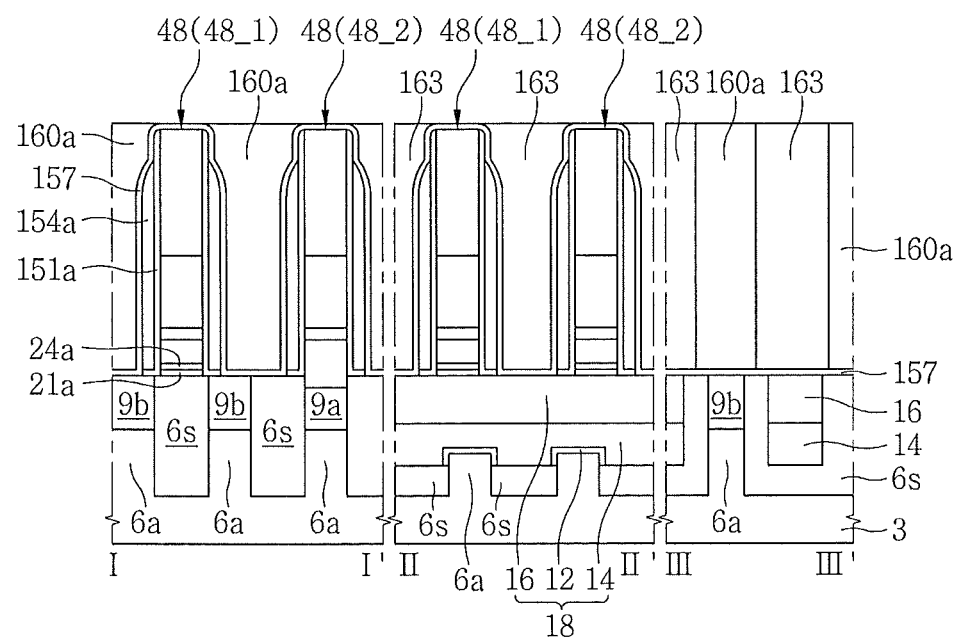

Referring to FIGS. 1, 5, and 20D, an insulating material layer may be formed on the substrate including the isolation holes 160h, and then planarized to form insulating isolation patterns 163. The insulating isolation patterns 163 may be formed between the line structures 48 (operation 15). The insulating isolation patterns 163 may be formed of a material having an etch selectivity with respect to the sacrificial patterns 154a. For example, the sacrificial patterns 154a may be formed of silicon oxide, and the insulating isolation patterns 163 may be formed of silicon nitride.

Figure 20E:
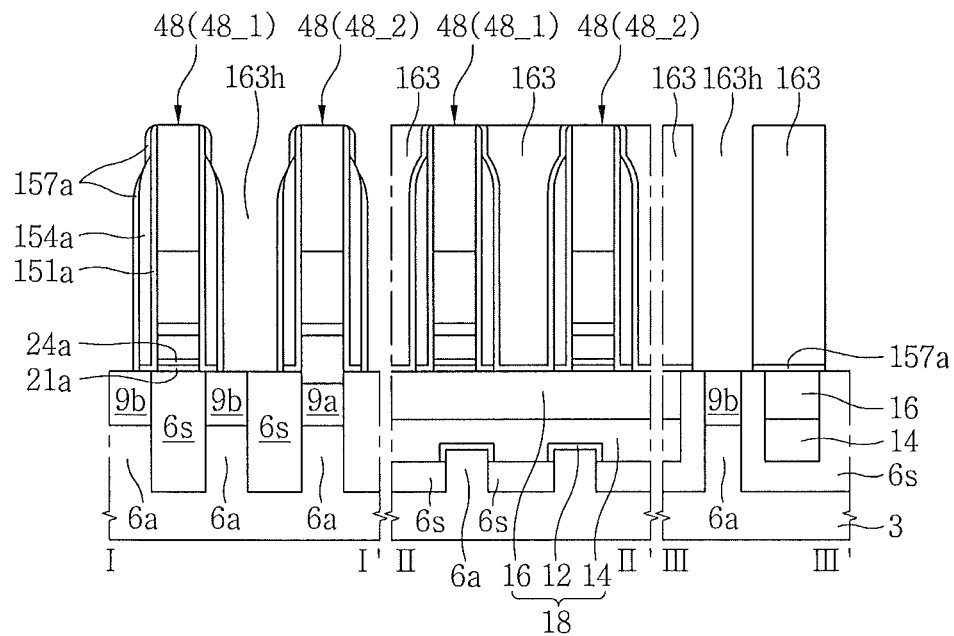

Referring to FIGS. 1 and 20E, the mold patterns 160a may be removed to form storage contact holes 163h. The protection layer 157 exposed by the storage contact holes 163h may be etched to form contact regions disposed under the storage contact holes 163h. The protection layer 157 may be etched to form a protection pattern 157a. The contact regions disposed under the storage contact holes 163h may be the second source and drain regions 9b.

Figure 20F:
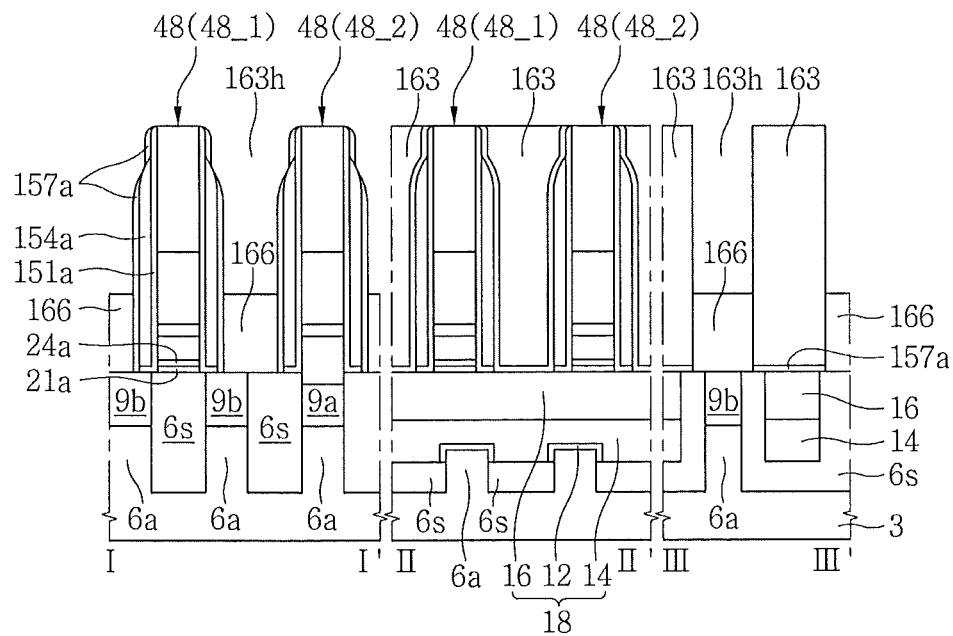

Referring to FIGS. 1, 5, and 20F, as in the method of forming the lower conductive patterns 66 discussed with reference to FIG. 15C, lower conductive patterns 166 may be formed to partially fill the storage contact holes 163h (operation 20). The lower conductive patterns 166 may be formed at a lower level than the top surfaces of the line structures 48. The lower conductive patterns 166 may be formed at a lower level than top surfaces of the conductive lines 43 of the line structures 48.

Figure 20G:
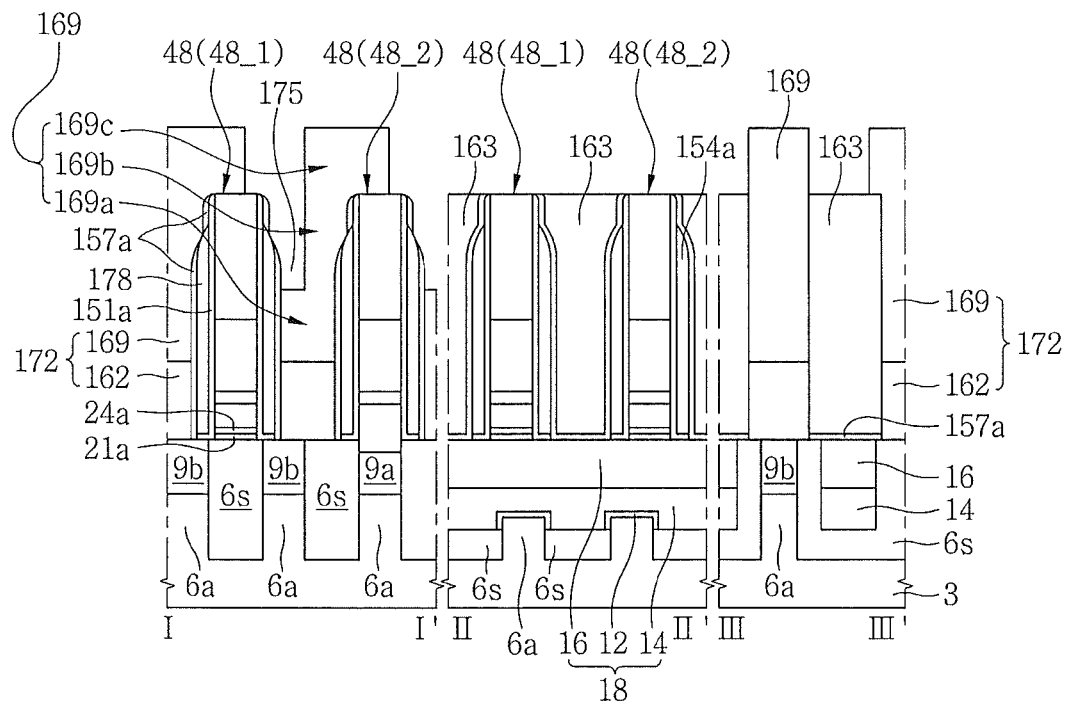

Referring to FIGS. 1, 5, and 20G, as in the method of forming the upper conductive patterns 69 discussed with reference to FIGS. 17A and 17B, an upper conductive layer may be formed on the substrate including the lower conductive patterns 166, and then patterned to form upper conductive patterns 169 (operations 25 and 30).

Like the upper conductive patterns 69 of FIG. 17B, each of the upper conductive patterns 169 may include a first portion 169a, a second portion 169b, and a third portion 169c corresponding respectively to the first portion 69a, the second portion 69b, and the third portion 69c of the upper conductive patterns 69.

Like the recessed portions 75 of FIG. 17B, recessed portions 175 may be formed between the line structures 48 and the upper conductive patterns 169.

Figure 20H:
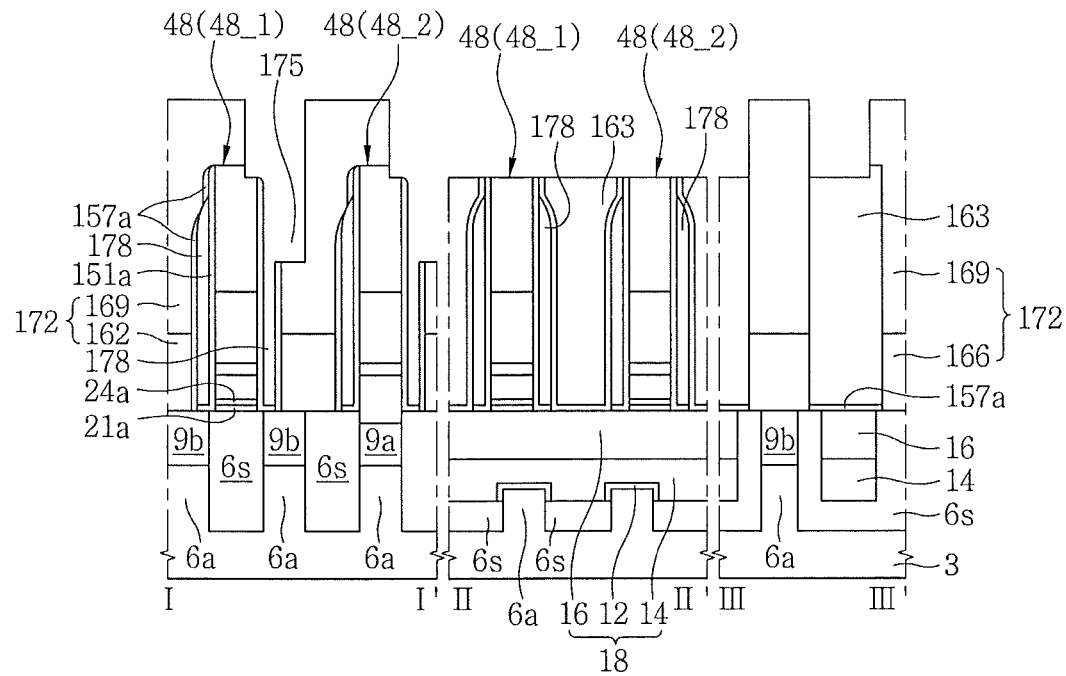

Referring to FIGS. 1, 5, and 20H, the sacrificial patterns 154a may be removed to form empty spaces 178 (operation 35). The formation of the empty spaces 178 may include etching the protection patterns 157a exposed by the recess portion 175 to increase exposed areas of the sacrificial patterns 154a and removing the sacrificial patterns 154a using an etching process. The sacrificial patterns 154a may be removed using an isotropic etching process. The sacrificial patterns 154a may be removed using a wet etching process.

Figure 20I:
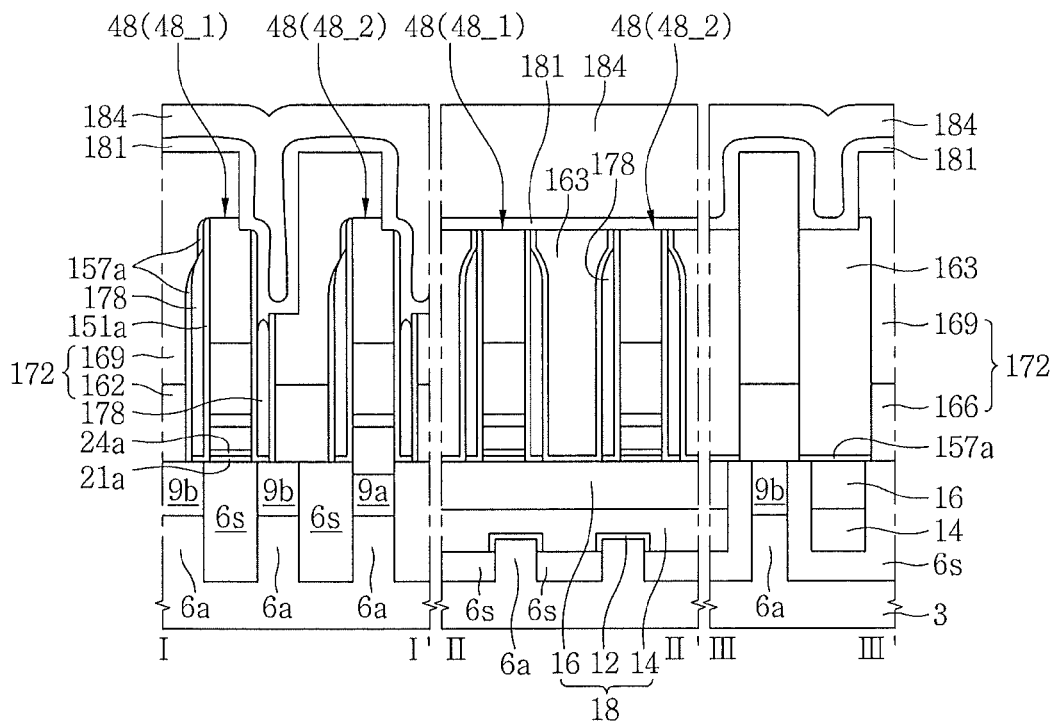

Referring to FIGS. 1, 5, and 20I, a first insulating capping layer 181, which is the same as the first insulating capping layer 81 of FIG. 19B, may be formed on the substrate including the empty spaces 178 (operation 40). A second insulating capping layer 182, which is the same as the second insulating capping layer 84 of FIG. 19B, may be formed on the first insulating capping layer 181 (operation 45).

Figure 20J:
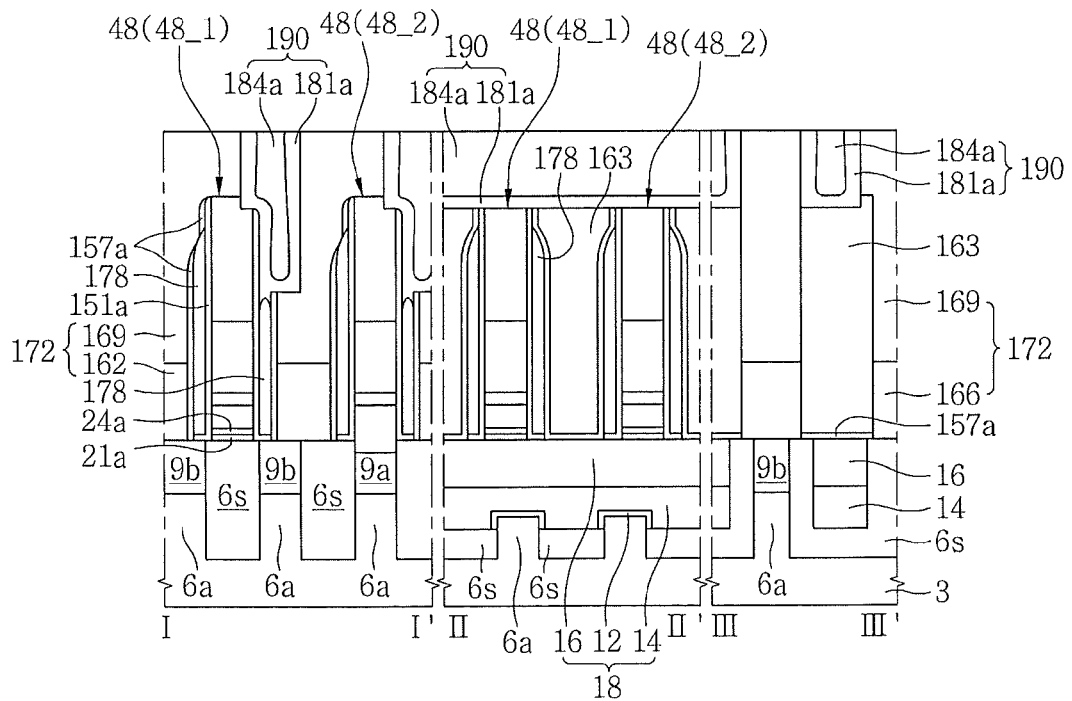

Referring to FIGS. 1, 5, and 20J, the first and second insulating capping layers 181 and 184 may be planarized, thereby forming the first and second insulating capping patterns 181a and 184a, which are the same as the first and second insulating capping patterns 81a and 84a of FIG. 19C (operation 50).

Referring again to FIGS. 3A, 3B, and 3C, an etch stop layer 92 may be formed on the substrate including the first and second insulating capping patterns 181a and 184a. The etch stop layer 92 may be formed of an insulating material, such as, for example, silicon nitride. Information storage elements 98 may be formed on the substrate including the etch stop layer 92. The information storage elements 98 may be cell capacitors of a memory device, such as, for example, a DRAM. The information storage elements 98 may include first electrodes 94, a capacitor dielectric material 95 disposed on the first electrodes 94, and a second electrode 96 disposed on the capacitor dielectric material 95. The first electrodes 94 may be formed through the etch stop layer 92 and electrically connected to the conductive structures 172.

Figure 21:
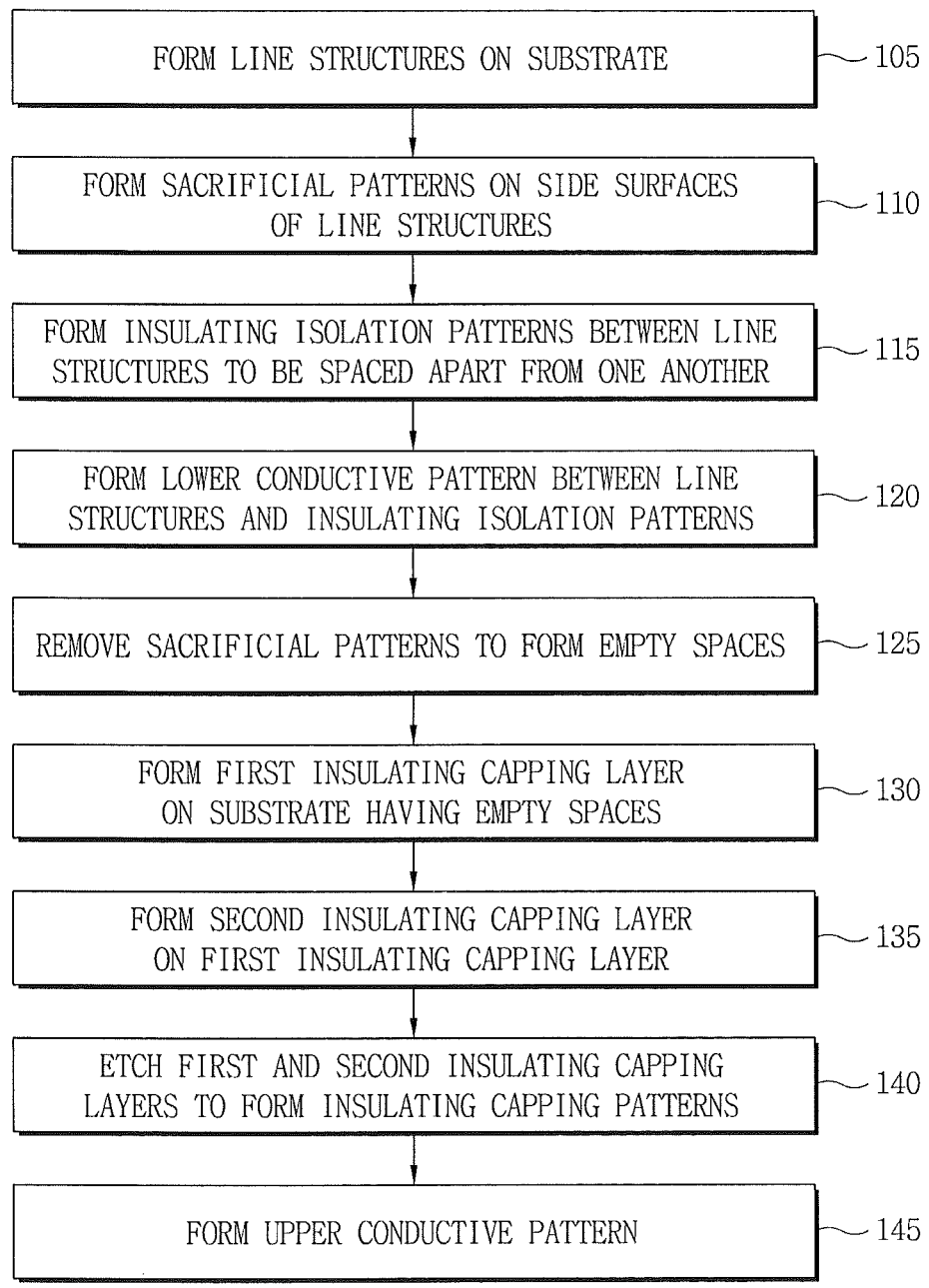
FIG. 21 is a process flowchart illustrating operations of a method of manufacturing a semiconductor device according to some embodiments of the present inventive concept.

FIG. 21 a process flowchart illustrating operations of a method of manufacturing a semiconductor device according to some embodiments of the present inventive concept. A method of manufacturing a semiconductor device according to some embodiments of the present inventive concept will now be discussed with reference to FIG. 21.

Referring to FIG. 21, line structures may be formed on a substrate (operation 105). Sacrificial patterns may be formed on side surfaces of the line structures (operation 110). Insulating isolation patterns may be formed between the line structures and spaced apart from each other (operation 115). A lower conductive pattern may be formed between the line structures and the insulating isolation patterns (operation 120). The sacrificial patterns may be removed to form empty spaces (operation 125).

A first insulating capping layer may be formed on the substrate including the empty spaces (operation 130). A second insulating capping layer may be formed on the first insulating capping layer (operation 135). The first and second insulating capping layers may be etched to form insulating capping patterns (operation 140). Thereafter, an upper conductive pattern may be formed (operation 145)

Operations of a method of manufacturing a semiconductor device according to some embodiments of the present inventive concept will be discussed with reference to FIGS. 20A through 20J. Each of FIGS. 22A through 22F are cross-sectional views taken along the respective lines I-I', II-II' and III-III' of FIG. 1A.

An example of a method of manufacturing a semiconductor device according to some embodiments of the present inventive concept will now be discussed with reference to FIGS. 22A through 22F along with FIGS. 1A and 21.

Figure 22A:
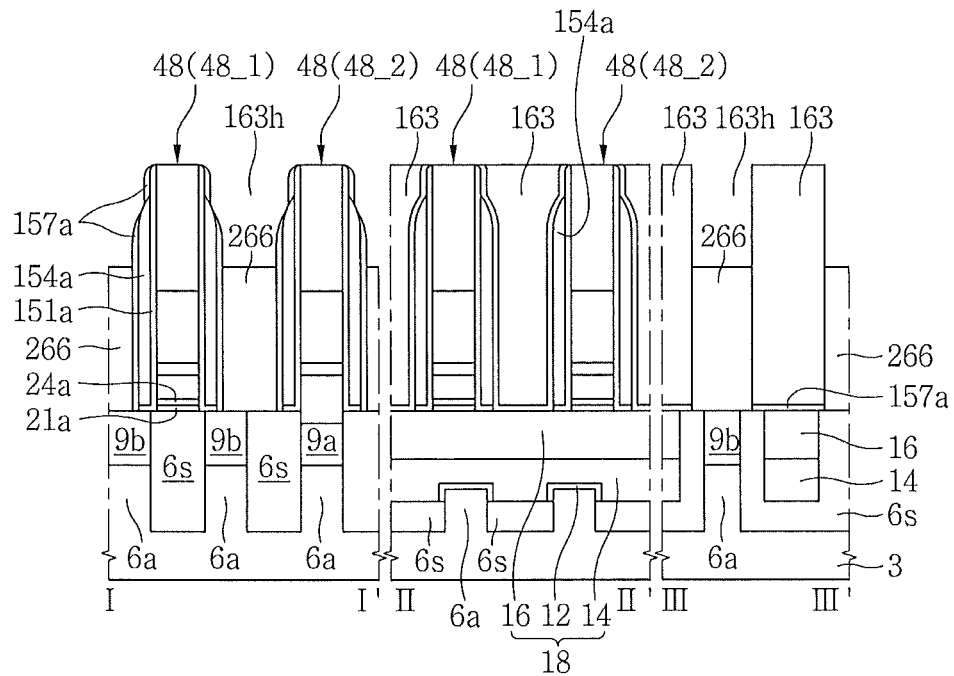
FIGS. 22A through 22F are cross-sectional views illustrating intermediate structures provided in operations of a method of manufacturing a semiconductor device according to some embodiments of the present inventive concept.

Referring to FIGS. 1, 21, and 22A, the transistors discussed with reference to FIG. 7 may be formed on a substrate 3, and the line structures 48 discussed with reference to FIG. 8 may be formed on the substrate 3 including the transistors (operation 105). The substrate 3 may be a semiconductor substrate. The line structures 48 may be bit line structures of a memory device, such as, for example, a DRAM. Each of the line structures 48 may include the conductive line 43 and the insulating mask pattern 45 disposed on the conductive line 43. The spacers 151a, the sacrificial patterns 154a, and the protection layer 157, which are the same as discussed with reference to FIGS. 20A and 20B, may be formed on the substrate 3 including the line structures 48. The sacrificial patterns 154a may be formed on side surfaces of the line structures 48 (operation 110).

The mold patterns (refer to 160a in FIG. 20C) discussed with reference to FIG. 20C may be formed on the substrate 3 including the protection layer 157. As discussed with reference to FIG. 20D, the insulating isolation patterns 163 may be formed between the mold patterns (refer to 160a in FIG. 20C). The insulating isolation patterns 163 may be formed between the line structures 48 and spaced apart from one another (operation 115).

As discussed with reference to FIG. 20E, the mold patterns (refer to 160a in FIG. 20D) may be removed to form the storage contact holes 163h. As discussed with reference to FIG. 20E, during the formation of the storage contact holes 163h, the protection layer 157 may be etched to form the protection patterns 157a. Lower conductive patterns 266 may be formed to partially fill the storage contact holes 163h. The lower conductive patterns 266 may be formed between the line structures 48 and the insulating isolation patterns 163 (operation 120).

In some embodiments, the lower conductive patterns 266 may be formed to have top surfaces disposed at a higher level than the conductive lines 43 of the line structures 48.

Figure 22B:
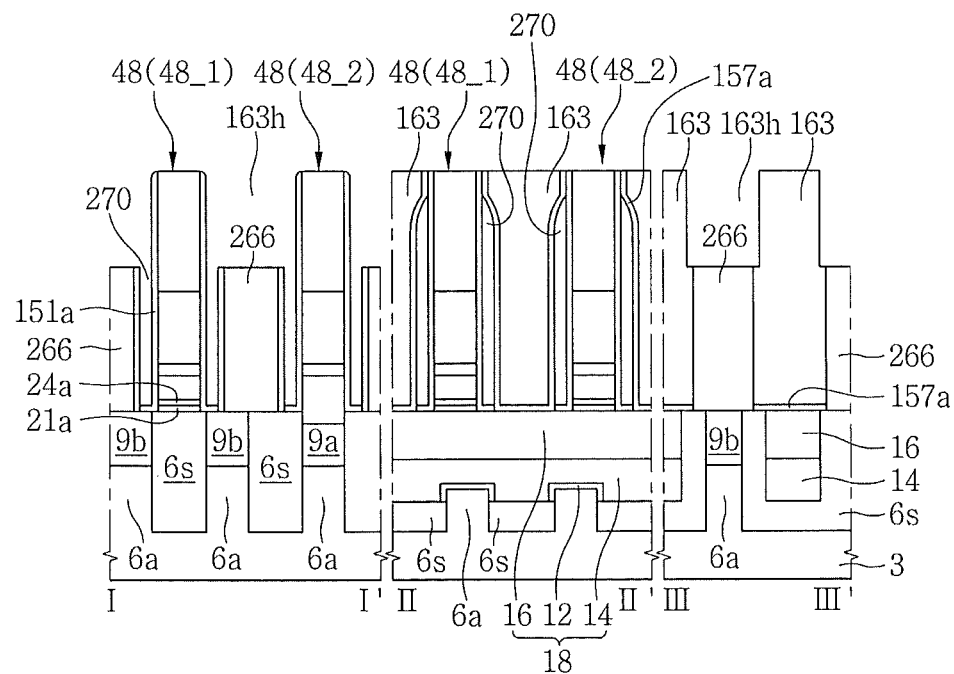

Referring to FIGS. 1, 21, and 22B, the sacrificial patterns 154a may be removed to form empty spaces 270 (operation 125). The formation of the empty spaces 270 may include etching the protection patterns 157a disposed at a higher level than the lower conductive patterns 266 to increase exposed areas of the sacrificial patterns 154a and removing the sacrificial patterns 154a using an etching process. The sacrificial patterns 154a may be removed using an isotropic etching process. The sacrificial patterns 154a may be removed using a wet etching process.

Figure 1B:
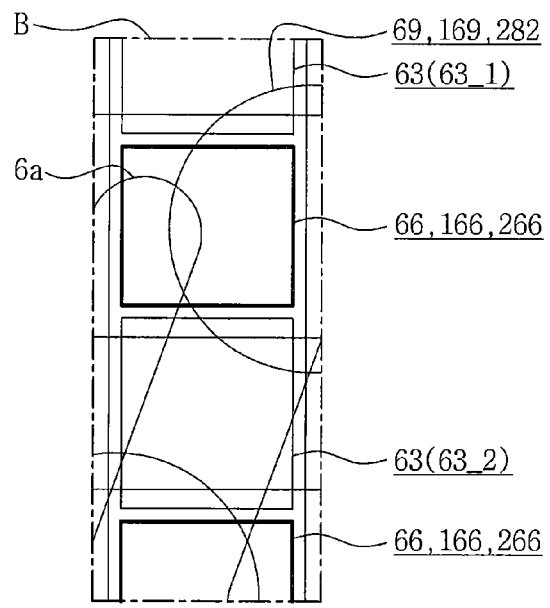
FIGS. 1B-1D are enlarged plan views of the portions B-D shown in FIG. 1A, respectively according to some embodiments of the present inventive concept.
Figure 1C:
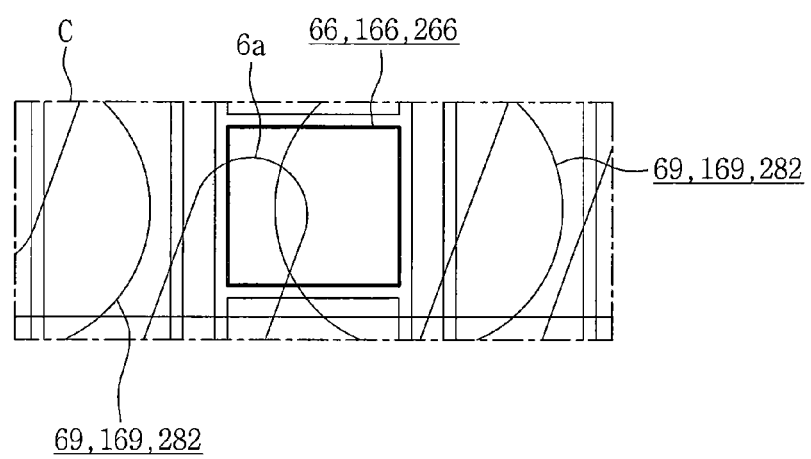
Figure 1D:
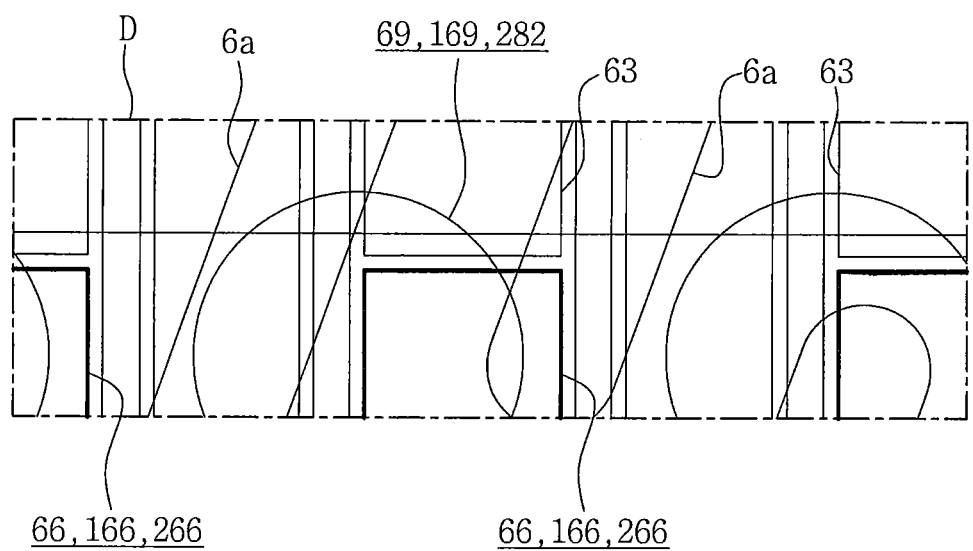
Figure 22C:
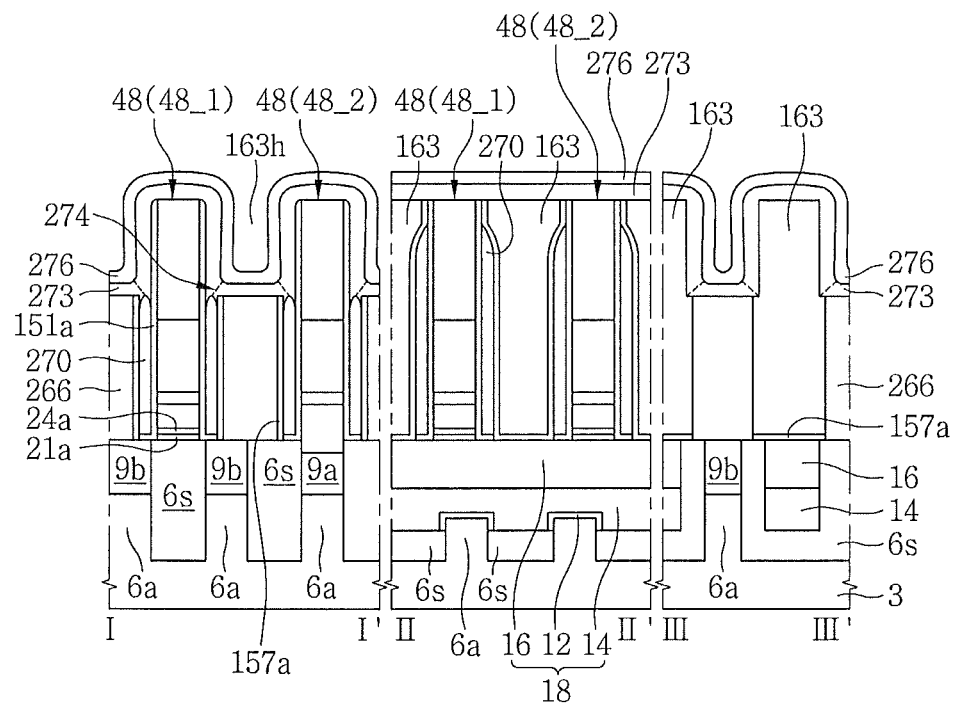

Referring to FIGS. 1A, 21, and 22C, a first insulating capping layer 273 may be formed on the substrate 3 including the empty spaces 270 (operation 130). A second insulating capping layer 276 may be formed on the first insulating capping layer 273 (operation 135).

As the second insulating capping layer 276, the first insulating capping layer 273 may be formed using a deposition layer capable of reducing a reduction in the volume of each of the empty spaces 270. For example, the first insulating capping layer 273 may be formed using a layer having such deposition characteristics as to cover upper portions of the empty spaces 270 without substantially reducing the volume of each of the empty spaces 270. In this case, the first insulating capping layer 273 may be deposited to have a non-uniform thickness.

During the formation of the first insulating capping layer 273, interfaces 274 may be formed in the first insulating capping layer 273 at corners between side surfaces of the line structures 78 and top surfaces of the lower conductive patterns 266.

The second insulating capping layer 276 may reduce enlargement of the interfaces 274 formed in the first insulating capping layer 273 during a subsequent etching process. For example, the second insulating capping layer 276 may be formed of an interface-free material layer and reduce enlargement of the interfaces 274 formed in the first insulating capping layer 273 during a subsequent etching process, thereby reducing failures.

To reduce failures originated from the first insulating capping layer 273 having a non-uniform thickness, the second insulating capping layer 276 may be formed using a layer including no interface or fewer interfaces than the first insulating capping layer 273, a layer having a more uniform thickness than the first insulating capping layer 273, a layer having a higher density than the first insulating capping layer 273, or a layer having a different etch rate from the first insulating capping layer 273.

The second insulating capping layer 276 may be formed using a deposition process capable of forming a layer having a higher conformality than the first insulating capping layer 273 so that the second insulating capping layer 276 can be formed using a layer including no interface or fewer interfaces than the first insulating capping layer 273. For example, the first insulating capping layer 273 may be formed of a first material having a lower conformality than the second insulating capping layer 276, while the second insulating capping layer 276 may be formed of a second material having a higher conformality than the first insulating capping layer 273. For example, the first insulating capping layer 273 may be formed of silicon nitride obtained using a PECVD process, while the second insulating capping layer 276 may be formed of silicon nitride obtained using an LPCVD process or an ALD process.

Meanwhile, the first insulating capping layer 273 and the second insulating capping layer 276 may be formed of different materials. For example, the first insulating capping layer 273 may be formed of silicon nitride (SiN), and the second insulating capping layer 276 may be formed of SiCN.

Meanwhile, the first and second insulating capping layers 273 and 276 may be formed using the same CVD apparatus. The first insulating capping layer 273 may be formed of silicon nitride (SiN), and the second insulating capping layer 276 may be formed of a SiCN material capable of forming a layer having a higher conformality or including no or fewer interfaces than silicon nitride. For example, the second insulating capping layer 276 may be formed of a SiCN material obtained by adding carbon (C) into silicon nitride using trimethyl silane (TSA) as a carbon source. The SiCN material may be formed using a thin-film process with conditions under which a Si source and a N source are provided in a ratio of about 1:5 or less and C is contained at a content of about 50% or less. The second insulating capping layer 276 may have a higher conformality than the first insulating capping layer 273 and an etch selectivity with respect to the first insulating capping layer 273.

Meanwhile, the second insulating capping layer 276 may be formed of a material having a higher density than the first insulating capping layer 273.

Figure 22D:
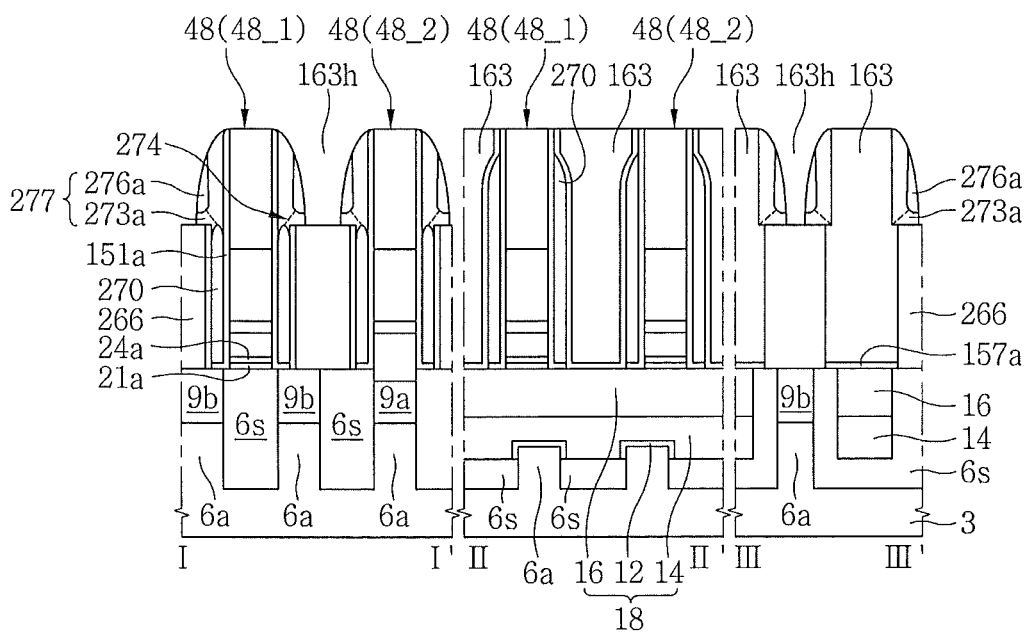

Referring to FIGS. 1, 21, and 22D, the first and second insulating capping layers 273 and 276 may be anisotropically etched to form insulating capping patterns 277 (operation 140). The insulating capping patterns 277 may be formed on upper side surfaces of the line structures 48. The insulating capping patterns 277 may be formed at a higher level than the conductive lines 43. The insulating capping patterns 277 may be formed on side surfaces of the insulating mask patterns 45. The insulating capping patterns 277 may include the first and second insulating capping patterns 273a and 276a. The first insulating capping layer 273 may be etched to form the first insulating capping pattern 273a, while the second insulating capping layer 276 may be etched to form the second insulating capping pattern 276a. The first insulating capping pattern 273a may be formed closer to the line structures 48 than to the second insulating capping pattern 276a.

Figure 22E:
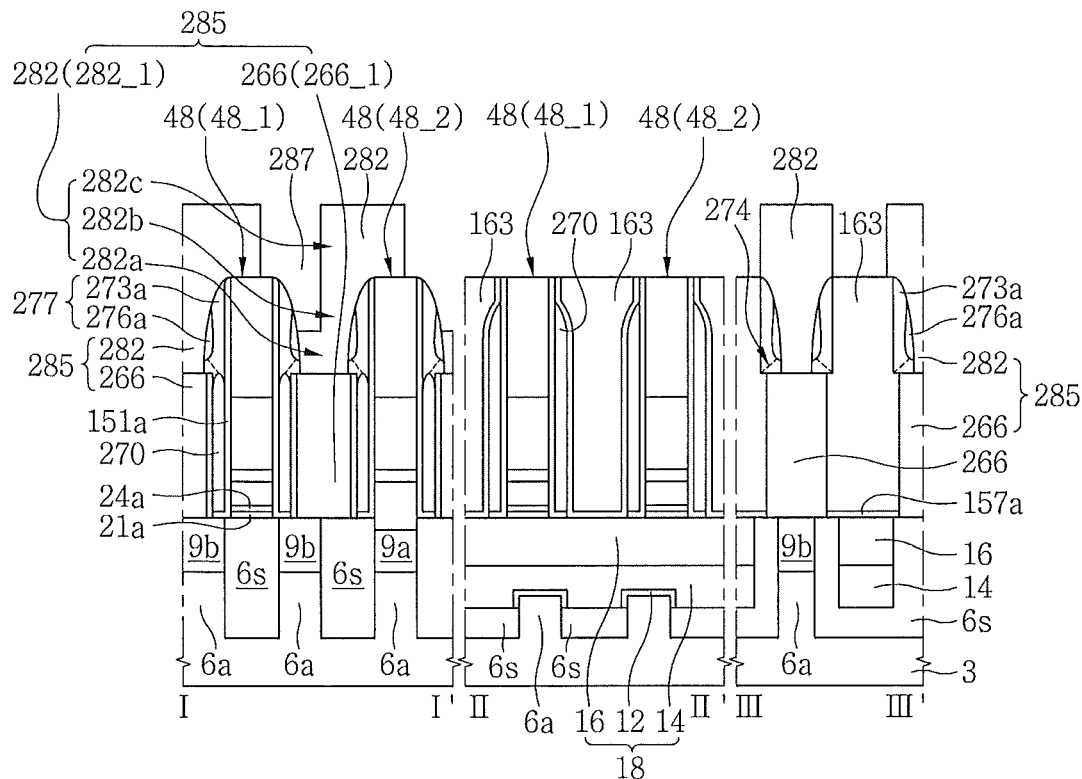

Referring to FIGS. 1 and 22E, an upper conductive layer may be formed on the substrate including the insulating capping patterns 277. Thereafter, the upper conductive layer may be patterned, thereby forming upper conductive patterns 282. The upper conductive patterns 282 may be disposed on the lower conductive patterns 266. The upper conductive patterns 282 may be electrically connected to the lower conductive patterns 266. The lower conductive patterns 266 and the upper conductive patterns 282 may constitute conductive structures 285. Recessed portions 287 may be formed two adjacent line structures 48 and the upper conductive patterns 282.

Referring again to FIGS. 4A, 4B, and 4C, each of the upper conductive patterns 282 may include a lower portion 282a, a middle portion 282b disposed on the lower portion 282a, and an upper portion 282c disposed on the middle portion 282b. Upper portions 282c of the upper conductive patterns 282 may be formed to have portions overlapping a top surface of adjacent line structures 48. For example, a first lower conductive pattern 266_1 and a first upper conductive pattern 282_1 may be formed between the first and second line structures 48_1 and 48_2. Here, the first upper conductive pattern 282_1 may be formed on the first lower conductive pattern 266_1. Also, the upper portion 282c of the first upper conductive pattern 282_1 may be spaced apart from the first line structure 48_1 and include a portion overlapping a top surface of the second line structure 48_2.

Figure 22F:
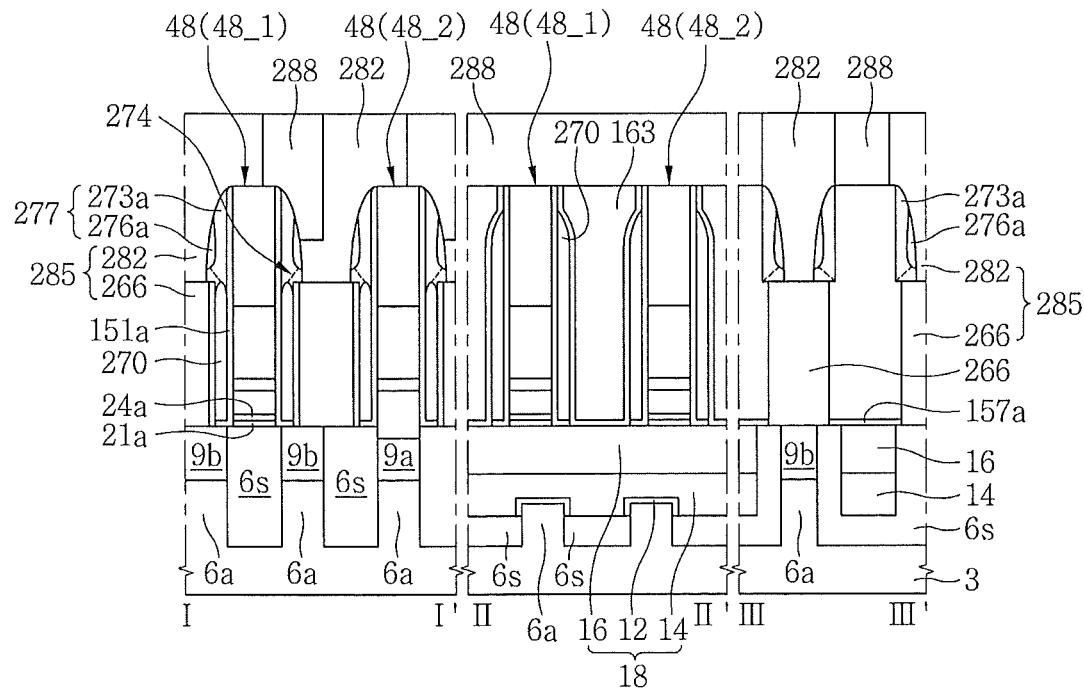

Referring to FIGS. 1 and 22F, an upper insulating pattern 288 may be formed to fill the recessed portions 287. The upper insulating pattern 288 may be formed of an insulating material, such as, for example, silicon oxide or silicon nitride.

The formation of the upper insulating pattern 288 may include forming an insulating layer on the substrate including the recessed portions 287 and planarizing the insulating layer. The planarization of the insulating layer may be performed using an etchback technique or a CMP technique.

Referring again to FIGS. 4A, 4B, and 4C, an etch stop layer 92 may be formed on the substrate including the upper insulating pattern 288. The etch stop layer 92 may be formed of an insulating material, such as, for example, silicon nitride. Information storage elements 98 may be formed on the substrate including the etch stop layer 92. The information storage elements 98 may be cell capacitors of a memory device, such as, for example, a DRAM. The information storage elements 98 may include first electrodes 94, a capacitor dielectric material 95 disposed on the first electrodes 94, and a second electrode 96 disposed on the capacitor dielectric material 95. The first electrodes 94 may be formed through the etch stop layer 92 and electrically connected to the conductive structures 285.

According to some embodiments of the present inventive concept, a semiconductor device including a conductive structure interposed between line structures, empty spaces interposed between the line structures and the conductive structure, and an insulating capping pattern disposed on the empty spaces can be provided. The insulating capping pattern can include a first insulating capping pattern and a second insulating capping pattern. The first insulating capping pattern may reduce or minimize a reduction in the volume of each of the empty spaces and enclose an upper portion of each of the empty spaces. The second insulating capping pattern may reduce or minimize failures originated from the first insulating capping pattern.

Empty spaces included in a semiconductor device according to some embodiments of the present inventive concept may reduce a bit line loading capacitance in a memory device, such as, for example, a DRAM, and may ensure a bit line sensing margin. Since the insulating capping pattern may reduce or minimize a reduction in the volume of each of the empty spaces and stably enclose upper portions of the empty spaces, the performance of the semiconductor device may be improved.

Figure 23:
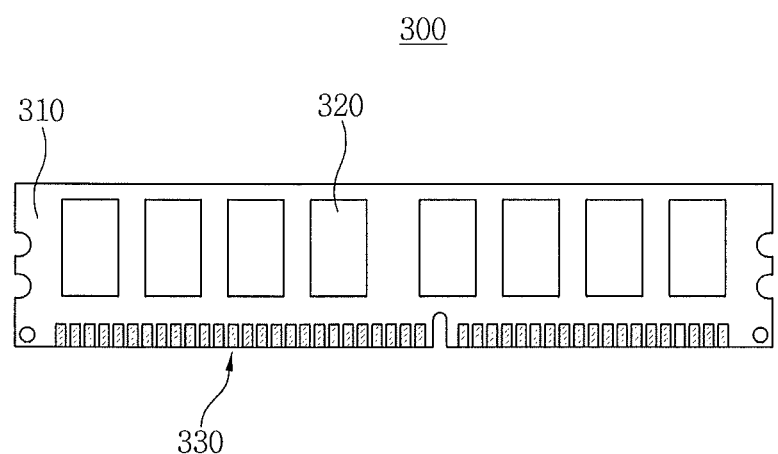
FIGS. 23 and 24 are plan views of semiconductor modules including a semiconductor device according to some embodiments of the present inventive concept.

FIG. 23 is a plan view of a semiconductor module including a semiconductor device according to some embodiments of the present inventive concept. Referring to FIG. 23, the semiconductor module 300 may be a memory module including a memory device. The semiconductor module 300 may include a module substrate 310 and a plurality of semiconductor devices 320 and a plurality of terminals 330 disposed on the module substrate 310. The terminals 330 may include a conductive metal. The terminals 330 may be electrically connected to the semiconductor devices 320. The module substrate 310 may be a memory module substrate. The module substrate 310 may include a printed circuit board (PCB) or a wafer.

The semiconductor devices 320 may be memory devices, such as, for example, DRAM devices. The semiconductor devices 320 may be semiconductor devices according some embodiments of the present inventive concept or semiconductor packages including the semiconductor devices.

Figure 24:
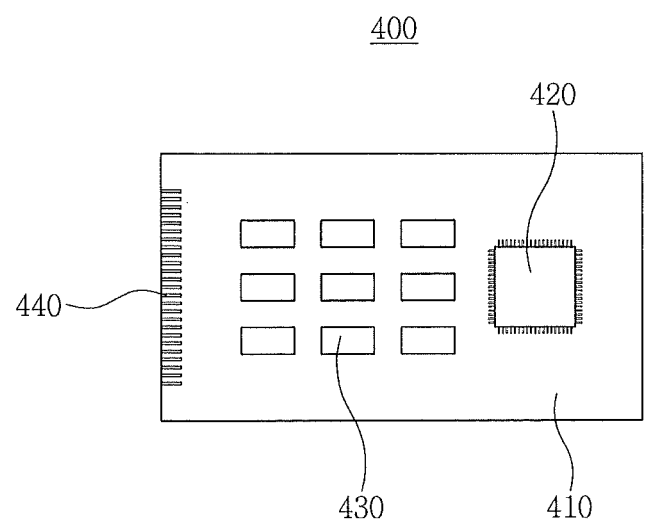

FIG. 24 is a plan view of a semiconductor module including a semiconductor device according to some embodiments of the present inventive concept. Referring to FIG. 24, the semiconductor module 400 may include a semiconductor device 430 on a module substrate 410. The semiconductor device 430 may be a semiconductor device according to some embodiments of the present inventive concept or a semiconductor package including the semiconductor device.

The semiconductor module 400 may further include a microprocessor 420. Input/output (I/O) terminals 440 may be disposed on at least one side of the module substrate 410. The microprocessor 420 may include a semiconductor device according to some embodiments of the present inventive concept.

Figure 25:
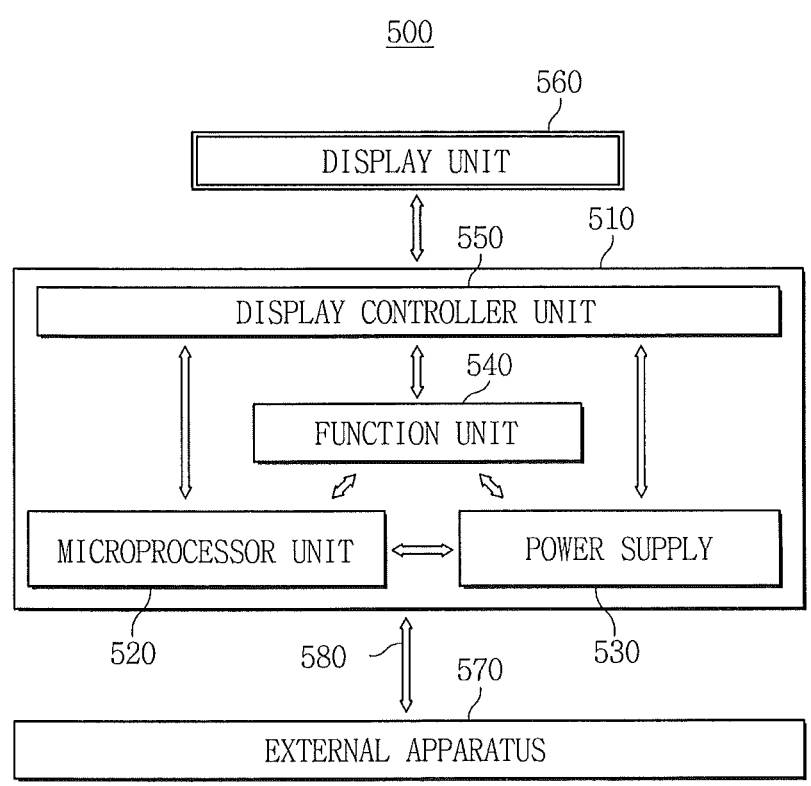
FIG. 25 is a block diagram of an electronic system including a semiconductor device according to some embodiments of the present inventive concept.

FIG. 25 is a block diagram of an electronic system including a semiconductor device according to some embodiments of the present inventive concept. Referring to FIG. 25, the electronic system 500 may include a body 510. The body 510 may include a microprocessor unit 520, a power supply 530, a function unit 540, and/or a display controller unit 550. The body 510 may be a system board or mother board including a PCB. The microprocessor unit 520 may include a semiconductor device according to some embodiments of the present inventive concept.

The microprocessor unit 520, the power supply 530, the function unit 540, and the display controller unit 550 may be mounted on the body 510. A display unit 560 may be disposed on a top surface of the body 510 or outside the body 510. For example, the display unit 560 may be disposed on a surface of the body 510 and display an image processed by the display controller unit 550. The power supply 530 may receive a predetermined voltage from an external power source, divide the predetermined voltage into various voltage levels, and transmit divided voltages to the microprocessor unit 520, the function unit 540, and the display controller unit 550. The microprocessor unit 520 may receive a voltage from the power supply 530, control the function unit 540 and the display unit 560.

The function unit 540 may implement various functions of the electronic system 500. For example, when the electronic system 500 is a mobile electronic product, such as, for example, a portable phone, the function unit 540 may include several elements capable of wireless communication functions, such as, for example, output of an image to the display unit 560 or output of a voice to a speaker, by dialing or communication with an external apparatus 570. When the electronic system 500 includes a camera, the function unit 540 may serve as an image processor.

In some embodiments, when the electronic system 500 is connected to a memory card to increase capacity, the function unit 540 may be a memory card controller. The function unit 540 may exchange signals with the external apparatus 570 through a wired or wireless communication unit 580. In addition, when the electronic system 500 needs a universal serial bus (USB) to expand functions thereof, the function unit 540 may serve as an interface controller.

Figure 26:
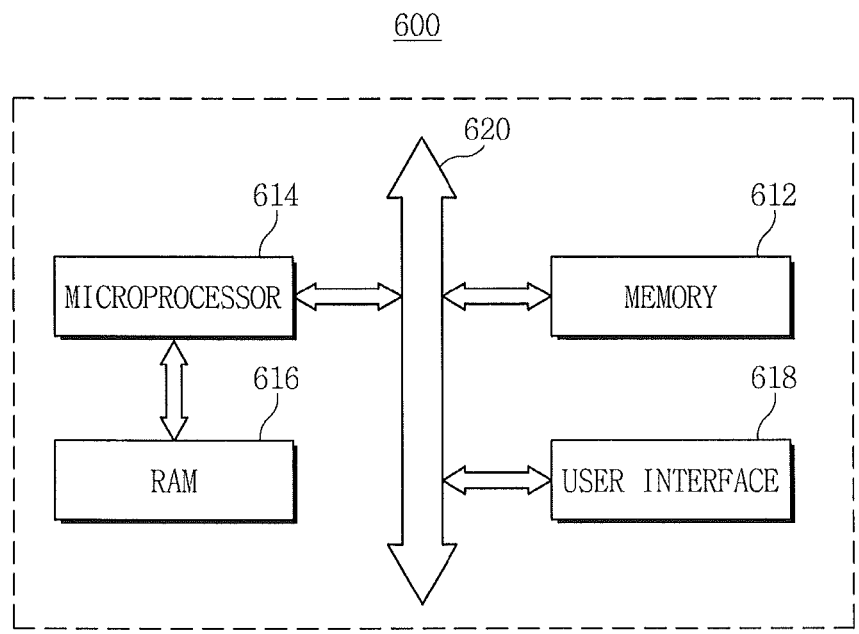
FIG. 26 is a block diagram of an electronic system including a semiconductor device according to some embodiments of the present inventive concept.

FIG. 26 is a block diagram of an electronic system including a semiconductor device according to some embodiments of the present inventive concept. Referring to FIG. 26, the electronic system 600 may include a semiconductor device according to some embodiments of the present inventive concept. The electronic system 600 may be used to fabricate a mobile device or computer. For example, the electronic system 600 may include a memory system 612, a microprocessor 614, a random access memory (RAM) 616, and a user interface 618 configured to communicate data using a bus 620. The microprocessor 614 may program and control the electronic system 600. The RAM 616 may be used as an operation memory of the microprocessor 614. The microprocessor 614, the RAM 616, and/or other elements may be assembled in a single package. The memory system 612 may include a semiconductor device according to some embodiments of the present inventive concept. The microprocessor 614 and/or the RAM 616 may also include a semiconductor device according to some embodiments of the present inventive concept.

The user interface 618 may be used to input data to the electronic system 600 or output data from the electronic system 600. The memory system 612 may store codes for operating the microprocessor 614, data processed by the microprocessor 614, or external input data. The memory system 612 may include a controller and a memory.

Figure 27:
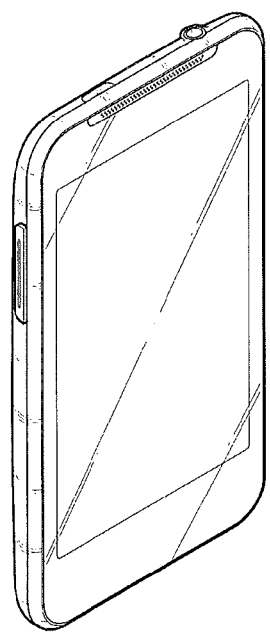
FIG. 27 is a perspective view of a wireless mobile phone including a semiconductor device according to some embodiments of the present inventive concept.

FIG. 27 is a perspective view of a wireless mobile phone including a semiconductor device according to some embodiments of the present inventive concept. The wireless mobile phone 700 may include a semiconductor device according to some embodiments of the present inventive concept. The wireless mobile device 700 may be a tablet personal computer (PC). Furthermore, the semiconductor device according to some embodiments of the present inventive concept may be used for a portable devices such as, for example, a laptop computer, an MPEG-1 audio layer 3 (MP3) player, an MP4 player, a navigation device and a solid-state disk (SSD), a desktop computer, or electronic devices for automotive and household uses.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
    first and second line structures extending in a direction on a substrate;
    an insulating isolation pattern between the first and second line structures;
    a conductive structure between the first and second line structures and adjacent the insulating isolation pattern along the direction; and an empty space comprising a first portion between the first line structure and the conductive structure and a second portion between the first line structure and the insulating isolation pattern, wherein the first portion of the empty space has a height different from a height of the second portion of the empty space, wherein the first line structure comprises a first conductive line and a first insulating mask pattern on the first conductive line.

2. The semiconductor device of claim 1, further comprising an insulating capping pattern between the first line structure and the conductive structure, wherein:
the insulating capping pattern defines an upper part of the first portion of the empty space and comprises a first insulating capping pattern and a second insulating capping pattern; and
the first insulating capping pattern has a non-uniform thickness and extends along a lower part and a side surface of the second insulating capping pattern.

3. The semiconductor device of claim 1, further comprising an insulating capping pattern between the first insulating mask pattern and the conductive structure, wherein the insulating capping pattern defines an upper part of the empty space.

4. The semiconductor device of claim 3, wherein the insulating capping pattern is at a higher level than the first conductive line relative to an upper surface of the substrate.

5. The semiconductor device of claim 3, wherein:
the insulating capping pattern comprises a first insulating capping pattern and a second insulating capping pattern; and
the first insulating capping pattern has a non-uniform thickness and extends along a side surface and a lower part of the second insulating capping pattern.

6. The semiconductor device of claim 1, further comprising an insulating capping pattern defining an upper part of the empty space, wherein the insulating capping pattern is between a side surface of the first insulating mask pattern and the conductive structure.

7. The semiconductor device of claim 1, wherein the empty space comprises a first empty space and the device further comprises:
a second empty space between the second line structure and the conductive structure and between the second line structure and the insulating isolation pattern;
a first insulating spacer between the first empty space and the first line structure; and
a second insulating spacer between the second empty space and the second line structure.

8. The semiconductor device of claim 1, wherein the empty space comprises a first empty space and the device further comprises:
a second empty space between the second line structure and the conductive structure and between the second line structure and the insulating isolation pattern;
a first insulating protection pattern between the first empty space and the conductive structure; and
a second insulating protection pattern between the second empty space and the conductive structure.

9. The semiconductor device of claim 1, wherein:
the conductive structure comprises a lower conductive pattern and an upper conductive pattern on the lower conductive pattern;
the upper conductive pattern comprises an upper part at a higher level than the first and second line structures relative to an upper surface of the substrate; and
the upper part of the upper conductive pattern has a portion overlapping an uppermost surface of the second line structure.

10. A semiconductor device, comprising:
a substrate including a transistor comprising first and second source/drain regions and a gate structure;
a first line structure comprising a first conductive line and a first insulating mask pattern sequentially stacked on the substrate and a second line structure comprising a second conductive line and a second insulating mask pattern sequentially stacked on the substrate, wherein the first and second line structures extend in a direction;
an insulating isolation pattern between the first and second line structures;
a conductive structure between the first and second line structures and adjacent the insulating isolation pattern along the direction;
a first empty space comprising a first portion between the first line structure and the conductive structure and a second portion between the first line structure and the insulating isolation pattern; and
a second empty space comprising a first portion between the second line structure and the conductive structure and a second portion between the second line structure and the insulating isolation pattern,
wherein the conductive structure comprises an upper part at higher level than the first and second line structures relative to an upper surface of the substrate, and the upper part of the conductive structure is spaced apart from the first line structure and has a portion extending on an uppermost surface of the second line structure.

11. The semiconductor device of claim 10, wherein:
the second line structure extends on and is electrically connected to the first source/drain region; and
the conductive structure extends on and is electrically connected to the second source/drain region.

12. The semiconductor device of claim 10, wherein the first portion of the first empty space has a height different from a height of the second portion of the second empty space.

13. The semiconductor device of claim 10, further comprising an insulating capping pattern defining an upper portion of the first empty space.

14. The semiconductor device of claim 13, wherein:
the insulating capping pattern comprises a first insulating capping pattern and a second insulating capping pattern; and
the first insulating capping pattern has a non-uniform thickness and extends along a side surface and a lower portion of the second insulating capping pattern.

15. An integrated circuit device, comprising:
first and second line patterns spaced apart from each other on a substrate, wherein the first and second line patterns comprise first and second conductive line patterns, respectively;
a conductive pattern between the first and second line patterns, wherein the conductive pattern comprises a lower conductive pattern and an upper conductive pattern comprising a sidewall that is recessed relative to a sidewall of the lower conductive pattern such that the upper conductive pattern exposes an upper surface of the lower conductive pattern; and
a capping pattern between the first line pattern and the upper conductive pattern, wherein the capping pattern contacts the upper surface of the lower conductive pattern to define an upper surface of an empty space between the lower conductive pattern and the first line pattern.

16. The integrated circuit device of claim 15, wherein the upper surface of the lower conductive pattern is lower than an uppermost surface of the first line pattern relative to an upper surface of the substrate.

17. The integrated circuit device of claim 16, wherein:
the empty space comprises a first portion of the empty space;
the first and second line patterns extend in a direction; and
the device further comprises an insulating pattern between the first and second line patterns and adjacent the conductive pattern along the direction, wherein the capping pattern extends on the insulating pattern and a second portion of the empty space that is between the first line pattern and the insulating pattern, and a height of the second portion of the empty space is greater than a height of the first portion of the empty space.

18. The integrated circuit device of claim 15, wherein:
the capping pattern comprises a first capping pattern contacting the upper surface of the lower conductive pattern and a second capping pattern on the first capping pattern; and
the first capping pattern extends on a bottom surface and a sidewall of the second capping pattern, and the first capping pattern has a lower conformality than the second capping pattern.

19. The integrated circuit device of claim 15, wherein:
an uppermost surface of the conductive pattern is higher than uppermost surfaces of the first and second line patterns relative to an upper surface of the substrate; and
a portion of the conductive pattern at least partially extends on the uppermost surface of the second line pattern.

* * * * *